United States Patent
Oh et al.

(10) Patent No.: US 10,985,304 B2
(45) Date of Patent: Apr. 20, 2021

(54) HIGHLY RELIABLE LIGHT EMITTING DIODE

(71) Applicant: SEOUL VIOSYS CO., LTD., Ansan-si (KR)

(72) Inventors: Se Hee Oh, Ansan-si (KR); Hyun A Kim, Ansan-si (KR); Joon Sup Lee, Ansan-si (KR); Min Woo Kang, Ansan-si (KR); Hyoung Jin Lim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 27 days.

(21) Appl. No.: 16/464,679

(22) PCT Filed: Oct. 11, 2017

(86) PCT No.: PCT/KR2017/011177
§ 371 (c)(1),
(2) Date: May 28, 2019

(87) PCT Pub. No.: WO2018/117382
PCT Pub. Date: Jun. 28, 2018

(65) Prior Publication Data
US 2019/0296204 A1    Sep. 26, 2019

(30) Foreign Application Priority Data

Dec. 21, 2016  (KR) .......................... 10-2016-0175684
Dec. 28, 2016  (KR) .......................... 10-2016-0180883

(51) Int. Cl.
*H01L 33/64*    (2010.01)
*H01L 27/15*    (2006.01)
(Continued)

(52) U.S. Cl.
CPC .............. *H01L 33/64* (2013.01); *H01L 27/15* (2013.01); *H01L 27/156* (2013.01); *H01L 33/02* (2013.01);
(Continued)

(58) Field of Classification Search
None
See application file for complete search history.

(56) References Cited

U.S. PATENT DOCUMENTS 8,823,031 B2    9/2014  Kususe et al.
9,293,660 B2 *  3/2016  Chae ........................ H01L 33/32
(Continued)

FOREIGN PATENT DOCUMENTS

JP    2014-044971    3/2014
KR  10-2013-0030178  3/2013
(Continued)

OTHER PUBLICATIONS

International Search Report and Written Opinion dated Feb. 6, 2018, issued in International Application No. PCT/KR2017/011177.

*Primary Examiner* — Steven M Christopher
(74) *Attorney, Agent, or Firm* — H.C. Park & Associates, PLC

(57) ABSTRACT

A light emitting diode including a first semiconductor layer, a mesa disposed thereon and including a second semiconductor layer and an active layer, an ohmic reflection layer disposed on the mesa to form an ohmic contact with the second semiconductor layer, a lower insulation layer covering the mesa and the ohmic reflection layer and partially exposing the first semiconductor layer and the ohmic reflection layer, a first pad metal layer disposed on the lower insulation layer and electrically connected to the first semiconductor layer, a metal reflection layer disposed on the lower insulation layer and laterally spaced apart from the (Continued)

first pad metal layer, and an upper insulation layer covering the first pad metal layer and the metal reflection layer, and having a first opening exposing the first pad metal layer, in which at least a portion of the metal reflection layer covers a side surface of the mesa.

45 Claims, 35 Drawing Sheets

(51) Int. Cl.
*H01L 33/10* (2010.01)
*H01L 33/20* (2010.01)
*H01L 33/40* (2010.01)
*H01L 33/62* (2010.01)
*H01L 33/36* (2010.01)
*H01L 33/02* (2010.01)
*H01L 33/60* (2010.01)

(52) U.S. Cl.
CPC .............. *H01L 33/10* (2013.01); *H01L 33/20* (2013.01); *H01L 33/36* (2013.01); *H01L 33/405* (2013.01); *H01L 33/60* (2013.01); *H01L 33/62* (2013.01)

(56) References Cited

U.S. PATENT DOCUMENTS

| | | | |
|---|---|---|---|
| 9,412,903 B2 | 8/2016 | Yoon et al. | |
| 9,520,534 B2 | 12/2016 | Chae et al. | |
| 9,634,193 B2 | 4/2017 | Chae et al. | |
| 10,074,778 B2* | 9/2018 | In | H01L 33/486 |
| 2011/0127549 A1* | 6/2011 | Lee | H01L 33/46 257/88 |
| 2014/0014998 A1 | 1/2014 | Ohno | |
| 2015/0091787 A1* | 4/2015 | Ohmae | G09G 3/2003 345/83 |
| 2015/0200334 A1* | 7/2015 | Chae | H01L 33/405 257/98 |
| 2016/0072011 A1* | 3/2016 | Chae | H01L 33/32 257/13 |

FOREIGN PATENT DOCUMENTS

| | | |
|---|---|---|
| KR | 10-2015-0014353 | 2/2015 |
| KR | 10-2015-0087445 | 7/2015 |

* cited by examiner

HIGHLY RELIABLE LIGHT EMITTING DIODE

CROSS REFERENCE TO RELATED APPLICATIONS

This application is a National Stage Entry of International Application No. PCT/KR2017/011177, filed on Oct. 11, 2017, and claims priority from and the benefit of Korean Patent Application No. 10-2016-0175684, filed on Dec. 21, 2016, and Korean Patent Application No. 10-2016-0180883, filed on Dec. 28, 2016, each of which is hereby incorporated by reference for all purposes as if fully set forth herein.

BACKGROUND

Field

Exemplary embodiments of the invention relate generally to a light emitting diode, and more specifically, to a highly reliable light emitting diode.

Discussion of the Background

Generally, group III-based nitrides, such as gallium nitride (GaN), aluminum nitride (AlN), and the like, have been spotlighted as materials for light sources in the visible range and the ultraviolet range. Particularly, blue and green light emitting diodes using indium gallium nitride (InGaN) are used in various fields including large full color flat panel displays, signal lamps, interior lighting, high density light sources, high resolution output systems, optical communication, and the like.

Light emitting diodes are generally used in the form of a package fabricated through a packaging process. In recent years, however, various studies have been made to develop a chip-scale package type light emitting diode, in which the packaging process is performed at a chip level. Such a light emitting diode has a smaller size than typical packages, and does not require a separate packaging process, thereby reducing time and costs through a process simplification. The chip-scale package type light emitting diode generally has a flip chip-shaped electrode structure, and can dissipate heat through bump pads to secure good heat dissipation.

In addition, the chip-scale package type light emitting diode generally has a considerably large area of a pad metal layer electrically connected to a first conductivity type semiconductor layer, and extends to the outside of the mesa. The pad metal layer is vulnerable to moisture that may penetrate through an edge of the light emitting diode, and thus, reliability problems, such as a contact failure, are likely to occur.

Meanwhile, a light emitting diode including a plurality of light emitting cells connected to each other in series has been developed. Such a light emitting diode can reduce a droop phenomenon through operation of a single light emitting diode at a higher voltage and a lower current.

However, since each bump pad is electrically connected to one of the serially connected light emitting cells, heat dissipation through the bump pads from some of the light emitting cells, to which the bump pads are not electrically connected, may be limited.

The above information disclosed in this Background section is only for understanding of the background of the inventive concepts, and, therefore, it may contain information that does not constitute prior art.

SUMMARY

Exemplary embodiments of the invention provide a flip chip structure light emitting diode in the form of a chip scale package with improved reliability.

Exemplary embodiments of the invention also provide a light emitting diode having high reliability and high light extraction efficiency.

Exemplary embodiments of the invention further provide a light emitting diode with improved heat dissipation efficiency.

Exemplary embodiments of the invention still provide a light emitting diode having a plurality of light emitting cells connected in series with improved heat dissipation performance.

Exemplary embodiments of the invention also provide a flip chip structure light emitting diode in the form of a chip scale package having improved heat dissipation through a bump pad.

Additional features of the inventive concepts will be set forth in the description which follows, and in part will be apparent from the description, or may be learned by practice of the inventive concepts.

A light emitting diode according to an exemplary embodiment includes a first conductivity type semiconductor layer, a mesa disposed on the first conductivity type semiconductor layer, the mesa including a second conductivity type semiconductor layer and an active layer interposed between the first conductivity type semiconductor layer and the second conductivity type semiconductor layer, an ohmic reflection layer disposed on the mesa to form an ohmic contact with the second conductivity type semiconductor layer, a lower insulation layer covering the mesa and the ohmic reflection layer, and partially exposing the first conductivity type semiconductor layer and the ohmic reflection layer, a first pad metal layer disposed on the lower insulation layer and electrically connected to the first conductivity type semiconductor layer, a metal reflection layer disposed on the lower insulation layer and laterally spaced apart from the first pad metal layer, and an upper insulation layer covering the first pad metal layer and the metal reflection layer, the upper insulation layer having a first opening exposing the first pad metal layer, in which at least a portion of the metal reflection layer covers a side surface of the mesa.

The mesa may includes a via-hole exposing the first conductivity type semiconductor layer, the lower insulation layer may have an opening exposing the first conductivity type semiconductor layer in the via-hole, and the first pad metal layer may be electrically connected to the first conductivity type semiconductor layer through the opening of the lower insulation layer.

A first portion of the first conductivity type semiconductor layer may not be covered by the lower insulation layer in an area outside of the mesa, and the first pad metal layer may be electrically connected to the first conductivity type semiconductor layer through the first portion of the first conductive type semiconductor layer disposed outside of the mesa.

The light emitting diode may further include a second pad metal layer disposed on the lower insulation layer and electrically connected to the ohmic reflection layer, in which the metal reflection layer may be laterally spaced apart from the second pad metal layer.

The metal reflection layer may include substantially the same material as the first pad metal layer and the second pad metal layer, and may be disposed at the same level as the first pad metal layer and the second pad metal layer.

The upper insulation layer may further include a second opening exposing the second pad metal layer.

The light emitting diode may further include a first bump pad and a second bump pad connected to upper surfaces of the first pad metal layer and the second pad metal layer exposed through the first and second openings of the upper insulation layer, respectively.

The upper insulation layer may include a third opening exposing the metal reflection layer, and the first bump pad or the second bump pad may be connected to the metal reflection layer through the third opening of the upper insulation layer.

The first, second, and third openings exposing the first pad metal layer, the second pad metal layer, and the metal reflection layer, respectively, may be spaced apart in the lateral direction and may not overlap each other.

The metal reflection layer may be exposed through at least one of the first and second openings exposing the first pad metal layer or the second pad metal layer.

The first pad metal layer may surround the second pad metal layer.

The first pad metal layer may be disposed within an upper region of the mesa, and the metal reflection layer may surround the first pad metal layer in a substantially ring shape in a plan view.

The metal reflection layer may partially cover an upper surface of the mesa and the first conductivity type semiconductor layer around the mesa.

The metal reflection layer may be disposed in a plurality of regions on the substrate.

The metal reflection layer may be disposed near edges of the mesa, and the first pad metal layer may be electrically connected to the first conductivity type semiconductor layer near the edges of the mesa.

The mesa may have grooves near the edges thereof, and the first pad metal layer may be electrically connected to the first conductivity type semiconductor layer in the grooves.

The light emitting diode may further include a substrate, in which the first conductivity type semiconductor layer may be disposed on the substrate, and light generated in the active layer may be configured to be emitted to the outside through the substrate.

A light emitting diode according to another exemplary embodiment includes a first conductivity type semiconductor layer, a mesa disposed on the first conductivity type semiconductor layer, the mesa including a second conductivity type semiconductor layer and an active layer interposed between the first conductivity type semiconductor layer and the second conductivity type semiconductor layer, an ohmic reflection layer disposed on the mesa to form an ohmic contact with the second conductivity type semiconductor layer, a lower insulation layer covering the mesa and the ohmic reflection layer, and partially exposing the first conductivity type semiconductor layer and the ohmic reflection layer, a first pad metal layer disposed on the lower insulation layer and electrically connected to the first conductivity type semiconductor layer, a second pad metal layer disposed on the lower insulation layer and electrically connected to the ohmic reflection layer, a third pad metal layer disposed on the lower insulation layer and laterally spaced apart from the first pad metal layer and the second pad metal layer, and an upper insulation layer covering the first, second, and third pad metal layers, and having openings exposing the first pad metal layer and the second pad metal layer.

The light emitting diode may further include a first bump pad connected to the first pad metal layer and a second bump pad connected to the second pad metal layer, and the third pad metal layer may be connected to the first bump pad or the second bump pad.

The third pad metal layer may at least partially overlap with the ohmic reflection layer.

A light emitting diode according to yet another exemplary embodiment includes a plurality of light emitting cells each including a first conductivity type semiconductor layer, an active layer, and a second conductivity type semiconductor layer, an ohmic reflection layer disposed on the second conductivity type semiconductor layer of each of the light emitting cells to form an ohmic contact therewith, a lower insulation layer covering the light emitting cells and the ohmic reflection layers, the lower insulation layer having openings exposing the first conductivity type semiconductor layer and the ohmic reflection layer of each of the light emitting cells, a connector disposed on the lower insulation layer and electrically connecting adjacent light emitting cells to each other to form a series array of the light emitting cells, a first pad metal layer electrically connected to the first conductivity type semiconductor layer of one of the light emitting cells disposed at a first terminal of the series array through one of the openings of the lower insulation layer, a second pad metal layer electrically connected to the ohmic reflection layer of another one of the light emitting cells disposed at a second terminal of the series array through another one of the openings of the lower insulation layer, at least one third pad metal layer disposed on the lower insulation layer, and spaced apart from the connector and the first and second pad metal layers, an upper insulation layer covering the connector and the first to third pad metal layers, the upper insulation layer having openings exposing upper surfaces of the first, second, and third pad metal layers, respectively, and a first bump pad and a second bump pad connected to upper surfaces of the first pad metal layer and the second pad metal layer exposed through the openings of the upper insulation layer, respectively, in which at least one of the first and second bump pads is connected to the third pad metal layer through at least one of the openings of the upper insulation layer.

The first and second bump pads may be disposed over at least two light emitting cells.

The at least one third pad metal layer may be disposed within the upper region of the ohmic reflection layers.

The third pad metal layer may be spaced apart from the ohmic reflection layer by the lower insulation layer.

The third pad metal layer may be provided in plural, and the plurality of third pad metal layers may be disposed over two or more light emitting cells.

At least one of the third pad metal layers may be exposed through at least two openings of the upper insulation layer.

The first pad metal layer may be disposed within an upper region of the one of the light emitting cells, and the second pad metal layer is disposed within an upper region of the another one of the light emitting cells.

The connector and the first, second, and third pad metal layers may include substantially the same material and may be disposed at the same level.

The another one of the openings of the lower insulation layer exposing the ohmic contact layer may be spaced apart from one of the openings of the upper insulation layer exposing the second pad metal layer in the lateral direction so as not to overlap each other.

At least one of the light emitting cells may include a via-hole formed through the second conductivity type semiconductor layer and the active layer exposing the first conductivity type semiconductor layer, and the connector may be electrically connected to the first conductivity type semiconductor layer of the light emitting cell through the via-hole.

The upper insulation layer may cover a region between an edge of the substrate and the light emitting cells, and a distance from an edge of the upper insulation layer to the connector may be at least 15 μm.

The connector may directly contact the first conductivity type semiconductor layer and the ohmic reflection layer exposed through the opening of the lower insulation layer.

A light emitting diode according to still another exemplary embodiment includes a plurality of light emitting cells each including a first conductivity type semiconductor layer, an active layer, and a second conductivity type semiconductor layer, a connector electrically connecting adjacent light emitting cells to each other to form a series array of the light emitting cells, a first pad metal layer electrically connected to the first conductivity type semiconductor layer of one of the light emitting cells disposed at a first terminal of the series array, a second pad metal layer electrically connected to the second conductivity type semiconductor layer of another one of the light emitting cells disposed at a second terminal of the series array, at least one third pad metal layer spaced apart from the connector and the first and second pad metal layers, and a first bump pad and a second bump pad disposed over at least two of the light emitting cells, and connected to upper surfaces of the first pad metal layer and the second pad metal layer, respectively, in which the at least one third pad metal layer is connected to the first bump pad or the second bump pad.

The light emitting diode may further include a lower insulation layer disposed between the connector, the first to third pad metal layers, and the light emitting cells, in which each of the connector, and the first and second pad metal layers may be electrically connected to the light emitting cells through openings of the lower insulation layer, and the third pad metal layer may be spaced apart from the light emitting cells by the lower insulation layer.

The light emitting diode may further include an upper insulation layer covering the connector, and the first to third pad metal layers, in which the upper insulation layer may have openings exposing the first to third pad metal layers.

The at least one third pad metal layer may be disposed within an upper region of the light emitting cells.

The light emitting diode may further include an ohmic reflection layer disposed between the lower insulation layer and the light emitting cells, and forming an ohmic contact with the second conductivity type semiconductor layer of each light emitting cell, in which the at least one third pad metal layer may be disposed within upper regions of the ohmic reflection layers.

A light emitting diode according to yet another exemplary embodiment includes a plurality of light emitting cells each including a first conductivity type semiconductor layer, an active layer, and a second conductivity type semiconductor layer, a lower insulation layer covering the light emitting cells, a connector disposed on the lower insulation layer and electrically connected to the light emitting cells through openings of the lower insulation layer to electrically connect adjacent light emitting cells in series, at least one pad metal layer spaced apart from the connector, disposed on the lower insulation layer, and spaced apart from the light emitting cells by the lower insulation layer, a pad metal layer disposed on the lower insulation layer and spaced apart from the light emitting cells by the lower insulation layer, an upper insulation layer covering the pad metal layer, and having an opening exposing the pad metal layer, and a first bump pad and a second bump pad connected to the light emitting cells, in which the first bump pad or the second bump pad is connected to the pad metal layer through the opening of the upper insulation layer.

Each of the first bump pad and the second bump pad may be disposed over at least two light emitting cells among the plurality of light emitting cells.

The pad metal layer may be disposed over the light emitting cells other than the ones connected to the first bump pad and the second bump pad.

A light emitting diode according to yet another exemplary embodiment includes a plurality of light emitting cells disposed on a substrate, a lower insulation layer covering the light emitting cells, a pad metal layer disposed on the lower insulation layer and spaced apart from the light emitting cells by the lower insulation layer, an upper insulation layer covering the pad metal layer, and having an opening exposing the pad metal layer, and a first bump pad and a second bump pad connected to the light emitting cells, in which the first bump pad or the second bump pad is connected to the pad metal layer through the opening of the upper insulation layer.

The pad metal layer may be disposed over at least two light emitting cells among the plurality of light emitting cells.

The pad metal layer may be exposed through at least two openings of the upper insulation layer.

The pad metal layer may be disposed within a lower region of the first bump pad or the second bump pad.

A portion of the pad metal layer may be disposed outside of the lower region of the first bump pad and the second bump pad.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
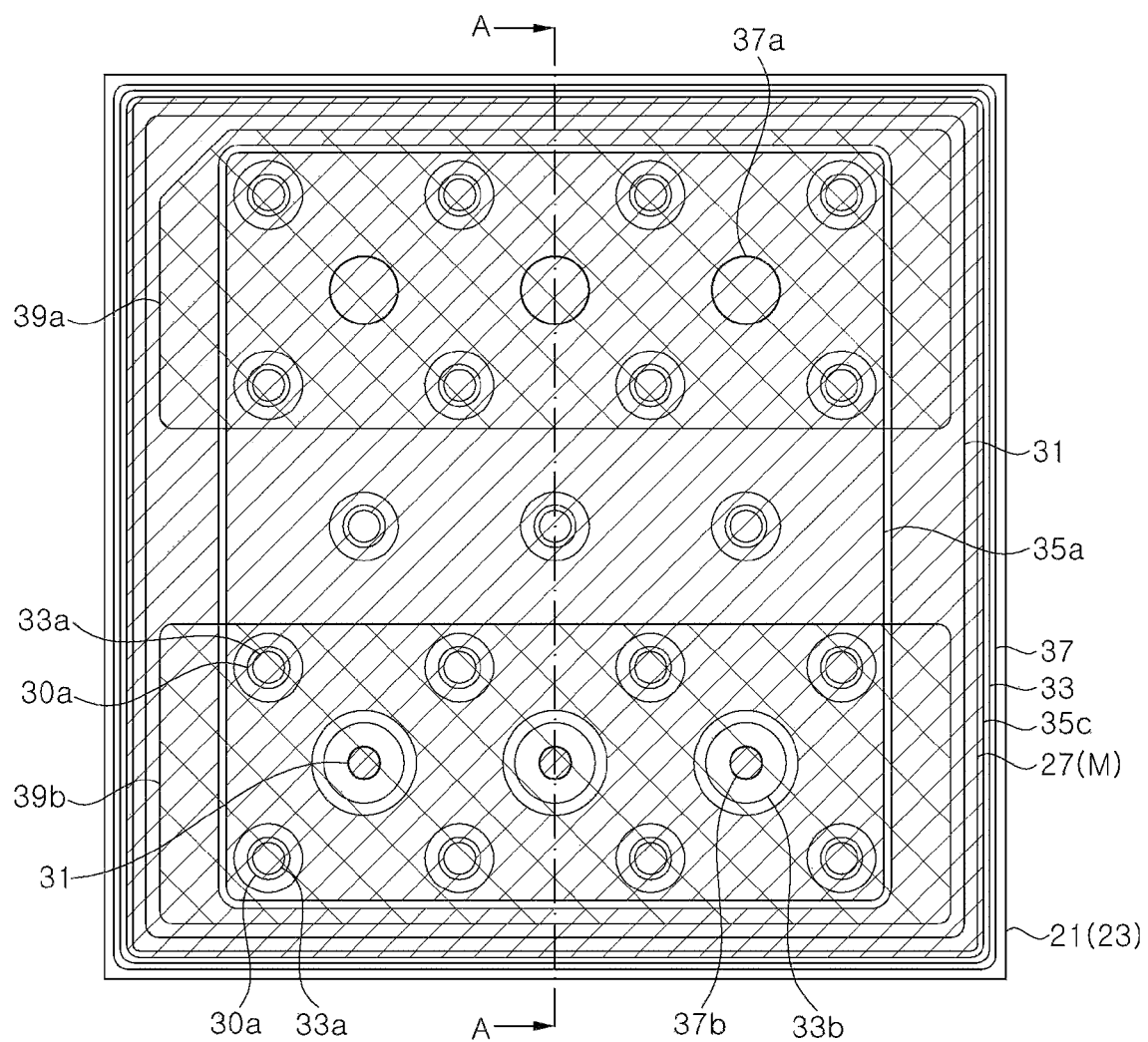
FIG. 1 is a schematic plan view of a light emitting diode according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
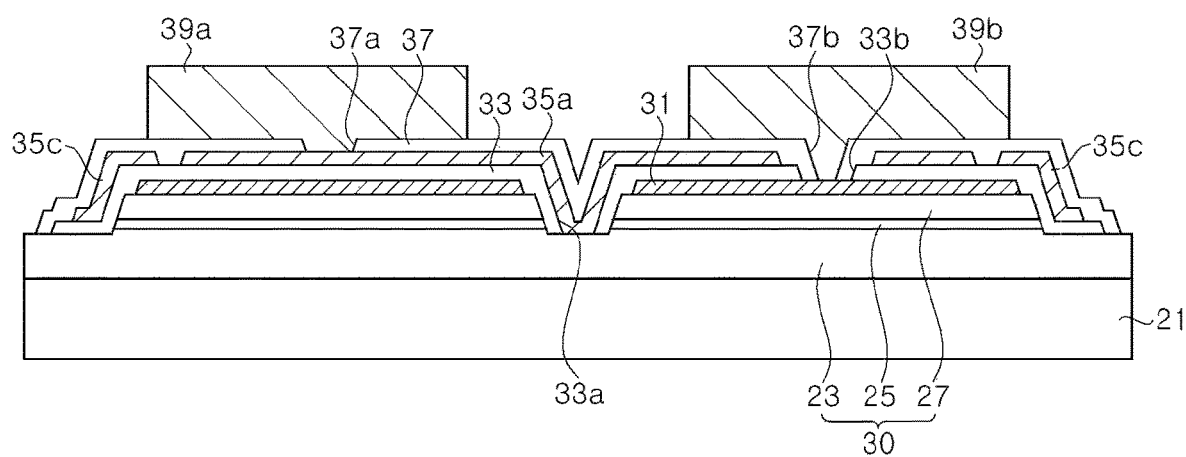
FIG. 2 is a schematic cross-sectional view taken along line A-A of FIG. 1.

FIG. 1 is a schematic plan view of a light emitting diode according to an exemplary embodiment, and FIG. 2 is a schematic cross-sectional view taken along line A-A of FIG. 1.

Referring to FIGS. 1 and 2, the light emitting diode includes a substrate 21, a semiconductor stack structure 30, an ohmic reflection layer 31, a lower insulation layer 33, a first pad metal layer 35a, a metal reflection layer (or a third pad metal layer) 35c, an upper insulation layer 37, a first bump pad 39a, and a second bump pad 39b. The semiconductor stack structure 30 includes a mesa M disposed on a first conductivity type semiconductor layer 23. The mesa M includes an active layer 25 and a second conductivity type semiconductor layer 27.

The substrate 21 may be any substrates capable of growing gallium nitride semiconductor layers thereon. The substrate 21 may include, for example, a sapphire substrate, a gallium nitride substrate, a SiC substrate, or others, and may be a patterned sapphire substrate. The substrate 21 may have a substantially rectangular or square shape, as shown in FIG. 1, without being limited thereto. A size of the substrate 21 is not particularly limited and may be selected in various ways.

The semiconductor stack structure 30 is disposed on the substrate 21. The first conductivity type semiconductor layer 23 may be disposed closer to the substrate 21 than the second conductivity type semiconductor layer 27. The active layer 25 is disposed between the first conductivity type semiconductor layer 23 and the second conductivity type semiconductor layer 27. Although the first conductivity type semiconductor layer 23 is described as being disposed on the substrate 21 in the illustrated exemplary embodiment, in some exemplary embodiments, the substrate 21 may be omitted.

The first conductivity type semiconductor layer 23 may be a gallium nitride semiconductor layer grown on the substrate 21 and doped with dopants, for example, Si.

The active layer 25 and the second conductivity type semiconductor layer 27 have a smaller area than the first conductivity type semiconductor layer 23. The active layer 25 and the second conductivity type semiconductor layer 27 are formed as a mesa on the first conductivity type semiconductor layer 23 through mesa etching. Accordingly, an upper surface of the first conductivity type semiconductor layer 23 is exposed around the mesa M. The first conductivity type semiconductor layer 23 may be exposed in a ring shape along a periphery of the mesa M, but the inventive concepts are not limited thereto. For example, in some exemplary embodiments, a portion of a side surface of the first conductivity type semiconductor layer 23 may be continuous with a side surface of the mesa M.

The active layer 25 may have a single quantum well structure or a multiple-quantum well structure. In the active layer 25, the compositions and thicknesses of well layers determine the wavelength of light generated in the active layer 25. In particular, the active layer 25 can generate UV light, blue light, or green light through adjustment of the compositions of the well layers.

The second conductivity type semiconductor layer 27 may be a gallium nitride semiconductor layer doped with p-type dopants, for example, Mg. Each of the first conductivity type semiconductor layer 23 and the second conductivity type semiconductor layer 27 may have a single layer or a multilayer structure, and may include a super-lattice layer. The first conductivity type semiconductor layer 23, the active layer 25, and the second conductivity type semiconductor layer 27 may be grown on the substrate in a chamber by a well-known method in the art, such as metal organic chemical vapor deposition (MOCVD) or molecular beam epitaxy (MBE).

The mesa M includes via-holes 30a formed through the second conductivity type semiconductor layer 27 and the active layer 25 to expose the first conductivity type semiconductor layer 23. The via-holes 30a are surrounded by the second conductivity type semiconductor layer 27 and the active layer 25. As shown in the drawings, the via-holes 30a may be disposed in a region of the mesa M, and may have a substantially circular shape. However, the number of the via-holes 30a is not particularly limited, and in some exemplary embodiments, only one via-hole 30a may be disposed. According to the illustrated exemplary embodiment, a plurality of via-holes 30a may be evenly disposed to evenly spread the current over a large area.

The ohmic reflection layer 31 is disposed on the second conductivity type semiconductor layer 27, and is electrically connected to the second conductivity type semiconductor layer 27. The ohmic reflection layer 31 may be disposed over substantially the entire region of the second conductivity type semiconductor layer 27 in an upper region of the second conductivity type semiconductor layer 27. For example, the ohmic reflection layer 31 may cover 80% or more, and in some exemplary embodiments, 90% or more of the upper region of the second conductivity type semiconductor layer 27.

The ohmic reflection layer 31 may include a metal layer having reflectivity. As such, the ohmic reflection layer 31 may reflect light generated from the active layer 25 and travelling to the ohmic reflection layer 31, toward the substrate 21. For example, the ohmic reflection layer 31 may include a single reflection metal layer, without being limited thereto. Alternatively, the ohmic reflection layer 31 may include an ohmic layer and a reflection layer. The ohmic layer may be a metal layer, such as a Ni layer, or a transparent oxide layer, such as an ITO layer, and the reflection layer may be a metal layer having high reflectance, such as Ag or Al layer.

The lower insulation layer 33 covers the ohmic reflection layer 31. The lower insulation layer 33 may cover not only an upper surface of the mesa M exposed around the ohmic reflection layer 31, but also the side surface of the mesa M along the peripheries thereof, and may at least partially cover the first conductivity type semiconductor layer 23 exposed at the periphery of the mesa M. In addition, the lower insulation layer 33 partially covers the first conductivity type semiconductor layer 23 exposed in the via-holes 30a.

The lower insulation layer 33 includes a first opening 33a exposing the first conductivity type semiconductor layer 23, and a second opening 33b exposing the ohmic reflection layers 31. The first opening 33a exposes the first conductivity type semiconductor layers 23 in the via-hole 30a.

The second opening 33b is disposed over the ohmic reflection layer 31 to expose the ohmic reflection layer 31. Shapes and numbers of the second opening 33b may be selected in various ways.

The lower insulation layer 33 may be formed of a single layer of $SiO_2$ or $Si_3N_4$, without being limited thereto. For example, the lower insulation layer 33 may have a multilayer structure including a silicon oxide layer and a silicon nitride layer, and may include a distributed Bragg reflector, in which material layers having different refractive indices, such as $SiO_2$ layers, $TiO_2$ layers, $ZrO_2$ layers, $MgF_2$ layers, or $Nb_2O_5$ layers, are alternately stacked one above another. In addition, each portion of the lower insulation layer 33 may have the same stack structure, but the inventive concepts are not limited thereto. Alternatively, for example, some portions of the lower insulation layer may include a greater number of layers than the other portions thereof. More particularly, a portion of the lower insulation layer 33 on the ohmic reflection layer 31 may have a greater thickness than a portion of the lower insulation layer 33 around the ohmic reflection layer 31.

The first pad metal layer 35a and the metal reflection layer 35c are disposed on the lower insulation layer 33. The first pad metal layer 35a may be disposed within an upper region of the mesa M, and the metal reflection layer 35c may be disposed to surround the first pad metal layer 35a in a ring shape, for example.

The first pad metal layer 35a is electrically connected to the first conductivity type semiconductor layer 23 through the first openings 33a in the via-holes 30a. As shown in FIG. 1, the first pad metal layer 35a covers each of the via-holes 30a. The first pad metal layer 35a may directly contact the first conductivity type semiconductor layer 23 through the first openings 33a. However, the first pad metal layer 35a is spaced apart from the ohmic reflection layer 31 exposed through the second openings 33b. Thus, the first pad metal layer 35a has openings exposing the second openings 33b.

The metal reflection layer 35c is disposed along an edge of the mesa M and covers the upper surface and the side surface of the mesa M. A portion of the metal reflection layer 35c may overlap with the ohmic reflection layer 31.

Further, the metal reflection layer 35c may extend to an upper region of the first conductivity type semiconductor layer 23 exposed around the mesa M. As shown in FIG. 2, the metal reflection layer 35c is disposed on the lower insulation layer 33 in the region around the mesa M, and thus, is spaced apart from the first conductivity type semiconductor layer 23. In this case, the metal reflection layer 35c may be electrically floated from the first conductivity type semiconductor layer 23 and the second conductivity type semiconductor layer 27. Accordingly, damage to the metal reflection layer 35c from moisture through a side surface of the light emitting diode may be mitigated. However, the inventive concepts are not limited thereto, and the metal reflection layer 35c may extend toward an edge side of the first conductivity type semiconductor layer 23, so as to be in contact with the first conductivity type semiconductor layer 23.

The metal reflection layer 35c is laterally spaced apart from the first pad metal layer 35a. Thus, a boundary region is formed between the first pad metal layer 35a and the metal reflection layer 35c. This boundary region is disposed within an upper region of the ohmic reflection layer 31. Therefore, light traveling to a side of the boundary region between the first pad metal layer 35a and the metal reflection layer 35c is reflected by the ohmic reflection layer 31, thereby preventing or suppressing leakage of light in the boundary region and being lost.

The first pad metal layer 35a and the metal reflection layer 35c may include substantially the same material and may be formed substantially simultaneously after formation of the lower insulation layer 33, and thus, may be disposed at substantially the same level. The first pad metal layer 35a and the metal reflection layer 35c may each include a portion disposed on the lower insulation layer 33.

The first pad metal layer 35a and the metal reflection layer 35c may include a reflection layer, such as an Al layer, which may be formed on an adhesion layer, such as a Ti, Cr or Ni layer. Further, a protection layer may have a single layer or composite layer structure of Ni, Cr, or Au on the reflection layer. The first pad metal layer 35a and the metal reflection layer 35c may have a multilayer structure of, for example, Cr/Al/Ni/Ti/Ni/Ti/Au/Ti.

The upper insulation layer 37 covers the first pad metal layer 35a and the metal reflection layer 35c. In addition, the upper insulation layer 37 may cover an edge of the lower insulation layer 33 around the mesa. The upper insulation layer 37 also covers the boundary region between the first pad metal layer 35a and the metal reflection layer 35c. Further, the upper insulation layer 37 may cover the first conductivity type semiconductor layer 23 at an edge of the substrate 21. However, the upper insulation layer 37 may expose the upper surface of the first conductivity type semiconductor layer 23 along the edge of the substrate 21. A shortest distance from the edge of the upper insulation layer 37 to the first pad metal layer 35a may be set to be as long as possible to prevent damage to the first pad metal layer 35a from moisture penetration, which may be about 15 µm or more. If the shortest distance therebetween is less than about 15 µm, the first pad metal layer 35a may be more likely to be damaged from moisture during operation of the light emitting diode at low current, for example, 25 mA.

The upper insulation layer 37 includes a first opening 37a exposing the first pad metal layer 35a and a second opening 37b exposing the ohmic reflection layer 31. The first opening 37a and the second opening 37b are disposed apart each other. A plurality of first openings 37a and a plurality of second openings 37b may be disposed, and the number of the first openings and the second openings may be selected in various ways.

The second openings 37b of the upper insulation layer 37 are also formed in the second openings 37b of the lower insulation layer 33. As such, the ohmic reflection layer 31 is exposed through the second openings 37b of the upper insulation layer 37.

The upper insulation layer 37 may be formed of a single layer of $SiO_2$ or $Si_3N_4$, but the inventive concepts are not limited thereto. For example, the upper insulation layer 37 may have a multilayer structure including a silicon oxide layer and a silicon nitride layer, and may include a distributed Bragg reflector in which material layers having different indices of refraction, such as $SiO_2$ layers, $TiO_2$ layers, $ZrO_2$ layers, $MgF_2$ layers, or $Nb_2O_5$ layers, are alternately stacked one above another.

The first bump pad 39a electrically contacts the first pad metal layer 35a exposed through the first opening 37a of the upper insulation layer 37, and the second bump pad 39b electrically contacts the ohmic reflection layer 31 exposed through the second opening 37b. As shown in FIG. 1, the first bump pad 39a covers and seals each of the first openings 37a of the upper insulation layer 37, and the second bump pad 39b covers and seals each of the second openings 37b of the upper insulation layer 37.

Further, the first bump pad 39a and the second bump pad 39b may be disposed over upper regions of the first pad metal layer 35a and the metal reflection layer 35c, respectively. Accordingly, the first and second bump pads 39a and 39b may be formed to be relatively large in a limited region of the light emitting diode.

The first bump pad 39a and the second bump pad 39b may be portions of the light emitting diode to be bonded to a sub-mount or a printed circuit board, and thus, may include a material suitable for bonding. For example, the first and second bump pads 39a and 39b may include an Au layer or an AuSn layer.

According to the illustrated exemplary embodiment, the metal reflection layer 35c is disposed along the edge of the mesa M, thereby preventing or suppressing the occurrence of the contact failure in the first pad metal layer 35a, and further preventing or suppressing light loss near the edge of the mesa M. Hereinafter, the metal reflection layer 35c may also be referred to as a third pad metal layer to be described later.

FIGS. 3A to 7B are plan views and cross-sectional views illustrating a method of manufacturing the light emitting diode according to an exemplary embodiment. In FIGS. 3A to 7B, cross-sectional views are taken along line A-A of the corresponding plan view.

Figure 3A:
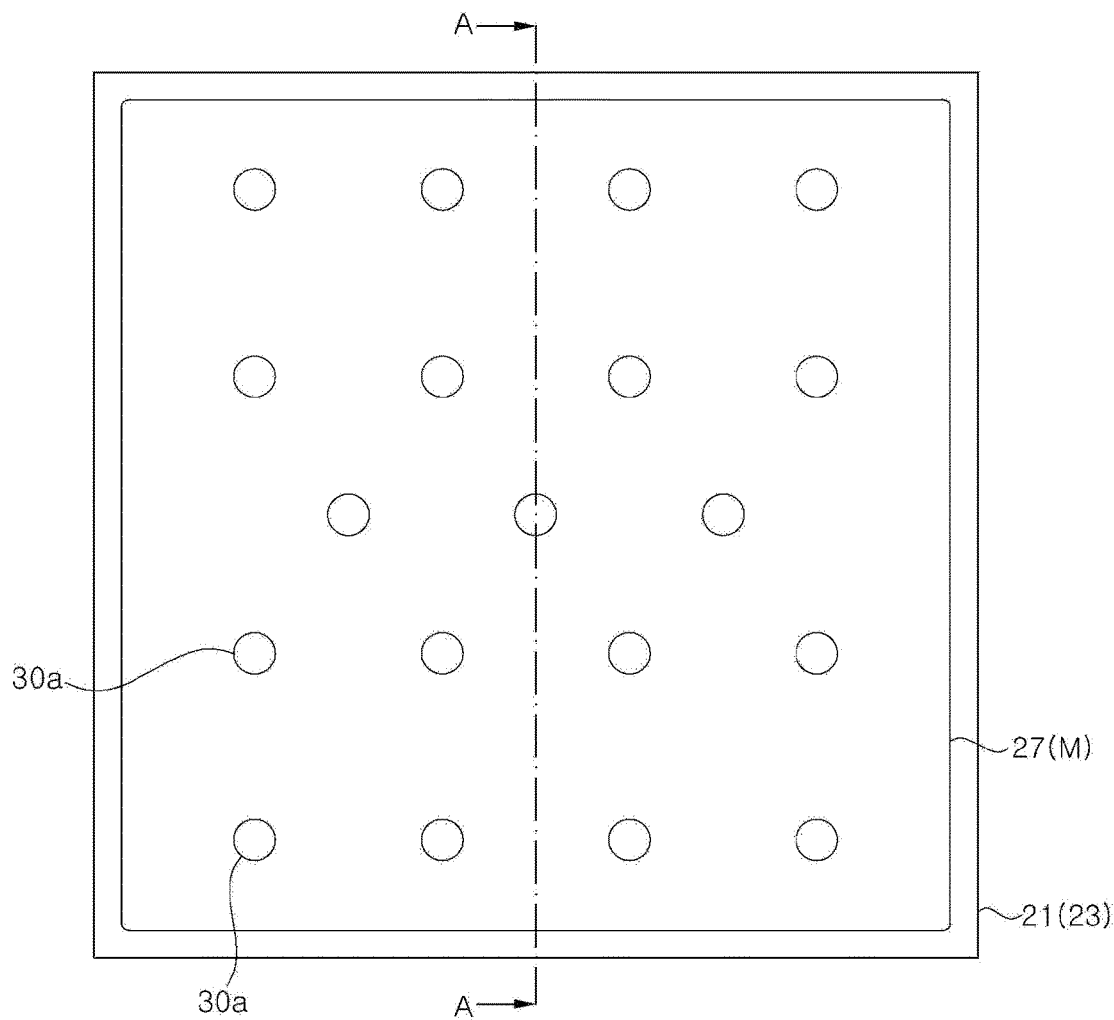
FIGS. 3A, 3B, 4A, 4B, 5A, 5B, 6A, 6B, 7A, and 7B are plan views and cross-sectional views illustrating a method of manufacturing the light emitting diode according to an exemplary embodiment.
Figure 3B:
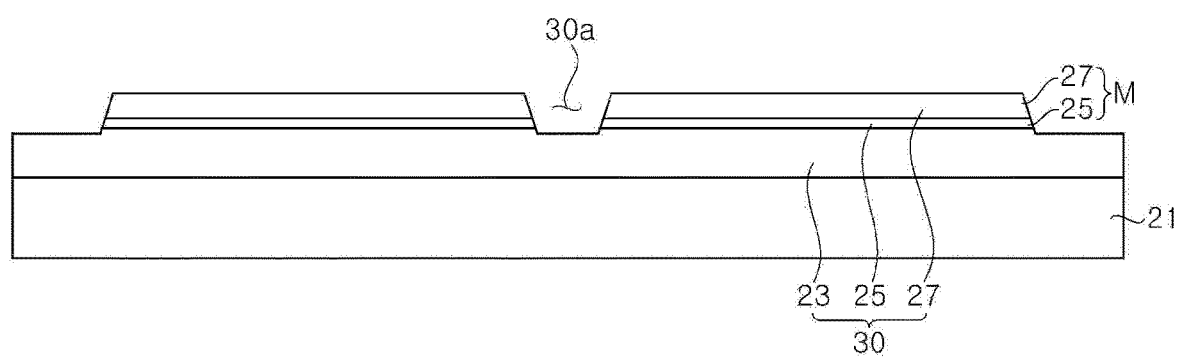

First, referring to FIGS. 3A and 3B, a semiconductor stack 30 including a first conductivity type semiconductor layer 23, an active layer 25, and a second conductivity type semiconductor layer 27 is grown on a substrate 21. The substrate 21 may be selected from any substrates capable of growing gallium nitride semiconductor layers thereon, and may include, for example, a sapphire substrate, a silicon carbide substrate, a gallium nitride (GaN) substrate, a spinel substrate, or others. More particularly, the substrate may be a patterned substrate, such as a patterned sapphire substrate.

The first conductivity type semiconductor layer 23 may include, for example, an n-type gallium nitride layer, and the second conductivity type semiconductor layer 27 may include a p-type gallium nitride layer. In addition, the active layer 25 may have a single quantum well structure or a multiple-quantum well structure, and may include a well layer and a barrier layer. The composition of the well layer may be determined depending upon the wavelength of light to be emitted, and may include, for example, AlGaN, GaN, or InGaN.

Then, a mesa M is formed by mesa etching the semiconductor stack 30. The mesa etching process to expose an upper surface of the first conductivity type semiconductor layer 23 may be performed by photolithography and etching. The mesa M includes via-holes 30a. The via-holes 30a may be formed at the same time during forming the mesa. As shown in FIG. 3B, sidewalls of the mesa M and sidewalls of the via-holes 30a may be formed to be inclined.

As the mesa M is formed on the substrate 21, a morphology with different elevation profiles thereon is formed on the substrate 21.

Figure 4A:
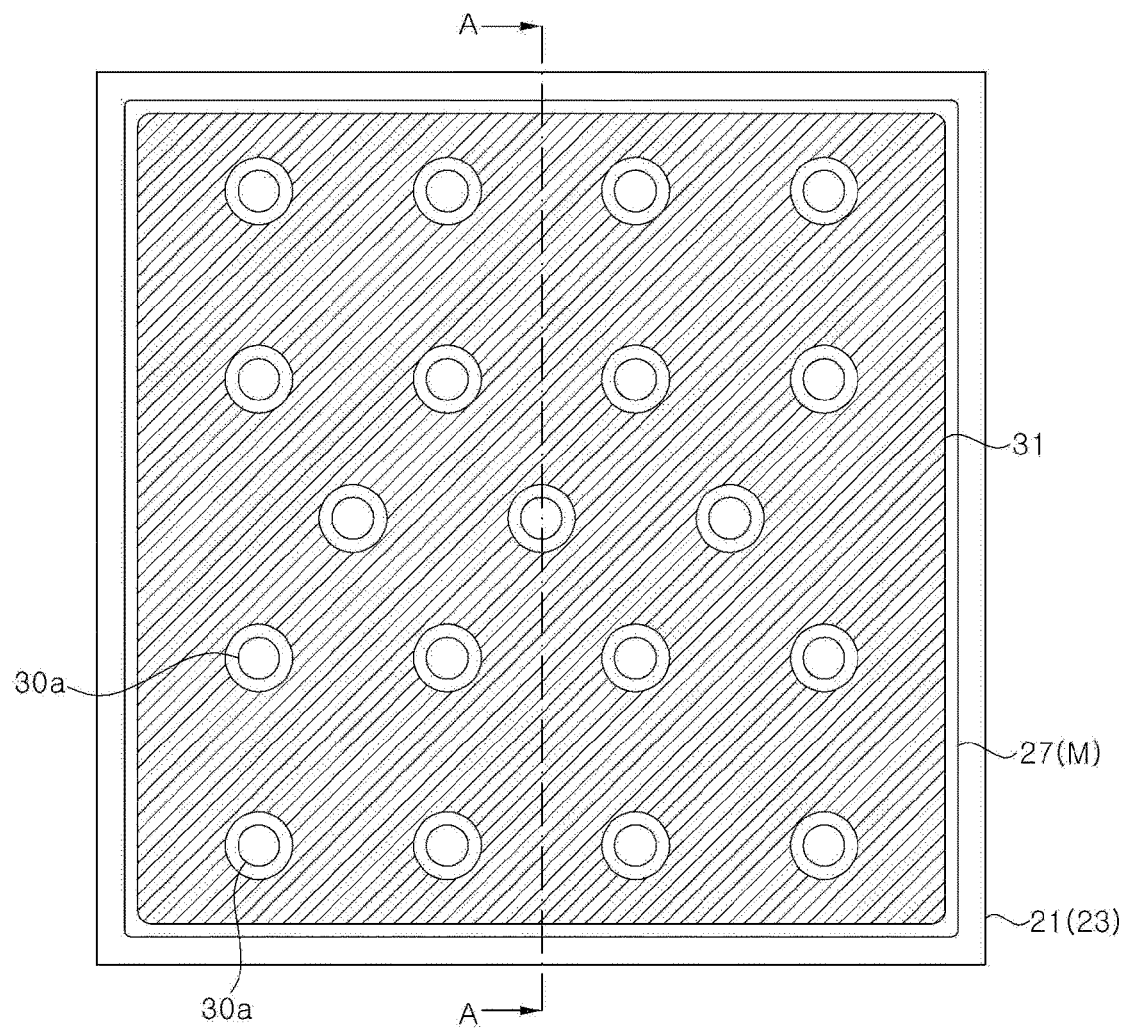
Figure 4B:
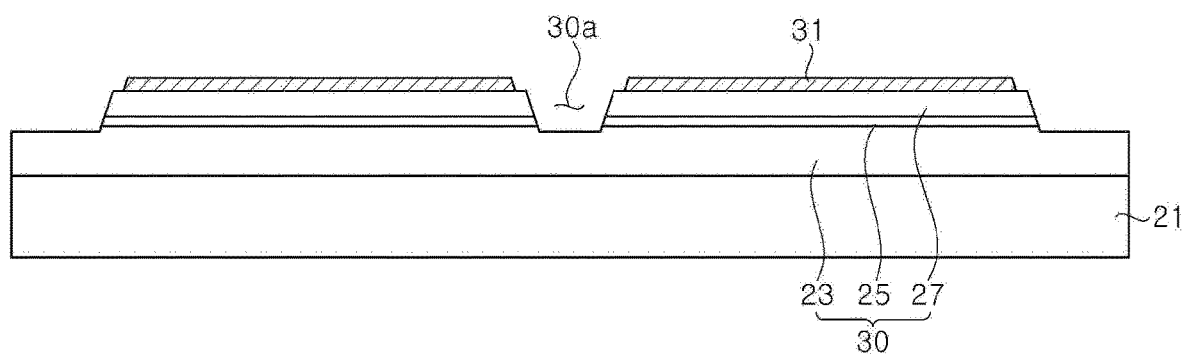

Referring to FIGS. 4A and 4B, an ohmic reflection layer 31 is formed on the mesa M. The ohmic reflection layer 31 may be formed by, for example, a lift-off technique. The ohmic reflection layer 31 may be formed of a single layer or multiple layers, and may include, for example, an ohmic layer and a reflection layer. These layers may be formed by, for example, e-beam evaporation. Before formation of the ohmic reflection layer 31, a preliminary insulation layer having openings may be formed in regions where the ohmic reflection layer 31 will be formed.

Although the ohmic reflection layer 31 is described as being formed after forming the mesa M, the inventive concepts are not limited thereto. For example, in some exemplary embodiments, the ohmic reflection layer 31 may be formed first, and then the mesa M may be formed. Further, after a metal layer for the ohmic reflection layer 31 is deposited on the semiconductor stack 30, the ohmic reflection layer 31 and the mesa M may be formed at the same time by patterning the metal layer and the semiconductor stack 30 at the same time.

Figure 5A:
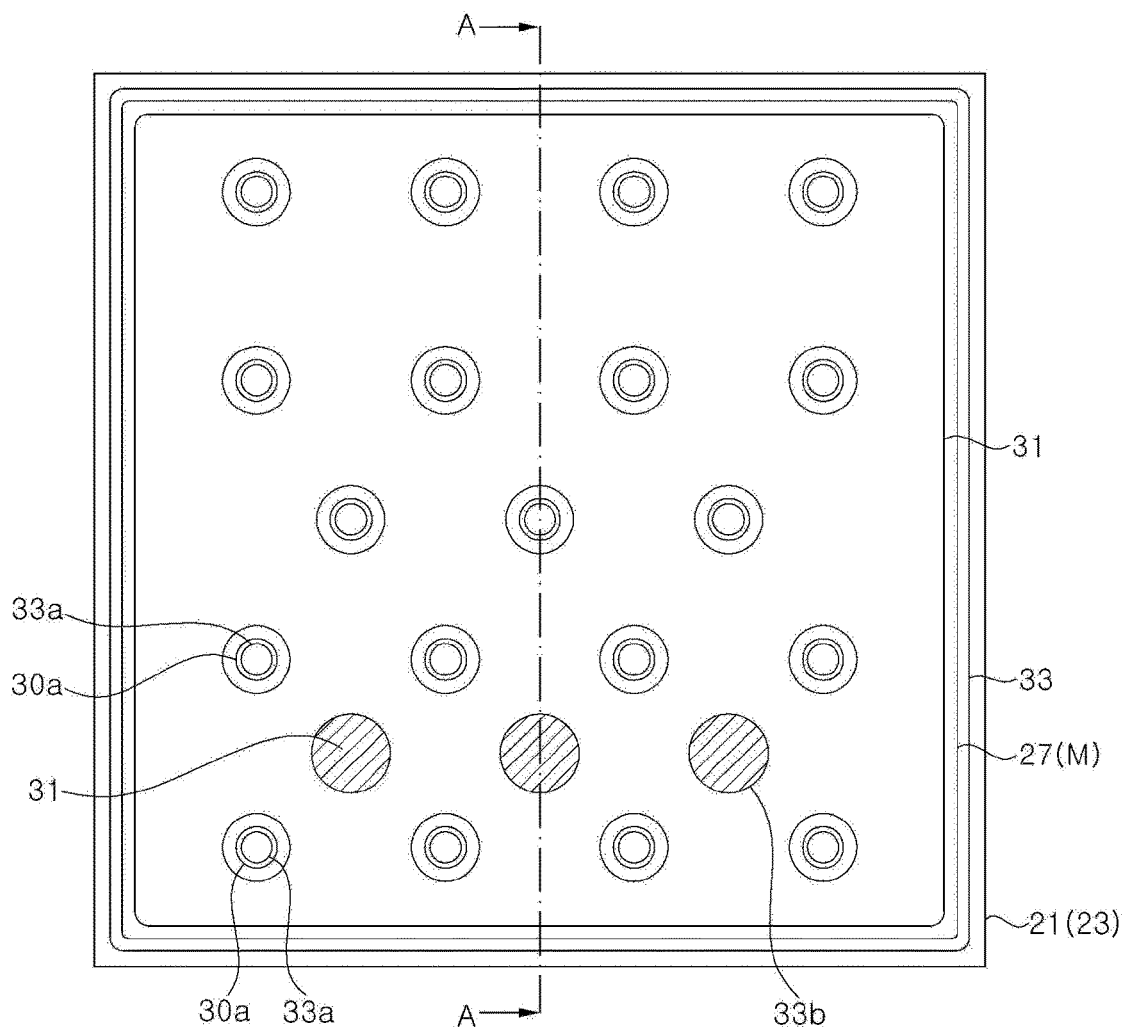
Figure 5B:
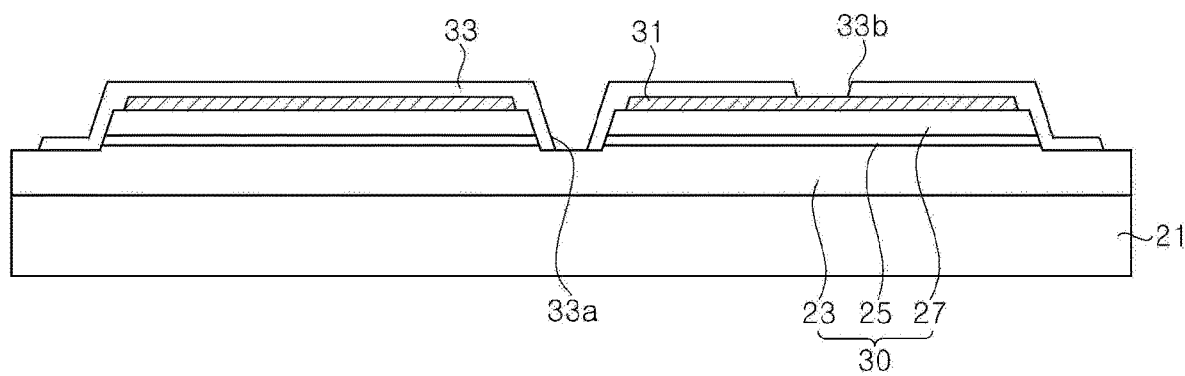

Referring to FIGS. 5A and 5B, a lower insulation layer 33 is formed to cover the ohmic reflection layer 31 and the mesa M. The lower insulation layer 33 may be formed of an oxide layer such as $SiO_2$, a nitride layer such as $SiN_x$, or an insulation layer such as $MgF_2$ by chemical vapor deposition (CVD) or the like. The lower insulation layer 33 may be formed of a single layer or multiple layers. Further, the lower insulation layer 33 may include a distributed Bragg reflector, in which high-refractive material layers and low-refractive material layers are alternately stacked one above another. For example, an insulation reflection layer having high reflectivity may be formed by laminating $SiO_2/TiO_2$ layers, $SiO_2/Nb_2O_5$ layers, $SiO_2/ZrO_2$ layers, or $MgF_2/TiO_2$ layers. The preliminary insulation layer described above may be integrated with the lower insulation layer 33. As such, the lower insulation layer 33 may have an uneven thickness due to the preliminary insulation layer formed around the ohmic reflection layer 31. More particularly, a portion of the lower insulation layer 33 on the ohmic reflection layer 31 may have a smaller thickness than a portion of the lower insulation layer 33 around the ohmic reflection layer 31.

The lower insulation layer 33 may be patterned through photolithography and etching processes, or a lift-off process. Accordingly, the lower insulation layer 33 include a first opening 33a exposing the first conductivity type semiconductor layer 23 in the via-holes 30a, and a second opening 33b exposing the ohmic reflection layer 31 on each of the light emitting cells. Further, the lower insulation layer 33 may expose the upper surface of the substrate 21 near the edge of the substrate 21.

Figure 6A:
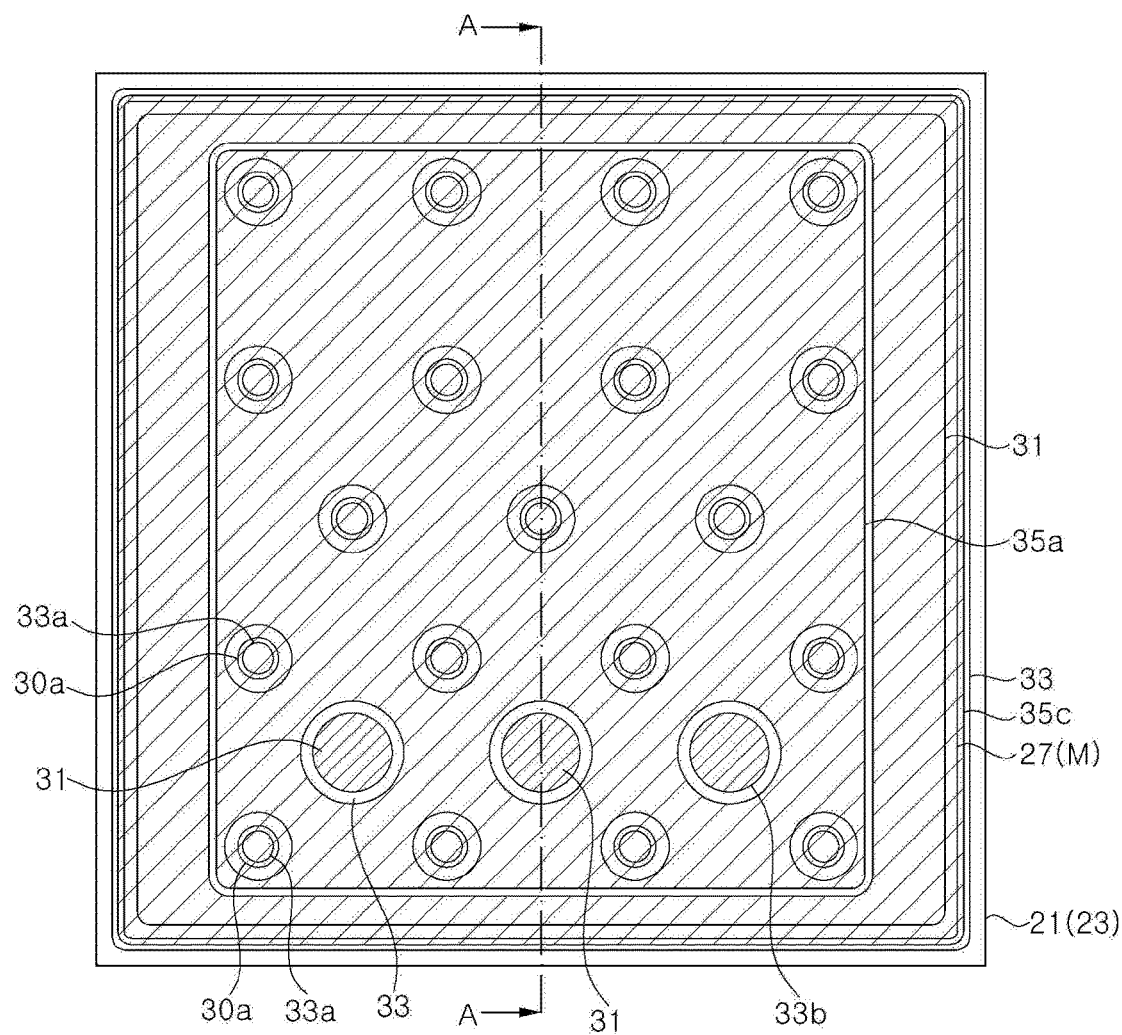
Figure 6B:
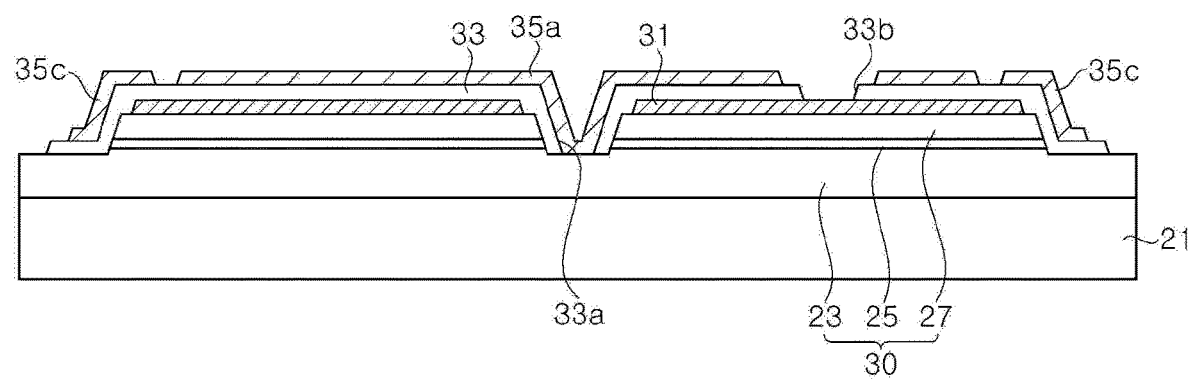

Referring to FIGS. 6A and 6B, a first pad metal layer 35a and a metal reflection layer 35c are formed on the lower insulation layer 33.

The first pad metal layer 35a may be disposed within an upper region of the mesa M. The first pad metal layer 35a is electrically connected to the first conductivity type semiconductor layer exposed through the via-holes 30a of the mesa M. The first pad metal layer 35a is connected to the first conductivity type semiconductor layer 23 at a plurality of points to facilitate current dispersion. However, the inventive concepts are not limited thereto, and in some exemplary embodiments, the first pad metal layer 35a may be connected to the first conductivity type semiconductor layer 23 through a single via-hole 30a.

The metal reflection layer 35c is laterally spaced apart from the first pad metal layer 35a, and may surround the first pad metal layer 35a in the ring shape. The metal reflection layer 35c may cover an upper surface and side surfaces of the mesa M, and further extend to the region around the mesa M.

The metal reflection layer 35c may be disposed on the lower insulation layer 33, and thus, may be spaced apart from the first conductivity type semiconductor layer 23 and the ohmic reflection layer 31. However, the inventive concepts are not limited thereto, and in some exemplary embodiments, a portion of the metal reflection layer 35c may be connected to the first conductivity type semiconductor layer 23 exposed around the mesa M.

The first pad metal layer 35a and the metal reflection layer 35c may include substantially the same material and may be formed at substantially simultaneously by the same process. For example, the first pad metal layer 35a and the metal reflection layer 35c may include Ti, Cr, or Ni as a bonding layer, and may include Al as a reflection layer. Furthermore, the first pad metal layer 35a and the metal reflection layer 35c may further include an anti-diffusion layer for preventing diffusion of a metallic element, such as Sn, and an anti-oxidation layer for preventing oxidation of the anti-diffusion layer. The anti-diffusion layer may include, for example, Cr, Ti, Ni, Mo, TiW or W, and the anti-oxidation layer may include Au.

Figure 7A:
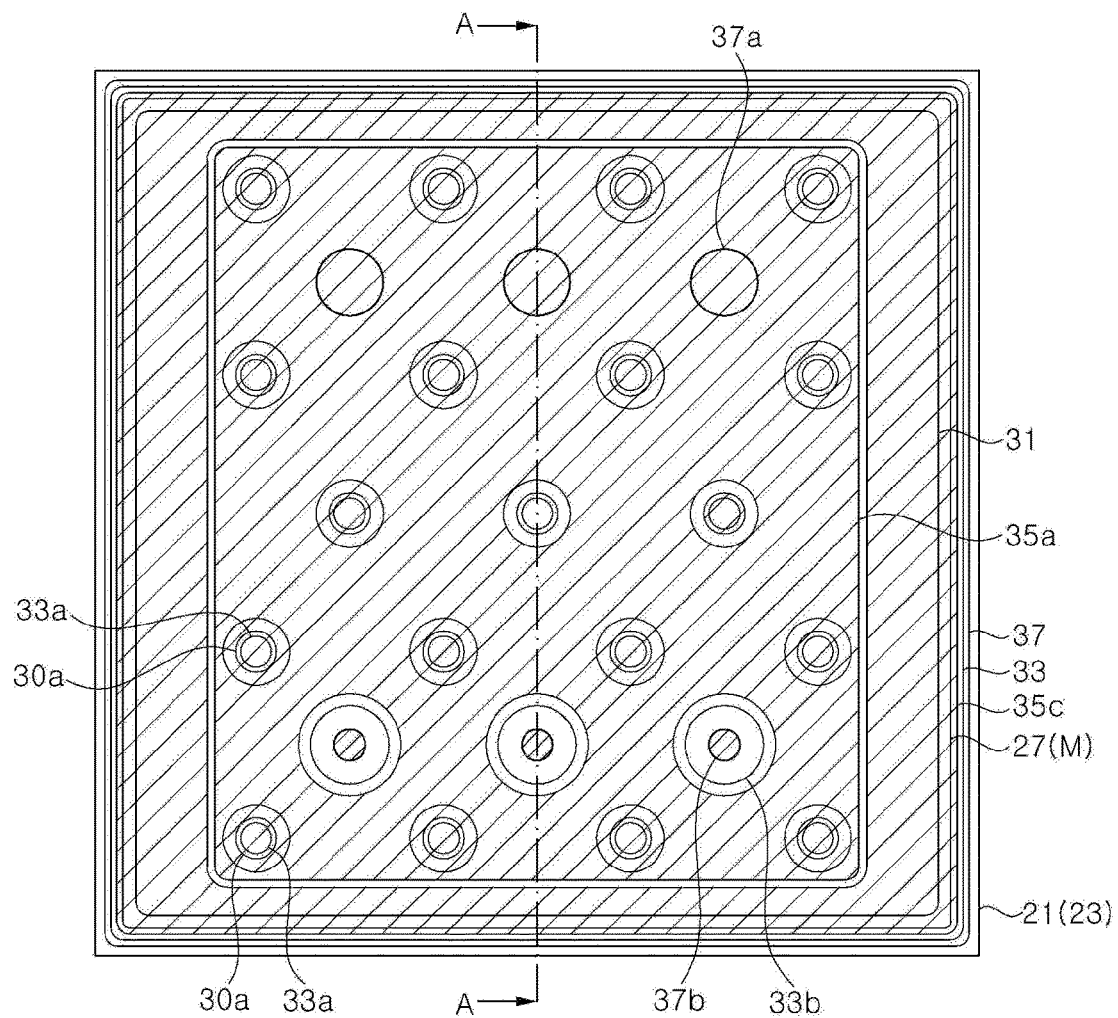
Figure 7B:
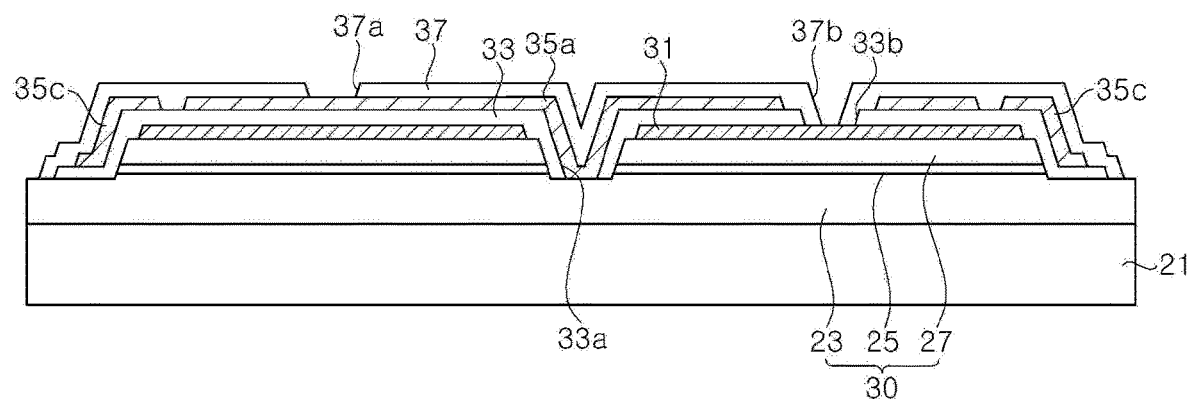

Referring to FIGS. 7A and 7B, an upper insulation layer 37 is formed to cover the first pad metal layer 35a and the metal reflection layer 35c. The upper insulation layer 37 includes a first opening 37a exposing the first pad metal layer 35a and a second opening 37b exposing the ohmic reflection layer 31. In the illustrated exemplary embodiment, a plurality of first and second openings 37a and 37b are shown, but the inventive concepts are not limited thereto, and in some exemplary embodiments, a single first opening 37a and a single second opening 37b may be used. In some exemplary embodiments, the second opening 37b exposes the ohmic reflection layer 31 exposed through the second opening 33b of the lower insulation layer 33.

The upper insulation layer 37 may also cover the edge of the lower insulation layer 33 along the edge of the substrate 21, and may expose some region thereof near the edge of the substrate 21. Accordingly, an edge of the metal reflection layer 35c may be sealed by the lower insulation layer 33 and the upper insulation layer 37. The edge of the upper insulation layer 37 may be formed to be spaced apart from the first pad metal layer 35a by at least 14 μm, for example.

The upper insulation layer 37 may be formed of a silicon oxide layer or a silicon nitride layer, and may include a distributed Bragg reflector.

Next, as shown in FIGS. 1 and 2, a first bump pad 39a and a second bump pad 39b are formed on the upper insulation layer 37.

The first bump pad 39a is electrically connected to the first pad metal layer 35a through the first opening 37a of the upper insulation layer 37, and the second bump pad 39b is electrically connected to the ohmic reflection layer 31 through the second opening 37b of the upper insulation layer 37.

After the first and second bump pads 39a and 39b are formed, a thickness of the substrate 21 may be reduced by partially removing a lower surface of the substrate 21 through grinding and/or lapping. Thereafter, the substrate 21 is divided into individual chip units, thereby providing light emitting diodes separated from each other. In this case, the substrate 21 may be divided by laser scribing, for example.

Figure 8:
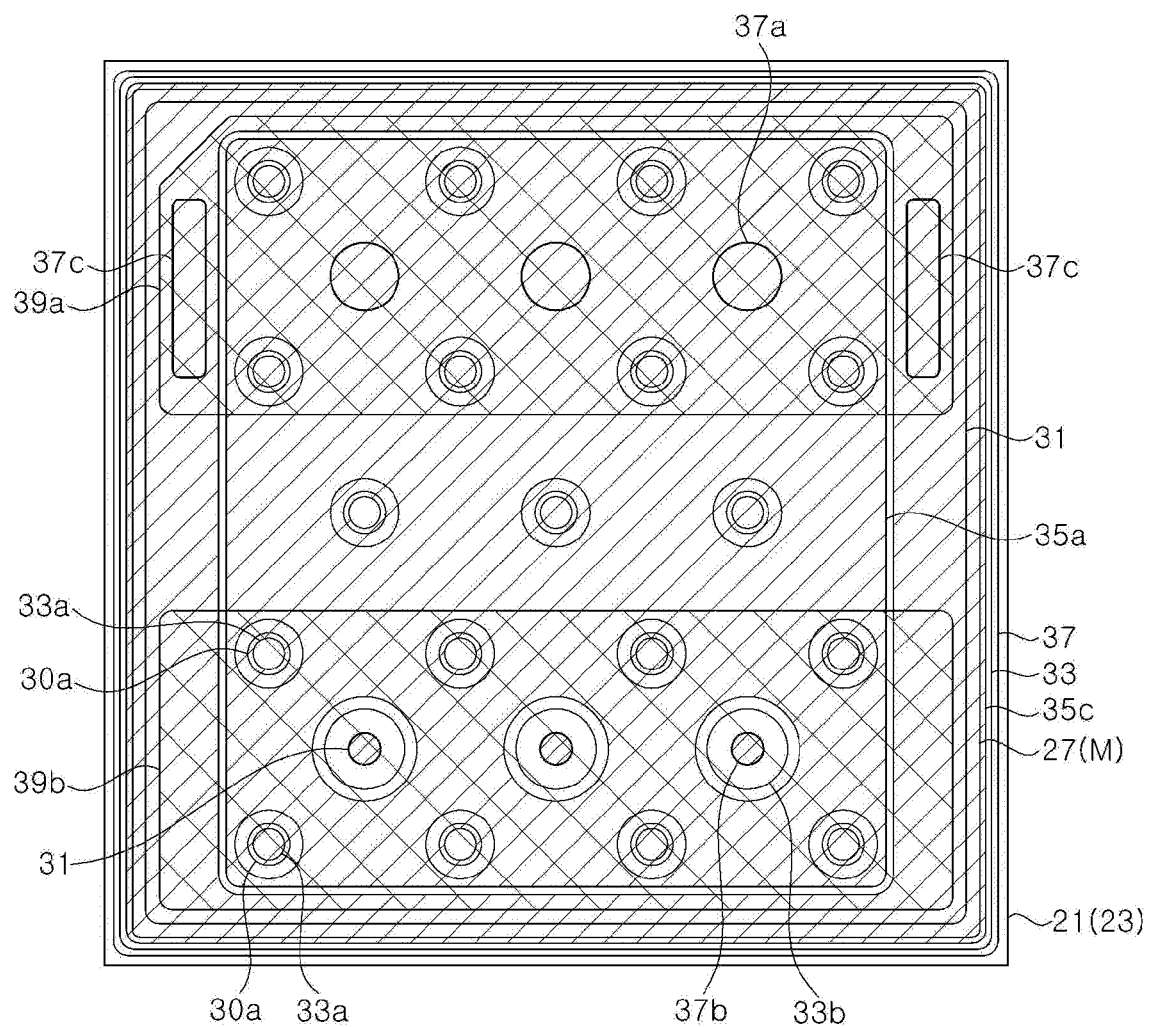
FIG. 8 is a schematic plan view of a light emitting diode according to another exemplary embodiment.

FIG. 8 is a schematic plan view of a light emitting diode according to another exemplary embodiment.

Referring to FIG. 8, the light emitting diode according to the illustrated exemplary embodiment is generally similar to the light emitting diode described with reference to FIGS. 1 and 2, except that the first bump pad 39a is connected to the metal reflection layer 35c. In order to avoid redundancy, the detailed description of the substantially same components will be omitted.

The upper insulation layer 37 of the light emitting diode according to the illustrated exemplary embodiment further includes a third opening 37c exposing the metal reflection layer 35c. The first bump pad 39a is connected to the first pad metal layer 35a through the first openings 37a of the upper insulation layer 37, and is electrically connected to the metal reflection layer 35c through the third opening 37c In this manner, since the metal reflection layer 35c is connected to the first bump pad 39a, heat may be dissipated through the metal reflection layer 35c. As such, the heat dissipation performance of the light emitting diode may be improved.

Although the metal reflection layer 35c is described as being connected to the first bump pad 39a in the illustrated exemplary embodiment, the inventive concepts are not limited thereto. For example, in some exemplary embodiments, the metal reflection layer 35c may be connected to the second bump pad 39b.

Referring back to FIGS. 1 and 2, the metal reflection layer 35c is electrically insulated from the first bump pad 39a or the second bump pad 39b, and thus, the metal reflection layer 35c is electrically floated. However, the metal reflection layer 35c according to the illustrated exemplary embodiment is not electrically floated because it is connected to the first bump pad 39a or the second bump pad 39b.

Figure 9:
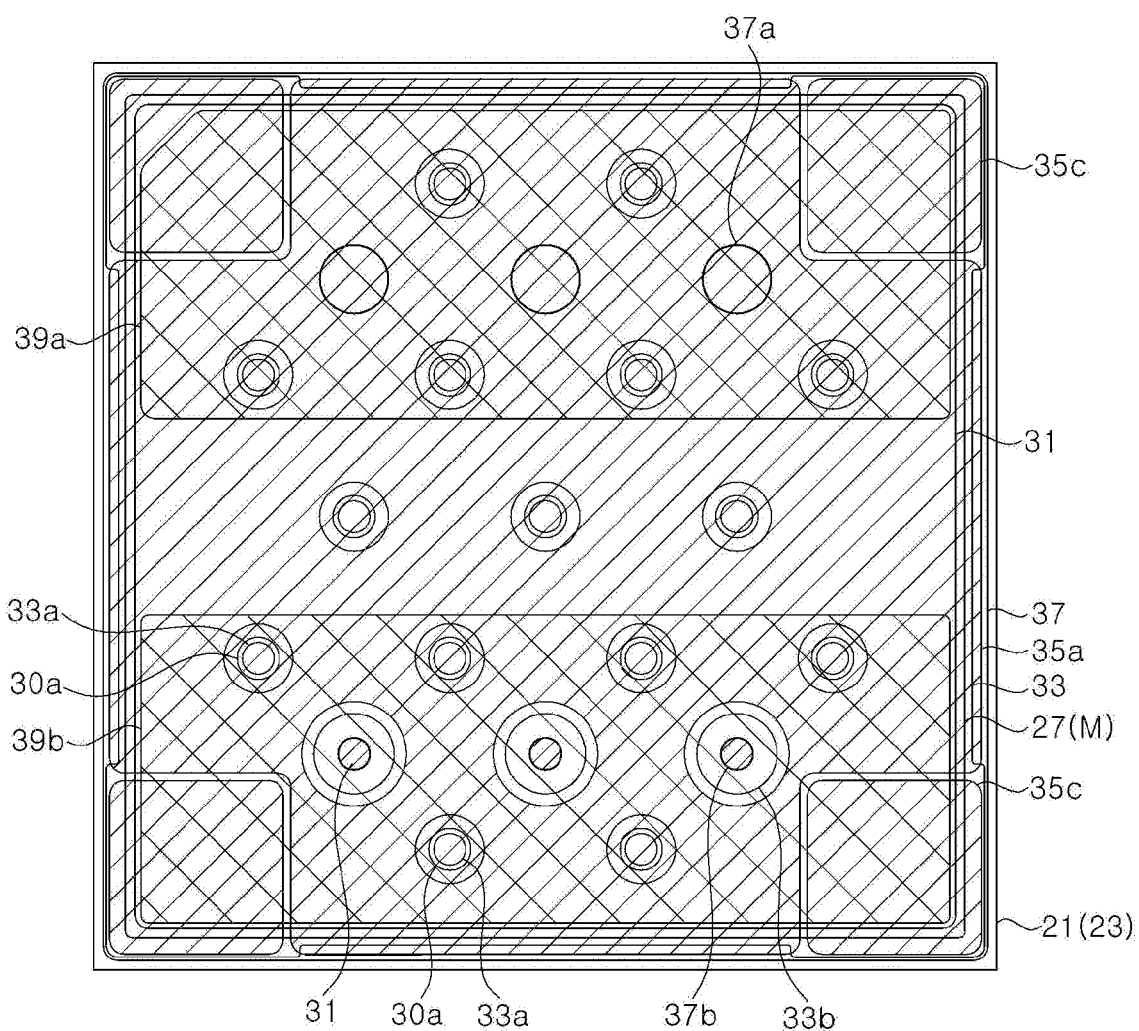
FIG. 9 is a schematic plan view of a light emitting diode according to another exemplary embodiment.

FIG. 9 is a schematic plan view of a light emitting diode according to another exemplary embodiment.

Referring to FIG. 9, the light emitting diode according to the illustrated exemplary embodiment is generally similar to the light emitting diode described with reference to FIGS. 1 and 2, except for a shape and a location of the first pad metal layer 35a and the metal reflection layer 35c. In order to avoid redundancy, the detailed description of the same or similar components will be omitted.

Referring back to FIG. 1, the metal reflection layer 35c surrounds the first pad metal layer 35a in the ring shape, but in the illustrated exemplary embodiment, the metal reflection layer 35c is divided into a plurality of regions as shown in FIG. 9. More particularly, the metal reflection layer 35c is disposed near the edges of the mesa M.

Moreover, the first pad metal layer 35a is electrically connected to the first conductivity type semiconductor layer 23 in the via-holes 30a, and is electrically connected to the first conductivity type semiconductor layer 23 near the edges of the mesa M.

Figure 10:
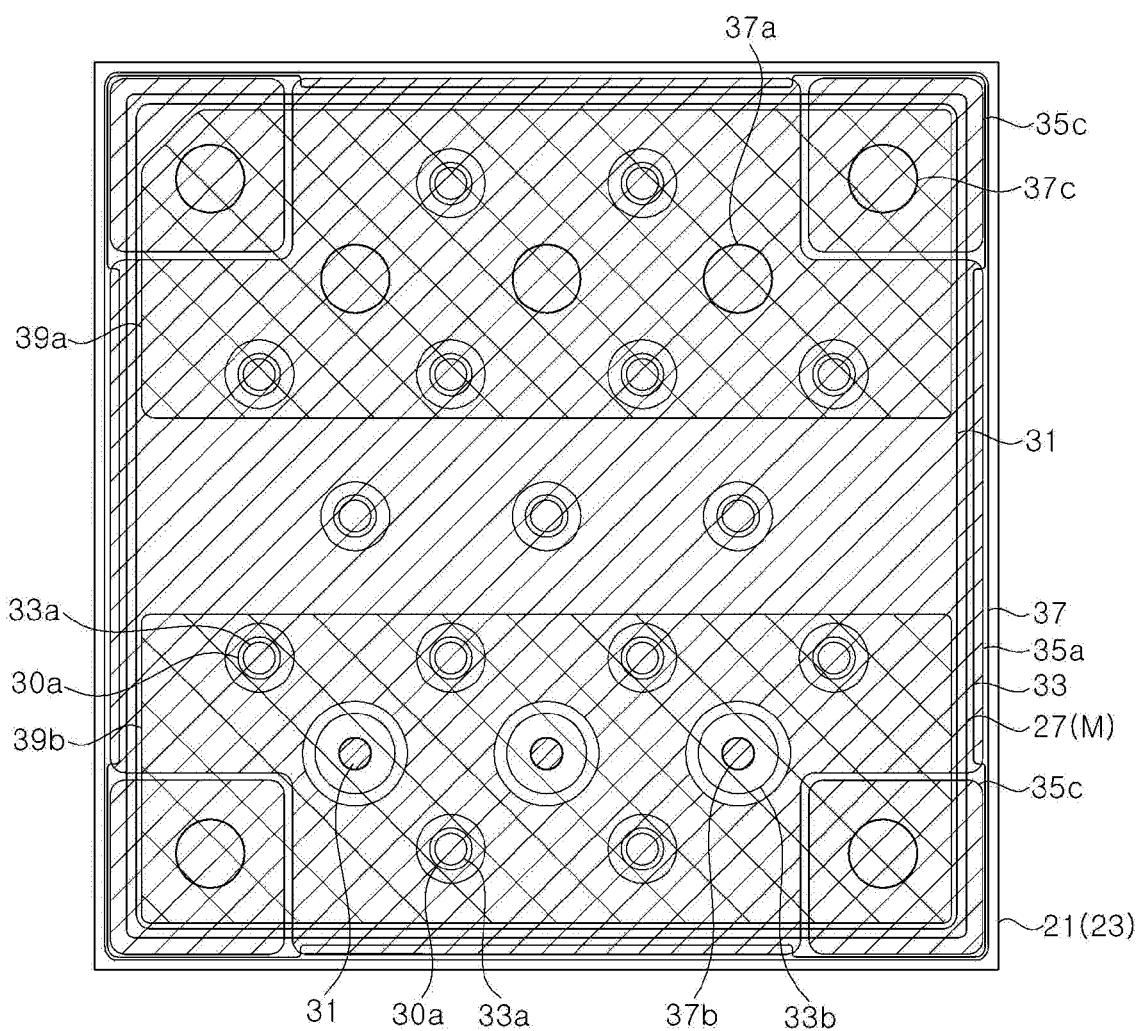
FIG. 10 is a schematic plan view of a light emitting diode according to another exemplary embodiment.

FIG. 10 is a schematic plan view of a light emitting diode according to another exemplary embodiment.

Referring to FIG. 10, the light emitting diode according to the illustrated exemplary embodiment is generally similar to the light emitting diode described with reference to FIG. 9, except that the metal reflection layers 35c are connected to the first bump pad 39a or the second bump pad 39b, respectively.

In particular, the upper insulation layer 37 has openings 37c exposing the metal reflection layers 35c disposed near respective corners of the mesa M. Each of the first bump pad 39*a* and the second bump pad 39*b* covers the openings 37*c* of the upper insulation layer 37, and are connected to the metal reflection layers 35*c*.

In this manner, heat may be additionally dissipation through the metal reflection layers 35*c*, thereby improving heat dissipation efficiency.

Figure 11:
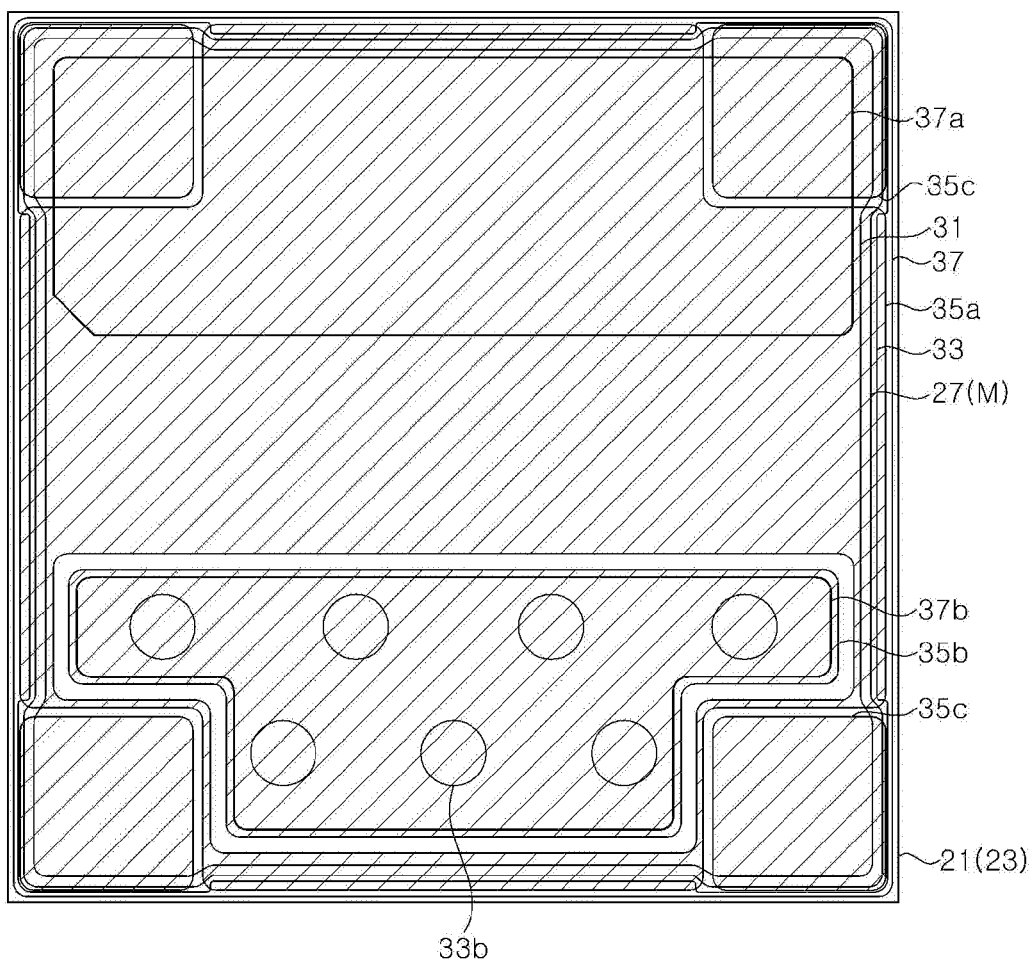
FIG. 11 is a schematic plan view of a light emitting diode according to another exemplary embodiment.

FIG. 11 is a schematic plan view of a light emitting diode according to another exemplary embodiment.

Referring to FIG. 11, the light emitting diode according to the illustrated exemplary embodiment is generally similar to the light emitting diode described with reference to FIG. 9, except that a shape of the mesa M is different, and that the light emitting diode further includes a second pad metal layer 35*b*, and the first and second bump pads 39*a* and 39*b* of FIG. 9 are omitted.

The mesa M of the light emitting diode according to the illustrated exemplary embodiment may not include a via-hole (e.g., the via-hole 30*a* in FIG. 9). Therefore, the lower insulation layer 33 does not have the first openings 33*a*. Meanwhile, grooves embedded inside a mesa M region are formed at the edges of the mesa M. The lower insulation layer 33 is formed to expose the first conductivity type semiconductor layer 23 in these grooves.

The first pad metal layer 35*a* is electrically connected to the first conductivity type semiconductor layer 23 at the edges of the mesa M.

The upper insulation layer 37 has a first opening 37*a* exposing the first pad metal layer 35*a*, and a second opening exposing the second pad metal layer 35*b*. The first and second pad metal layers 35*a* and 35*b* exposed through these openings 37*a* and 37*b* are directly used when the light emitting diode is flip bonded, without the bump pads.

Each of the first opening 37*a* and the second opening 37*b* of the upper insulation layer 37 exposes the metal reflection layers 35*c* disposed on both sides of the first pad metal layer 35*a*. Therefore, when the light emitting diode is mounted on the submount or the printed circuit board through a bonding material, such as solder, heat may be additionally dissipated through the metal reflection layers 35*c*, thereby improving heat dissipation efficiency.

In the illustrated exemplary embodiment, the second pad metal layer 35*b* is disposed on the mesa M, and is electrically connected to the ohmic reflection layer 31 through the openings 33*b* of the lower insulation layer 33. The second pad metal layer 35*b* may be surrounded by the first pad metal layer 35*a*. The first and second pad metal layers 35*a* and 35*b* and the metal reflection layer 35*c* may include substantially the same material and may be formed substantially simultaneously by the same process.

Figure 12:
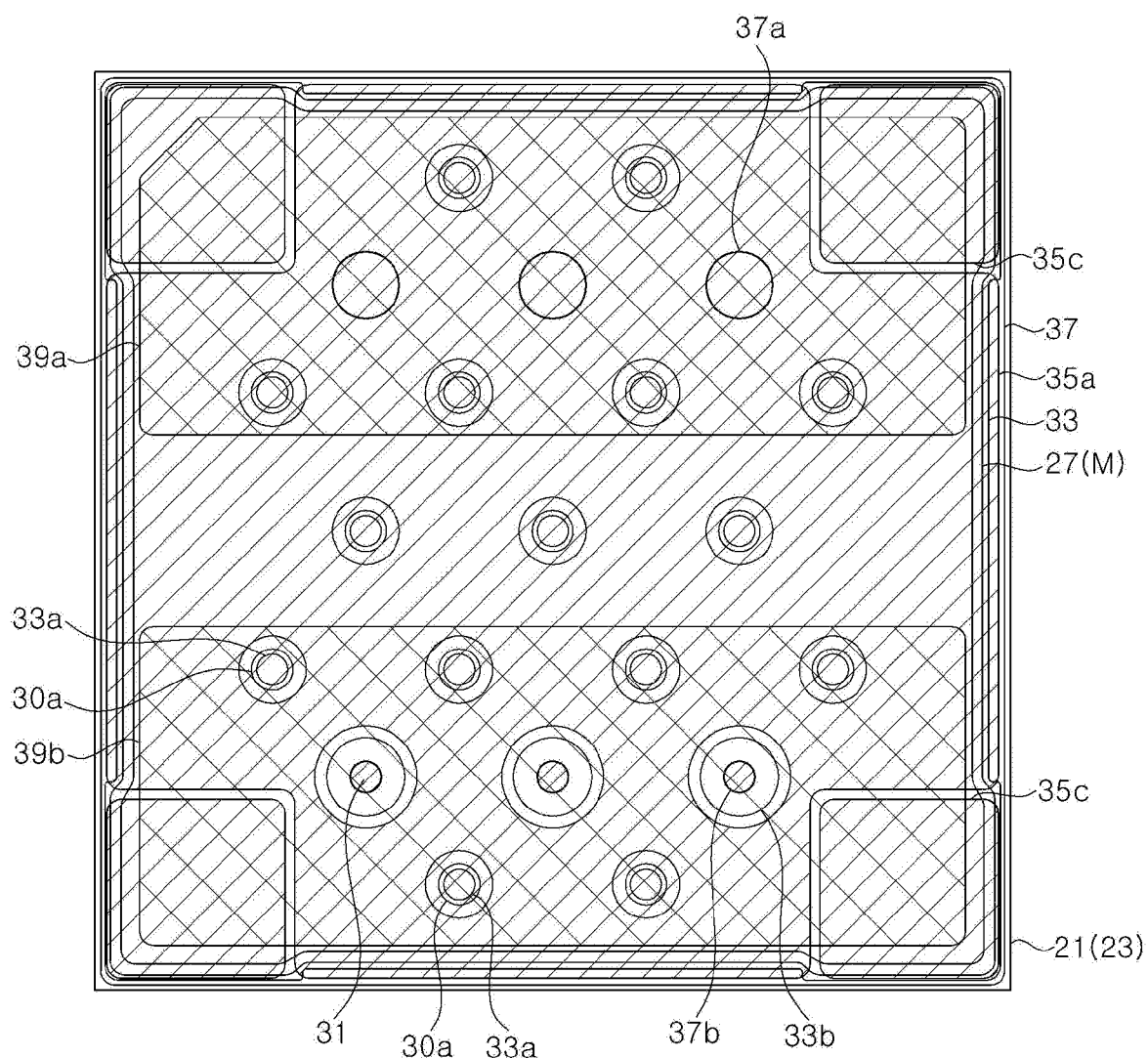
FIG. 12 is a schematic plan view of a light emitting diode according to another exemplary embodiment.

FIG. 12 is a schematic plan view of a light emitting diode according to another exemplary embodiment.

Referring to FIG. 12, the light emitting diode according to the illustrated exemplary embodiment is generally similar to the light emitting diode described with reference to FIG. 9, except for a shape of the mesa M.

The mesa M of the light emitting diode according to the illustrated exemplary embodiment includes a via-hole (e.g., the via-hole 30*a* in FIG. 9), and grooves embedded inside the mesa M region are formed at the edges of the mesa M. The lower insulation layer 33 is formed to expose the first conductivity type semiconductor layer 23 in these grooves.

Therefore, the first pad metal layer 35*a* may be electrically connected to the first conductivity type semiconductor layer 23 in the via-holes 30*a* and the grooves.

Figure 13:
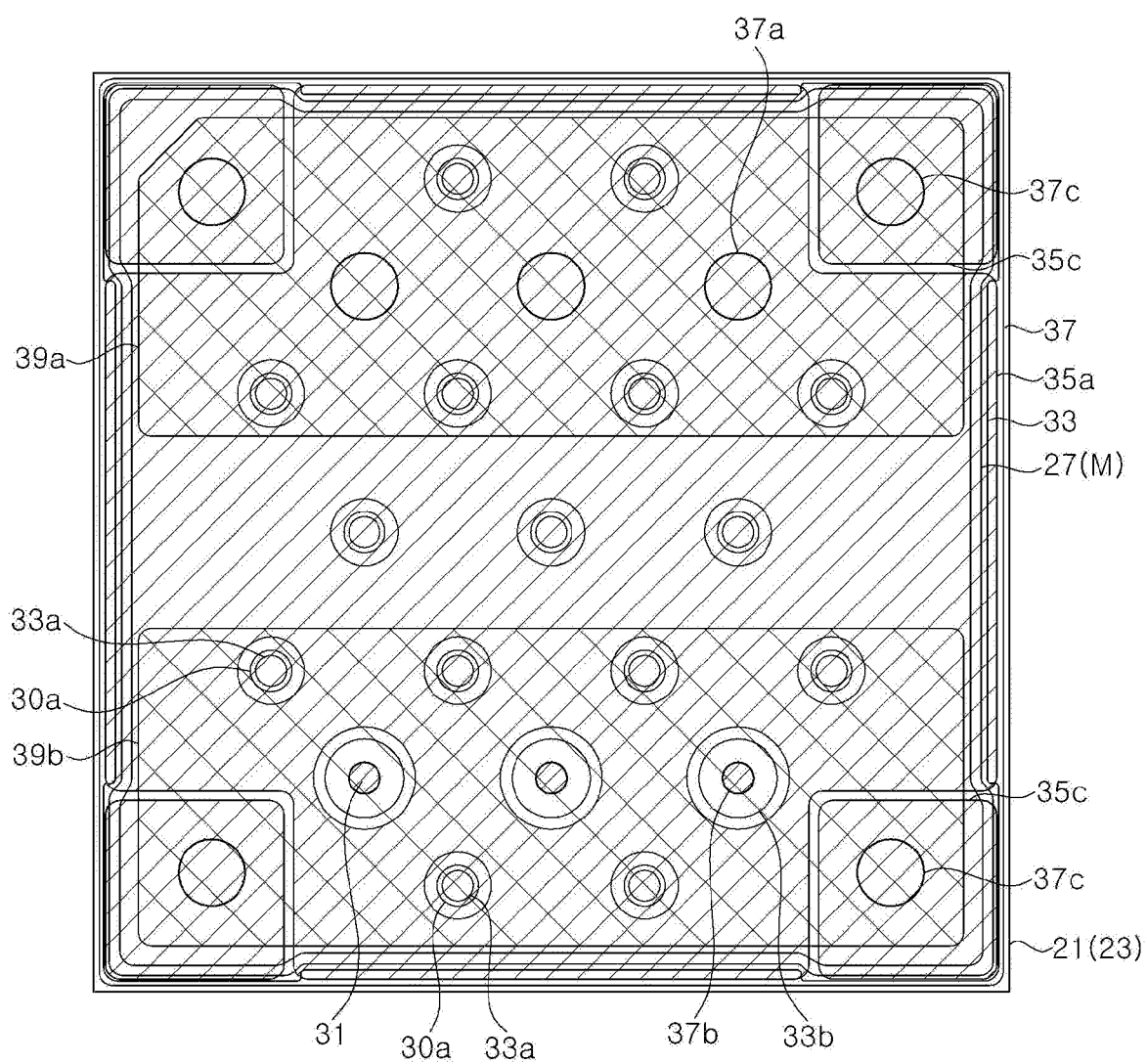
FIG. 13 is a schematic plan view of a light emitting diode according to another exemplary embodiment.

FIG. 13 is a schematic plan view of a light emitting diode according to another exemplary embodiment.

Referring to FIG. 13, the light emitting diode according to the illustrated exemplary embodiment is generally similar to the light emitting diode described with reference to FIG. 12, except that the upper insulation layer 37 includes openings 37*c* exposing the metal reflection layers 35*c*.

Each of the first and second bump pads 39*a* and 39*b* is connected to the metal reflection layers 35*c* exposed through the openings 37*c* of the upper insulation layer 37, thereby improving the heat dissipation performance of the light emitting diode.

Figure 14:
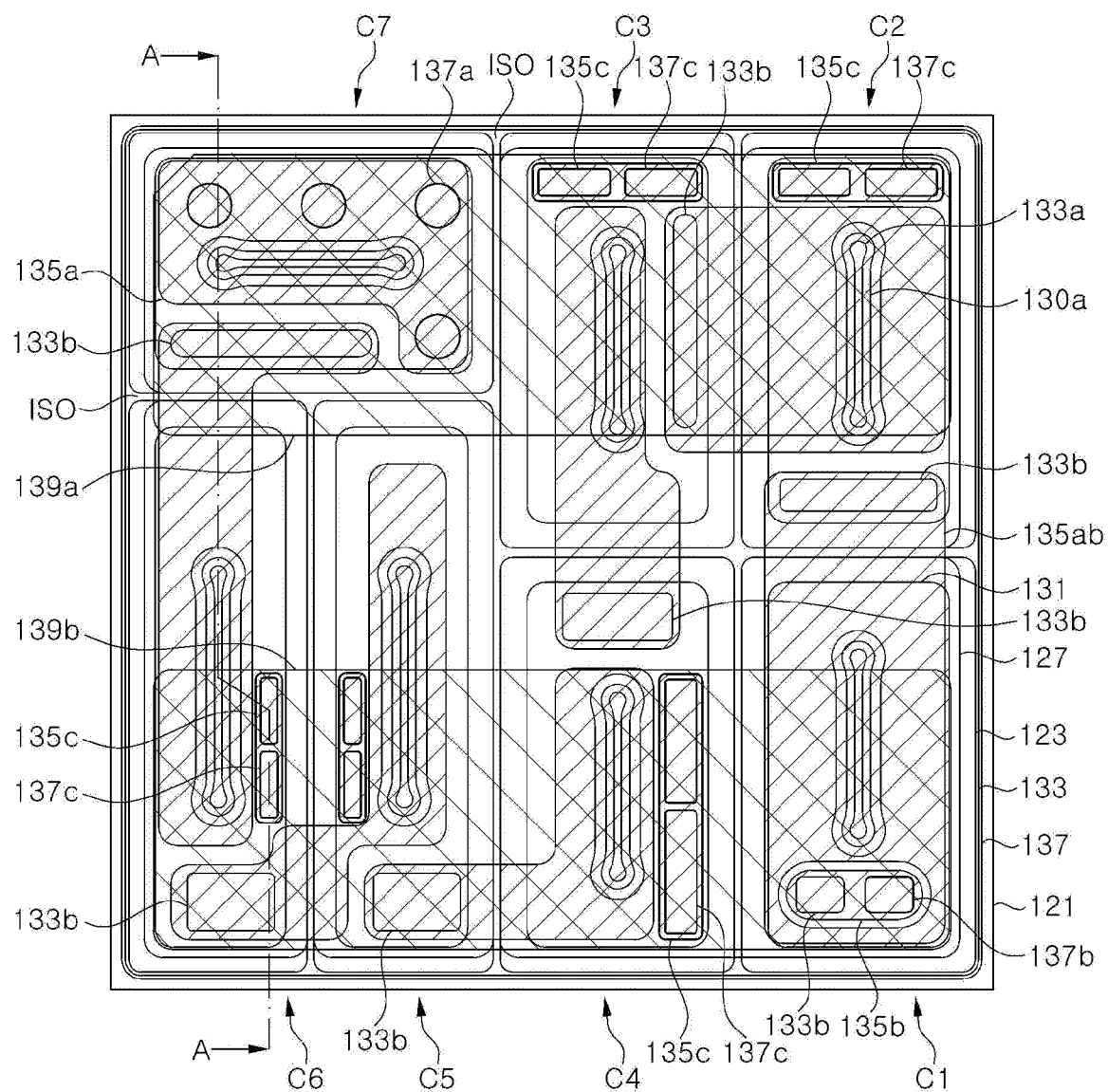
FIG. 14 is a schematic plan view of a light emitting diode according to an exemplary embodiment.
Figure 15:
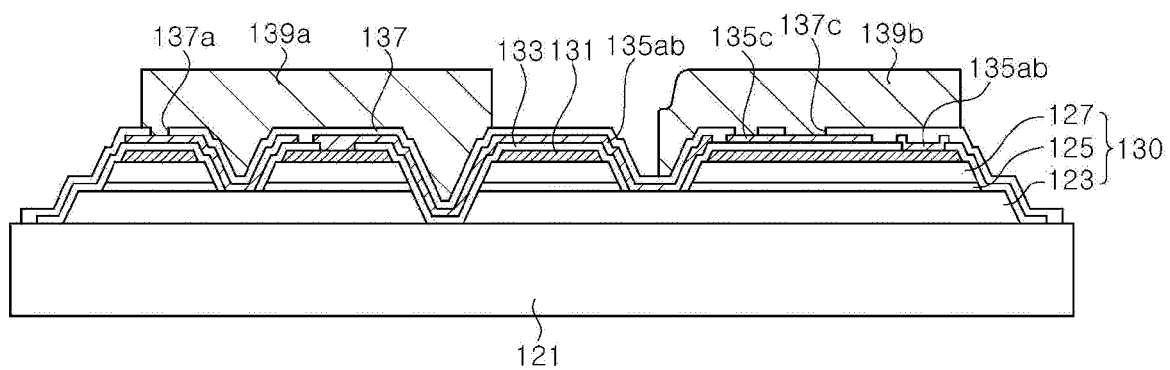
FIG. 15 is a schematic cross-sectional view taken along line A-A of FIG. 14.
Figure 16:
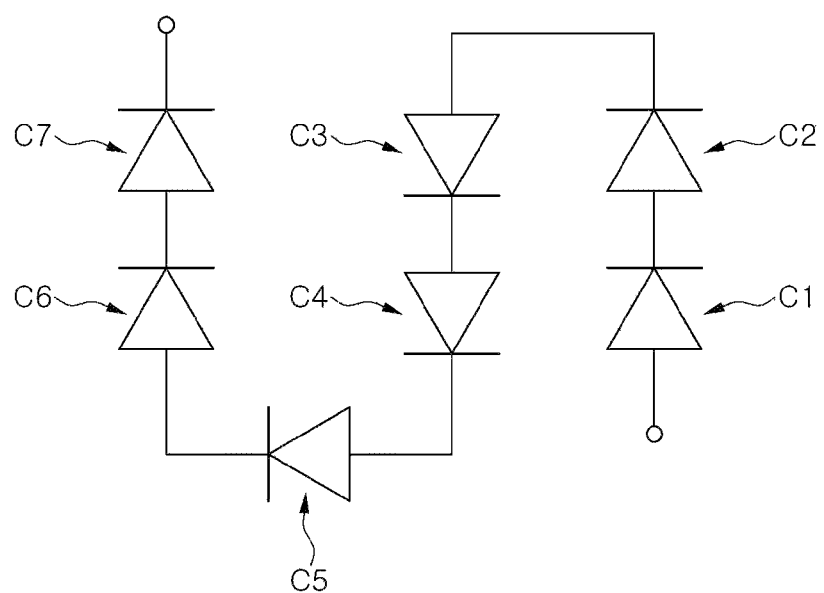
FIG. 16 is a schematic circuit diagram of the light emitting diode of FIG. 14 according to an exemplary embodiment.

FIG. 14 is a schematic plan view of a light emitting diode according to an exemplary embodiment, FIG. 15 is a schematic cross-sectional view taken along line A-A of FIG. 14, and FIG. 16 is a schematic circuit diagram of the light emitting diode of FIG. 14.

Referring to FIGS. 14, 15, and 16, the light emitting diode includes a substrate 121, a plurality of light emitting cells C1 to C7, an ohmic reflection layer 131, a lower insulation layer 133, a first pad metal layer 135*a*, a second pad metal layer 135*b*, a third pad metal layer 135*c*, connectors 135*ab*, an upper insulation layer 137, a first bump pad 139*a*, and a second bump pad 139*b*. Each of the light emitting cells C1 to C7 includes a semiconductor stack 130, which includes a first conductivity type semiconductor layer 123, an active layer 125, and a second conductivity type semiconductor layer 127.

The substrate 121 may be selected from any substrates capable of growing gallium nitride semiconductor layers thereon. The substrate 121 may include, for example, a sapphire substrate, a gallium nitride substrate, a SiC substrate, or others, and may be a patterned sapphire substrate. The substrate 121 may have a substantially rectangular or square shape, as shown in FIG. 14, without being limited thereto. A size of the substrate 121 is not particularly limited and may be selected in various ways.

The light emitting cells C1 to C7 are disposed to be apart from each other on the substrate 121. Although FIG. 14 shows seven light emitting cells C1 to C7, however, the inventive concepts are not limited to a particular number of light emitting cells in a light emitting diode.

Each of the light emitting cells C1 to C7 includes the first conductivity type semiconductor layer 123. The first conductivity type semiconductor layer 123 is disposed on the substrate 121. The first conductivity type semiconductor layer 123 may be a gallium nitride semiconductor layer grown on the substrate 121 and doped with dopants, for example, Si.

The active layer 125 and the second conductivity type semiconductor layer 127 are disposed on the first conductivity type semiconductor layer 123. The active layer 125 is interposed between the first conductivity type semiconductor layer 123 and the second conductivity type semiconductor layer 127. The active layer 125 and the second conductivity type semiconductor layer 127 may have a smaller area than the first conductivity type semiconductor layer 123. The active layer 125 and the second conductivity type semiconductor layer 127 may be formed in a mesa shape on the first conductivity type semiconductor layer 123 through mesa etching.

Among edges of the light emitting cells C1 to C7 adjacent to an edge of the substrate 121, an edge of the first conductivity type semiconductor layer 123 may be spaced apart from an edge of the mesa, for example, from the edges of the active layer 125 and the second conductivity type semiconductor layer 127. More particularly, an upper surface of the first conductivity type semiconductor layer 123 is partially exposed to the outside of the mesa. The active layer 125 is further spaced apart from the edge of the substrate 121 than the first conductivity type semiconductor layer 123, and thus may be prevented from being damaged during a process of separating the substrate with laser beams, for example.

Meanwhile, among edges of the light emitting cells C1 to C7 that face the adjacent light emitting cells, the edge of the first conductivity type semiconductor layer 123 and the edges of the active layer 125 and the second conductivity type semiconductor layer 127 may be disposed on the same inclined surface. Accordingly, the upper surface of the first conductivity type semiconductor layer 123 may not be exposed on a side where the light emitting cells face each other. In this manner, light emitting areas of the light emitting cells C1 to C7 may be secured.

The active layer 125 may have a single quantum well structure or a multiple-quantum well structure. In the active layer 125, the compositions and thicknesses of well layers determine the wavelength of light generated in the active layer. In particular, the active layer can generate UV light, blue light, or green light depending on the compositions of the well layers.

The second conductivity type semiconductor layer 127 may be a gallium nitride semiconductor layer doped with p-type dopants, for example, Mg. Each of the first conductivity type semiconductor layer 123 and the second conductivity type semiconductor layer 127 may have a single layer or a multi-layered structure, and may include a super-lattice layer. The first conductivity type semiconductor layer 123, the active layer 125, and the second conductivity type semiconductor layer 127 may be grown on the substrate in a chamber by a well-known method in the art, such as metal organic chemical vapor deposition (MOCVD) or molecular beam epitaxy (MBE).

Each of the light emitting cells C1 to C7 includes via-holes 130a formed through the second conductivity type semiconductor layer 127 and the active layer 125 to expose the first conductivity type semiconductor layer 123. The via-holes 130a are surrounded by the second conductivity type semiconductor layer 127 and the active layer 125. As shown in the drawings, the via-holes 130a may be disposed in a center region of the light emitting cells C1 to C7, and may have an elongated shape. However, the inventive concepts are not limited thereto, and in some exemplary embodiments, each of the light emitting cells C1 to C7 may include a plurality of via-holes.

The ohmic reflection layer 131 is disposed on the second conductivity type semiconductor layer 127 and is electrically connected to the second conductivity type semiconductor layer 127. The ohmic reflection layer 131 may be disposed over substantially the entire region of the second conductivity type semiconductor layer 127 in an upper region of the second conductivity type semiconductor layer 127. For example, the ohmic reflection layer 131 may cover 80% or more, further, 90% or more of the upper region of the second conductivity type semiconductor layer 127. In order to prevent damage to the ohmic reflection layer from moisture that may penetrate through a cell isolation region ISO or the edge of the substrate, the edge of the ohmic reflection layer 131 may be disposed farther inside a cell region than the edge of the second conductivity type semiconductor layer 127.

The ohmic reflection layer 131 may include metal having reflectivity, and thus, may reflect light generated from the active layer 125 and travelling towards the ohmic reflection layer 131 back to the substrate 121. For example, the ohmic reflection layer 131 may be formed of a single reflection metal layer, without being limited thereto. Alternatively, the ohmic reflection layer 131 may include an ohmic layer and a reflection layer. The ohmic layer may be a metal layer, such as a Ni layer, or a transparent oxide layer, such as an ITO layer, and the reflection layer may be a metal layer having high reflectance, such as an Ag or Al layer.

The lower insulation layer 133 covers the light emitting cells C1 to C7 and the ohmic reflection layer 131. The lower insulation layer 133 may cover not only upper surfaces of the light emitting cells C1 to C7, but also side surfaces of the light emitting cells C1 to C7 along the peripheries thereof, and may partially cover the substrate 121 around the light emitting cells C1 to C7. More particularly, the lower insulation layer 133 may cover a cell isolation region ISO between the light emitting cells C1 to C7, and may further cover a portion of the first conductivity type semiconductor layer 123 exposed in the via-holes 130a.

The lower insulation layer 133 includes first openings 133a exposing the first conductivity type semiconductor layer 123 and second openings 133b exposing the ohmic reflection layer 131. The first opening 133a may expose the first conductivity type semiconductor layers 123 in the via-holes 130a, and may also expose an upper surface of the substrate 121 along the edge of the substrate 121.

The second opening 133b is disposed over the ohmic reflection layer 131 to expose the ohmic reflection layer 131. Locations and shapes of the second openings 133b may be modified in various ways for arrangement and electrical connection of the light emitting cells C1 to C7. Although FIG. 14 shows one second opening 133b disposed on each of the light emitting cells, however, in some exemplary embodiments, a plurality of second openings 133b may be disposed on each of the light emitting cells C1 to C7.

The lower insulation layer 133 may be formed of a single layer of $SiO_2$ or $Si_3N_4$, without being limited thereto. For example, the lower insulation layer 133 may have a multi-layer structure including a silicon oxide layer and a silicon nitride layer, and may include a distributed Bragg reflector, in which material layers having different refractive indices, such as $SiO_2$ layers, $TiO_2$ layers, $ZrO_2$ layers, $MgF_2$ layers, or $Nb_2O_5$ layers, are alternately stacked one above another. In addition, the lower insulation layer 133 may have the same stack structure therethrough. Alternatively, some portions of the lower insulation layer may include a greater number of layers than other portions thereof. More particularly, a portion of the lower insulation layer 133 on the ohmic reflection layer 131 may have a greater thickness than a portion of the lower insulation layer 133 disposed around the ohmic reflection layer 131.

The first pad metal layer 135a, the second pad metal layer 135b, the third pad metal layer 135c, and the connectors 135ab are disposed on the lower insulation layer 133. The second pad metal layer 135b is disposed over a first light emitting cell C1, and the first pad metal layer 135a is disposed over the last light emitting cell, for example, the seventh light emitting cell C7. The connectors 135ab are disposed over two adjacent light emitting cells and electrically connect the light emitting cells C1 to C7 in series. Accordingly, as shown in FIG. 16, the seven light emitting cells C1 to C7 of FIG. 14 are connected to one another in series by the connectors 135ab, to form a series array of light emitting cells. For example, the first light emitting cell C1 is placed at the first terminal of the series array and the seventh light emitting cell C7 corresponding to the last light emitting cell is placed at the last terminal of the series array.

Referring to FIG. 14, the first pad metal layer 135a may be disposed within an upper region of the last light emitting cell C7, more specifically, in an upper region of the second conductivity type semiconductor layer 127 of the last light emitting cell C7. The first pad metal layer 135a is electrically connected to the first conductivity type semiconductor layer 123 of the last light emitting cell C7 through the first opening 133a of the lower insulation layer 133. The first pad metal layer 135a may directly contact the first conductivity type semiconductor layer 123 through the first opening 133a.

In addition, the second pad metal layer 135b may be disposed within an upper region of the first light emitting cell C1, more specifically, in an upper region of the second conductivity type semiconductor layer 127 of the first light emitting cell C1. The second pad metal layer 135b is electrically connected to the ohmic reflection layer 131 on the first light emitting cell C1 through the second opening 133b of the lower insulation layer 133. The second pad metal layer 135b may directly contact the ohmic reflection layer 131 through the second opening 133b.

The second pad metal layer 135b may be surrounded by the connector 135ab, and thus, a boundary region surrounding the second pad metal layer 135b may be formed between the second pad metal layer 135b and the connector 135ab, which may expose the lower insulation layer 133.

The connectors 135ab electrically connect adjacent light emitting cells to each other. Each of the connectors 135ab is electrically connected to the first conductivity type semiconductor layer 123 of one light emitting cell and to the ohmic reflection layer 131 of another light emitting cell adjacent thereto, and thus, to the second conductivity type semiconductor layer 127 thereof to connect the adjacent light emitting cells to each other in series. More specifically, each of the connectors 135ab may be electrically connected to the first conductivity type semiconductor layer 123 exposed through the first opening 133a of the lower insulation layer 133, and may also be electrically connected to the ohmic reflection layer 131 exposed through the second opening 133b thereof. Furthermore, the connectors 135ab may directly contact the first conductivity type semiconductor layer 123 and the ohmic reflection layer 131.

Each of the connectors 135ab passes the cell isolation region ISO between the light emitting cells. Each of the connectors 135ab may pass an upper region of only one edge among a plurality of edges of the first conductivity type semiconductor layer 123. Accordingly, an area of the connector 135ab disposed on the cell isolation region ISO may be reduced. Furthermore, in order to connect adjacent light emitting cells to each other, all of other segments of the connector 135ab, excluding the segment that passes the cell isolation region ISO, are limitedly disposed over the light emitting cells. For example, each of the light emitting cells C1 to C7 may have a substantially rectangular shape, as shown in FIG. 14, and thus has four edges. In this case, the connector 135ab passes an upper region of only one edge of the four edges of one light emitting cell, and may be spaced apart from upper regions of the remaining edges of the light emitting cell.

The cell isolation region ISO is a region, in which the substrate 121 is exposed through removal of the semiconductor stack 130 by etching, and has a greater depth than the light emitting cells C1 to C7 to undergo significant variation in morphology. Accordingly, the lower insulation layer 133 and the connector 135ab covering the cell isolation region ISO undergo significant variation in morphology, that is, a significant elevation variation, near the cell isolation region ISO. The connector 135ab passes the cell isolation region ISO, which undergoes significant variation in morphology, to connect two adjacent light emitting cells. As such, the connector 135ab may suffer from various problems, such as being damaged by external environments. Accordingly, reliability of the light emitting diode may be improved by reducing the area of the connector 135ab disposed in the cell isolation region ISO.

The third pad metal layer 135c is spaced apart from the light emitting cells C1 to C7 and the ohmic reflection layer 131 by the lower insulation layer 133, unlike the first and second pad metal layers 135a and 135b and the connectors 135ab. The third pad metal layer 135c is also spaced apart from the first and second pad metal layers 135a and 135b and the connectors 135ab.

The third pad metal layer 135c may be disposed over at least one light emitting cell, and a plurality of third pad metal layers 135c may be divided and disposed over the plurality of light emitting cells. In the illustrated exemplary embodiment, the third pad metal layers 135c are disposed over the light emitting cells, other than the first light emitting cell C1 and the seventh light emitting cell C7, that is, on the second to sixth light emitting cells C2 to C6. More particularly, each of the third pad metal layers 135c is disposed over each of the light emitting cells C2 to C6, other than the light emitting cells C7 and C1 to which the first pad metal layer 135a and the second pad metal layer 135b are connected. However, the inventive concepts are not limited thereto, and in some exemplary embodiments, the third pad metal layers 135c may be disposed over each of the light emitting cells C1 to C7, or the third pad metal layers 135c may not be disposed on some of the light emitting cells. The first and second pad metal layers 135a and 135b may dissipate heat in the light emitting cells C1 and C7 in which the first pad metal layer 135a and the second pad metal layer 135b are disposed. As such, the third pad metal layers 135c may be disposed on each of the remaining light emitting cells C2 to C6, other than the first and seventh light emitting cells C1 and C7, to improve the heat dissipation of the light emitting cells C1 to C7.

In some exemplary embodiments, the third pad metal layer 135c may be disposed within an upper region of the ohmic reflection layer 131. The heat dissipated from the light emitting cells C1 to C7 is likely to be transferred through the ohmic reflection layer 131. Accordingly, the third pad metal layer 135c is arranged to overlap with the ohmic reflection layer 131, to facilitate heat transfer from the ohmic reflection layer 131 to the third pad metal layer 135c. However, the inventive concepts are not limited thereto, and in another exemplary embodiment, the third pad metal layer 135c may be disposed the outside of the upper region of the ohmic reflection layer 131, and may also be disposed over at least two light emitting cells.

The third pad metal layer 135c according to the illustrated exemplary embodiment is shown as having a substantially elongated rectangular shape, but the inventive concepts are not limited thereto, and the third pad metal layer 135c may have various shapes.

The first pad metal layer 135a, the second pad metal layer 135b, the third pad metal layer 135c, and the connectors 135ab may be formed of substantially the same material and may be formed substantially simultaneously by the same process after formation of the lower insulation layer 133, and thus, may be placed at substantially the same level. However, the inventive concepts are not limited thereto, and in some exemplary embodiments, the third pad metal layer 135c may be formed at different process with different materials from that of the first and second pad metal layers 135a and 135b or the connectors 135ab. Moreover, in an exemplary embodiment, the first pad metal layer 135a, the second pad metal layer 135b, the third pad metal layer 135c, and the connectors 135ab may include a portion placed on the lower insulation layer 133, respectively. In particular, each portions of the third pad metal layer 135c may be placed on the lower insulation layer 133 and spaced apart from the light emitting cells and the ohmic reflection layer 131.

The first and second pad metal layers 135a and 135b and the connesctor 135ab may include a reflection layer, such as an Al layer, which may be formed on a bonding layer, such as a Ti, Cr or Ni layer. Further, a protection layer having a single layer or composite layer structure of Ni, Cr, or Au may be formed on the reflection layer. The first and second pad metal layers 135a and 135b and the connectors 135ab may have a multilayer structure of, for example, Cr/Al/Ni/Ti/Ni/Ti/Au/Ti. The third pad metal layer 135c may have the same layer structure with the same material as the first and second pad metal layers 135a and 135b, without being limited thereto, and may have a different layer structure with different materials from the first and second pad metal layers 135a and 135b and the connesctor 135ab.

The upper insulation layer 137 covers the first, second, and third pad metal layers 135a, 135b, and 135c, and the connectors 135ab. In addition, the upper insulation layer 137 may cover an edge of the lower insulation layer 133 along the periphery of each of the light emitting cells C1 to C7. However, the upper insulation layer 137 may expose the upper surface of the substrate 121 along the edge of the substrate 121. A shortest distance from the edge of the upper insulation layer 137 to the connector 135ab may be set to be as long as possible to prevent damage to the connectors 135ab from moisture penetration, which may be about 15 μm or more. When the shortest distance therebetween is less than about 15 μm, the connectors 135ab may be damaged from moisture upon operation of the light emitting diode at low current, for example, 25 mA.

The upper insulation layer 137 includes a first opening 137a exposing the first pad metal layer 135a, and a second opening 137b exposing the second pad metal layer 135b, and a third opening 137c exposing the third pad metal layer 135c. The first opening 137a and the second opening 137b are disposed in upper regions of the last light emitting cell C7 and the first light emitting cell C1, respectively. Moreover, the third opening 137c is disposed on the third pad metal layer 135c. FIG. 14 shows that two third openings 137c are disposed on respective third pad metal layers 135c, however, in some exemplary embodiments, one third opening 137c may be disposed on one third pad metal layer 135c, or three or more third openings 137c may be disposed on one third pad metal layer 135c. The other regions of the light emitting cells C1 to C7 excluding the first, second and third openings 137a, 137b and 137c may be covered by the upper insulation layer 137. Accordingly, upper and side surfaces of the connectors 135ab may be covered by the upper insulation layer 137 to be sealed thereby.

In an exemplary embodiment, the second opening 137b of the upper insulation layer 137 is disposed apart from the second opening 133b of the lower insulation layer 133 in the lateral direction so as not to overlap each other, as shown in FIG. 14. In this manner, even when solders enter the second opening 137b of the upper insulation layer 137, the solders may be prevented from diffusing into the second opening 133b of the lower insulation layer 133, thereby preventing contamination of the ohmic reflection layer 131 by the solders. Alternatively, in some exemplary embodiments, the second opening 137b of the upper insulation layer 137 may be disposed to overlap with the second opening 133b of the lower insulation layer 133. The third opening 137c of the upper insulation layer 137 is not only spaced apart laterally from the first and second openings 137a and 137b of the upper insulation layer 137, but also spaced apart laterally from the openings 133a and 133b of the lower insulation layer 133.

The upper insulation layer 137 may be formed of a single layer of $SiO_2$ or $Si_3N_4$, however, the inventive concepts are not limited thereto. For example, the upper insulation layer 137 may have a multilayer structure which includes a silicon oxide layer and a silicon nitride layer, and may include a distributed Bragg reflector, in which material layers having different refractive indices, such as $SiO_2$ layers, $TiO_2$ layers, $ZrO_2$ layers, $MgF_2$ layers, or $Nb_2O_5$ layers, are alternately stacked one above another.

In addition, the first and second bump pads 139a and 139b may be disposed over the plurality of light emitting cells C1 to C7 as shown in FIG. 14. Referring to FIG. 14, the first bump pad 139a is disposed over upper regions of the second, third, fifth, sixth and seventh light emitting cells C2, C3, C5, C6, and C7, and the second bump pad 139b is disposed over upper regions of the first, fourth, fifth, and sixth light emitting cells C1, C4, C5, and C6. Accordingly, the first and second bump pads 139a and 139b may be formed relatively large, thereby facilitating a subsequent mounting process of the light emitting diode.

The first bump pad 139a electrically contacts the first pad metal layer 135a exposed through the first opening 137a of the upper insulation layer 137, and the second bump pad 139b electrically contacts the second pad metal layer 135b exposed through the second opening 137b. In addition, the first bump pad 139a and the second bump pad 139b are connected to the third pad metal layers 135c through the third openings 137c of the upper insulation layer 137. As shown in FIG. 14, the first bump pad 139a covers and seals each of the first openings 137a of the upper insulation layer 137, and the second bump pad 139b covers and seals each of the second openings 137b of the upper insulation layer 137. Further, the first and second bump pads 139a and 139b cover and seal each of the third openings 137c of the upper insulation layer 137. Accordingly, the third openings 137c of the upper insulation layer 137 are disposed within a lower region of the first bump pad 139a or a lower region of the second bump pad 139b.

The first bump pad 139a or the second bump pad 139b may cover an upper region of the third pad metal layer 135c for the third pad metal layer 135c to be disposed within the lower region of the first bump pad 139a or the second bump pad 139b. However, the inventive concepts are not limited thereto, and in some exemplary embodiments, a portion of the third pad metal layer 135c may be disposed outside of the lower regions of the first bump pad 139a and the second bump pad 139b.

The first bump pad 139a and the second bump pad 139b are portions of the light emitting diode bonded to a submount or a printed circuit board, and are formed of a material suitable for bonding. For example, the first and second bump pads 139a and 139b may include an Au layer or an AuSn layer.

According to the illustrated exemplary embodiment, the third pad metal layer 135c (e.g., the heat dissipation pad), which may not contribute to electrical connection, is disposed between the first and second bump pads 139a and 139b and the light emitting cells C1 to C7, and connected to the first bump pad 139a or the second bump pad 139b, so as to improve heat dissipation performance of the light emitting diode.

Although the light emitting diode having seven light emitting cells C1 to C7 has been described above according to an exemplary embodiments, however, the inventive concepts are not limited to a particular number of light emitting cells in the light emitting diode.

Hereinafter, a method of manufacturing the light emitting diode according to an exemplary embodiment will be described below.

FIGS. 17 to 22 are plan views and cross-sectional views illustrating a method of manufacturing the light emitting diode according to an exemplary embodiment. In each of the drawings, a cross-sectional view is taken along line A-A of corresponding plan view.

Figure 17A:
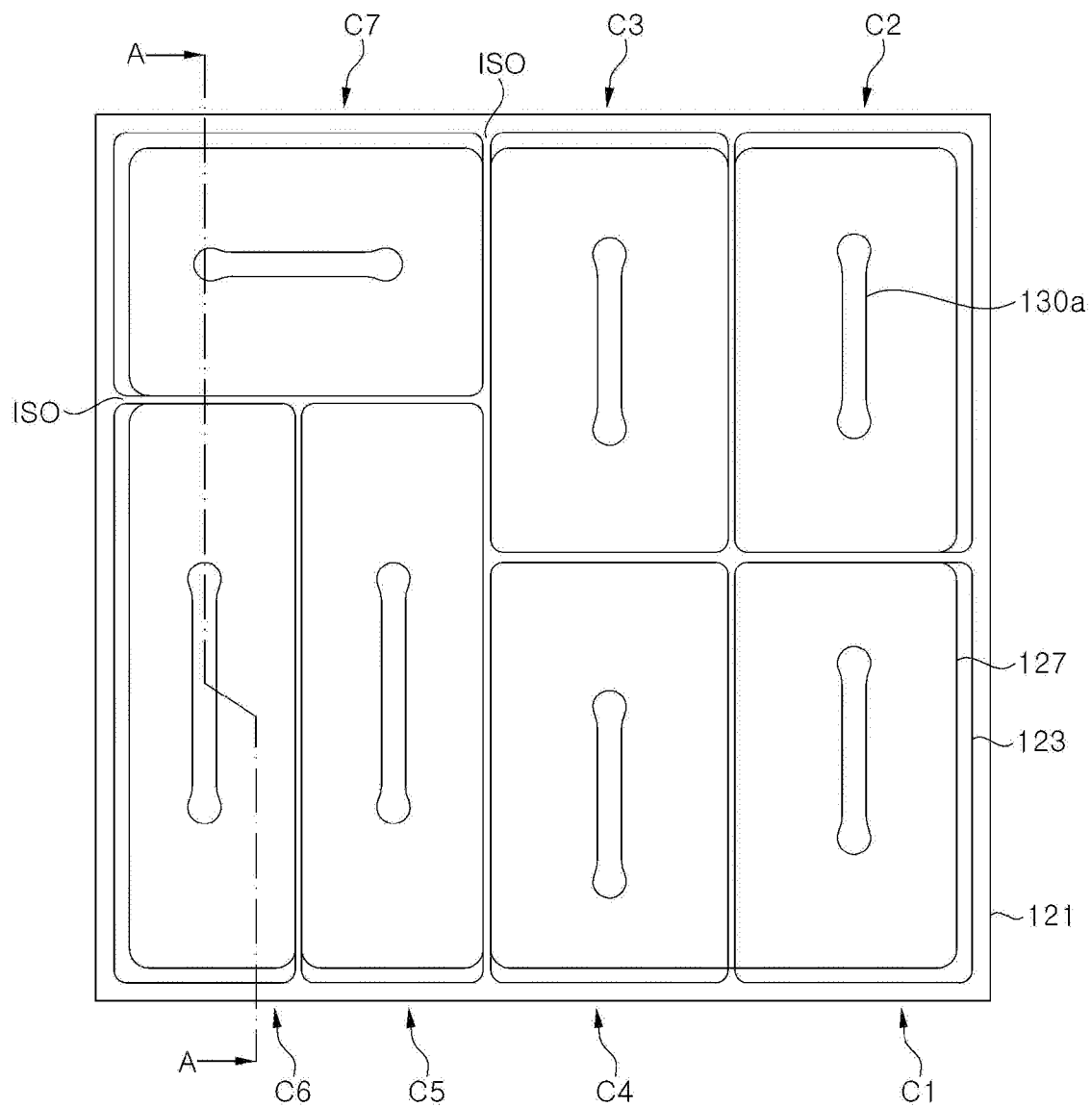
FIGS. 17A, 17B, 18A, 18B, 19A, 19B, 20A, 20B, 21A, 21B, 22A, and 22B are plan views and cross-sectional views illustrating a method of manufacturing the light emitting diode according to an exemplary embodiment.
Figure 17B:
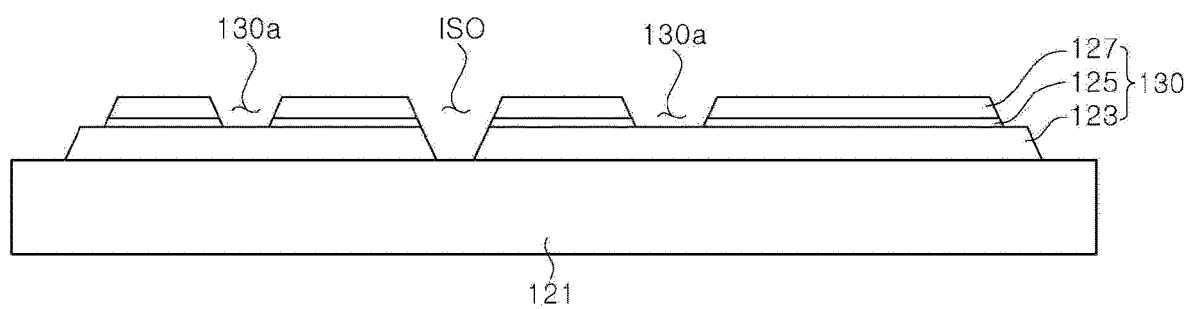

First, referring to FIGS. 17A and 17B, a semiconductor stack 130 including a first conductivity type semiconductor layer 123, an active layer 125, and a second conductivity type semiconductor layer 127 is grown on a substrate 121. The substrate 121 may be selected from any substrates capable of growing gallium nitride semiconductor layers thereon, and may include, for example, a sapphire substrate, a silicon carbide substrate, a gallium nitride (GaN) substrate, a spinel substrate, and the like. More particularly, the substrate may be a patterned substrate, such as a patterned sapphire substrate.

The first conductivity type semiconductor layer 123 may include, for example, an n-type gallium nitride layer, and the second conductivity type semiconductor layer 127 may include a p-type gallium nitride layer. In addition, the active layer 125 may have a single quantum well structure or a multiple-quantum well structure, and may include a well layer and a barrier layer. The composition of the well layer may be determined according to the wavelength of light to be emitted, and may include, for example, AlGaN, GaN, or InGaN.

Then, a plurality of light emitting cells C1 to C7 are formed by patterning the semiconductor stack 130. For example, an upper surface of the first conductivity type semiconductor layer 123 may be exposed by a mesa formation process, and the cell isolation region ISO may be formed by a cell separation process, such as photolithography and etching.

The light emitting cells C1 to C7 are separated from one another by the cell isolation region ISO and have via-holes 130a, respectively. As shown in FIG. 17B, sidewalls of the cell isolation region ISO and sidewalls of the via-holes 130a may be formed to be inclined.

An upper surface of the first conductivity type semiconductor layer 123 of each light emitting cell is exposed by the mesa etching process. The via-holes 130a may be formed together in the mesa etching process. The upper surface of the first conductivity type semiconductor layer 123 may be exposed in a substantially ring shape along peripheries of the second conductivity type semiconductor layer 127 and the active layer 125, but the inventive concepts are not limited thereto. As shown in FIGS. 17A and 17B, the upper surface of the first conductivity type semiconductor layer 123 may be exposed near edges of the light emitting cells C1 to C7 disposed near an edge of the substrate 121. However, the second conductivity type semiconductor layer 127, the active layer 125, and the first conductivity type semiconductor layer 123 may have continuously inclined surfaces near other edges of the first conductivity type semiconductor layer 123, and thus, the upper surface of the first conductivity type semiconductor layer 123 may not be exposed. In some exemplary embodiments, an isolated light emitting cell may be formed surrounded by the light emitting cells, where edges of the isolated light emitting cell are spaced apart from the edge of the substrate 121. In this case, the first conductivity type semiconductor layer 123 of the isolated light emitting cell may form the continuously inclined surface together with the second conductivity type semiconductor layer 127 and the active layer 125, and may not have the exposed surface near the edge thereof. However, the inventive concepts are not limited thereto, and the upper surface of the first conductivity type semiconductor layer 123 may be exposed at the edges of each light emitting cell.

As the plurality of light emitting cells C1 to C7 spaced apart from each other by the cell isolation region ISO is formed on the substrate 121, the substrate 121 has morphology with different elevation profiles thereon. For example, an upper surface of the second conductivity type semiconductor layer 127 of each of the light emitting cells has the greatest elevation, and the substrate 121 exposed through the cell isolation region ISO has the lowest elevation.

Figure 18A:
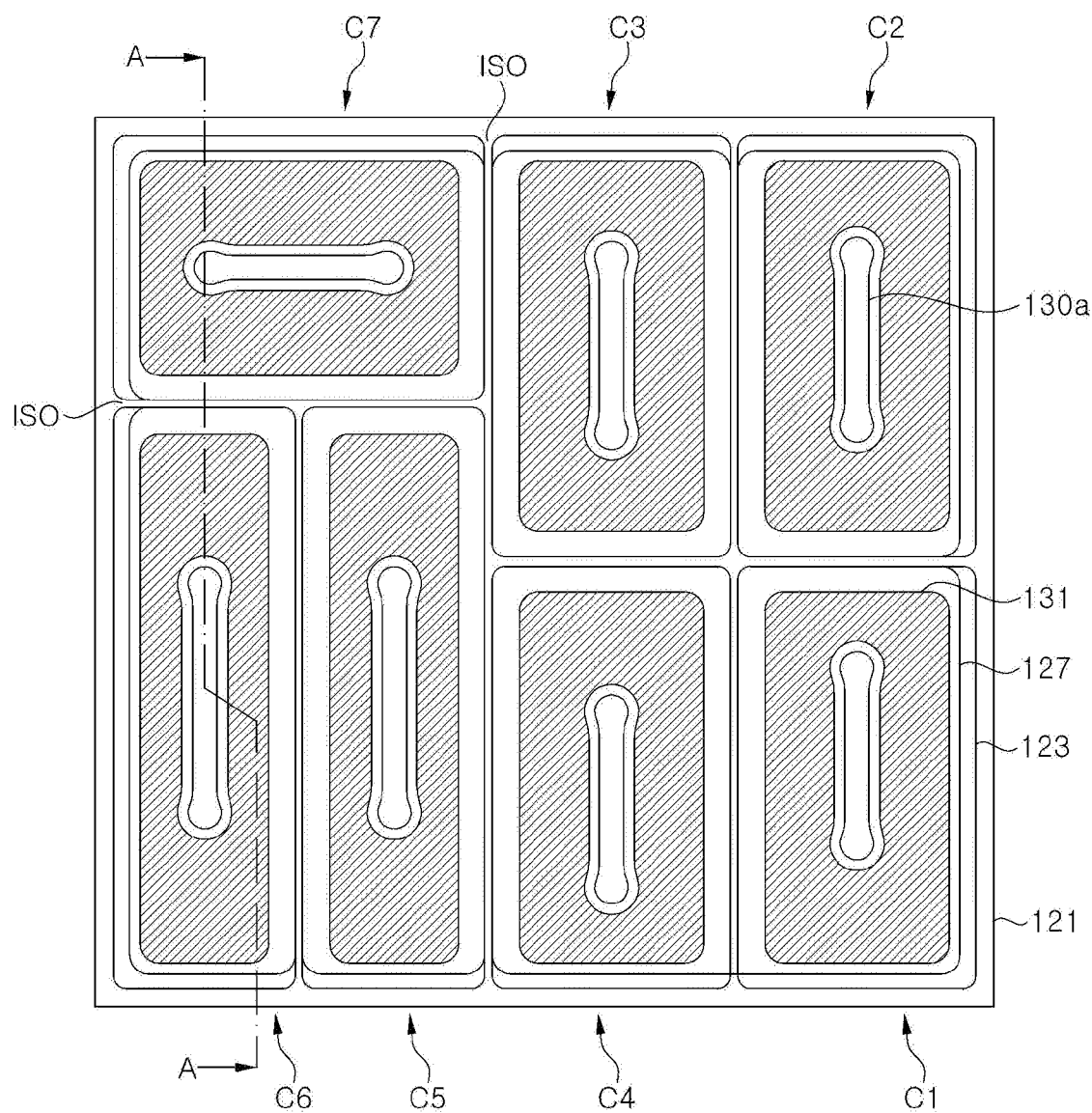
Figure 18B:
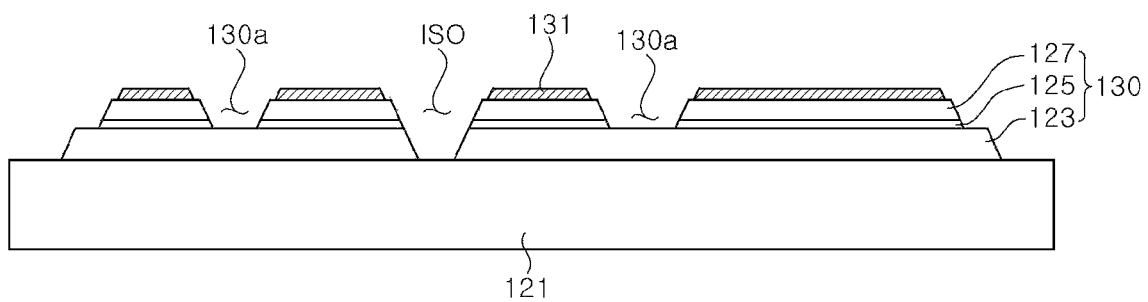

Referring to FIGS. 18A and 18B, ohmic reflection layers 131 are formed on the light emitting cells C1 to C7. The ohmic reflection layer 131 may be formed by, for example, a lift-off technique. The ohmic reflection layer 131 may have a single layer or a multiple layers structure, and may include, for example, an ohmic layer and a reflection layer. These layers may be formed by, for example, e-beam evaporation. Before formation of the ohmic reflection layer 131, a preliminary insulation layer having openings may be formed in regions, in which the ohmic reflection layer 131 will be formed.

Although the ohmic reflection layers 131 are described as being formed after the formation of the light emitting cells C1 to C7, however, the inventive concepts are not limited thereto. For example, the ohmic reflection layers 131 may be formed first, and then the light emitting cells C1 to C7 may be formed. Further, after a metal layer for the ohmic reflection layer 131 is deposited on the semiconductor stack 130, the ohmic reflection layers 131 and the light emitting cells C1 to C7 may be formed at the same time by patterning the metal layer and the semiconductor stack 130 at the same time.

Figure 19A:
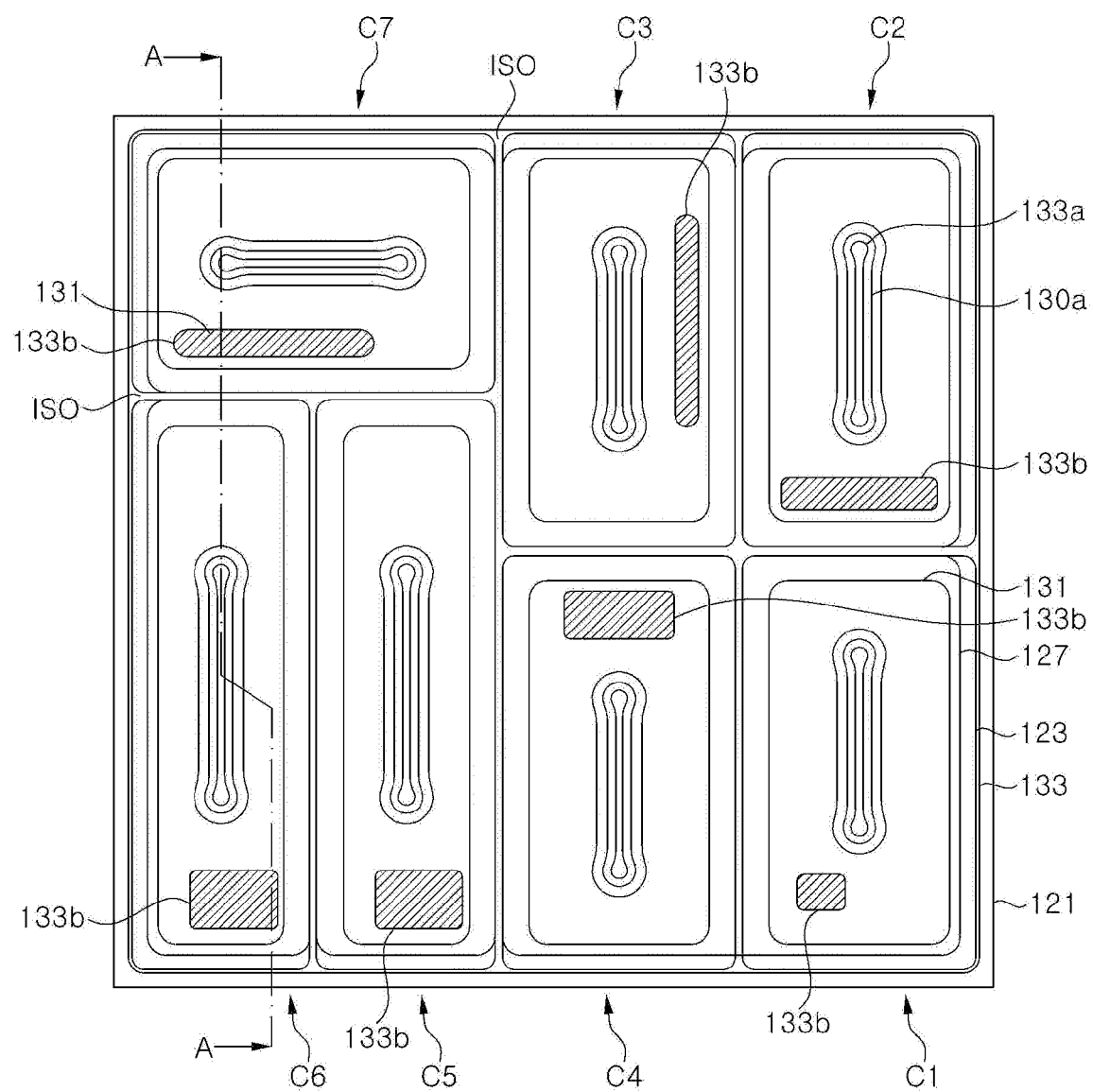
Figure 19B:
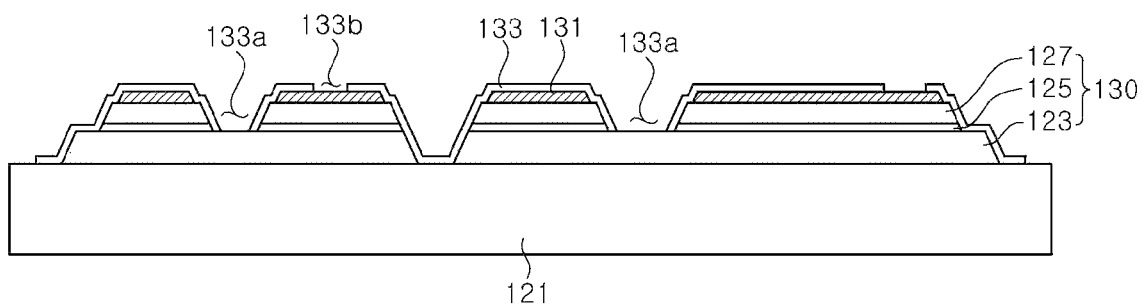

Referring to FIGS. 19A and 19B, a lower insulation layer 133 is formed to cover the ohmic reflection layers 131 and the light emitting cells C1 to C7. The lower insulation layer 133 may include an oxide layer, such as $SiO_2$, a nitride layer, such as $SiN_x$, or an insulation layer, such as $MgF_2$ by chemical vapor deposition (CVD) or the like. The lower insulation layer 133 may be formed of a single layer or multiple layers. Further, the lower insulation layer 133 may include a distributed Bragg reflector, in which high-refractive material layers and low-refractive material layers are alternately stacked one above another. For example, an insulation reflective layer having high reflectivity may be formed by laminating $SiO_2/TiO_2$ layers, $SiO_2/Nb_2O_5$ layers, $SiO_2/ZrO_2$ layers, or $MgF_2/TiO_2$ layers. The preliminary insulation layer described above may be integrated with the lower insulation layer 133. As such, the lower insulation layer 133 may have an uneven thickness due to the preliminary insulation layer formed around the ohmic reflection layer 131. More particularly, a portion of the lower insulation layer 133 on the ohmic reflection layer 131 may have a smaller thickness than a portion of the lower insulation layer 133 disposed around the ohmic reflection layer 131.

The lower insulation layer 133 may be patterned through photolithography and etching processes, for example. Accordingly, the lower insulation layer 133 has first openings 133a exposing the first conductivity type semiconductor layer 123 in the via-holes 130a, and second openings 133b exposing the ohmic reflection layer 131 on each of the light emitting cells. Further, the lower insulation layer 133 may expose the upper surface of the substrate 121 near the edge of the substrate 121.

Figure 20A:
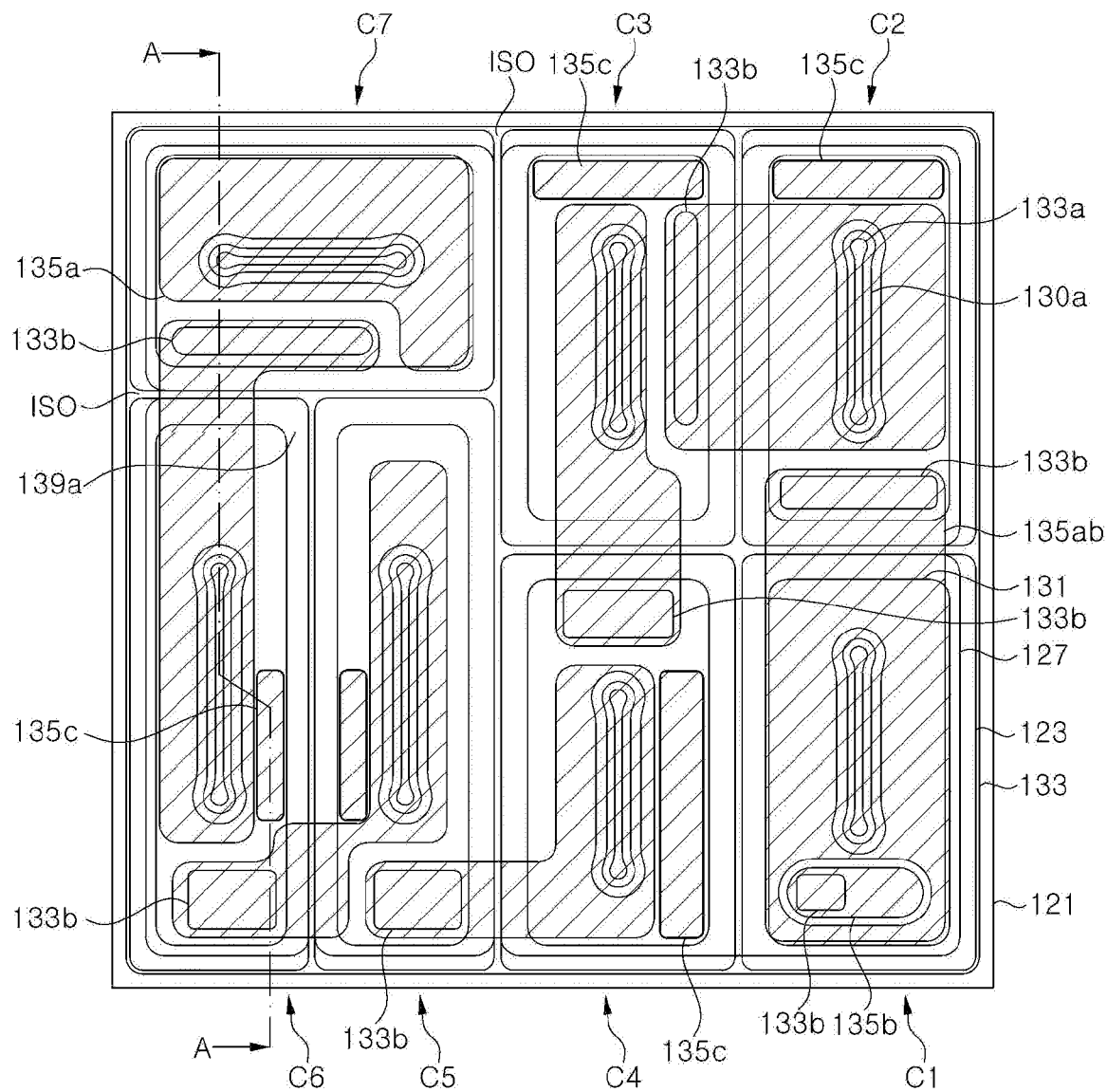
Figure 20B:
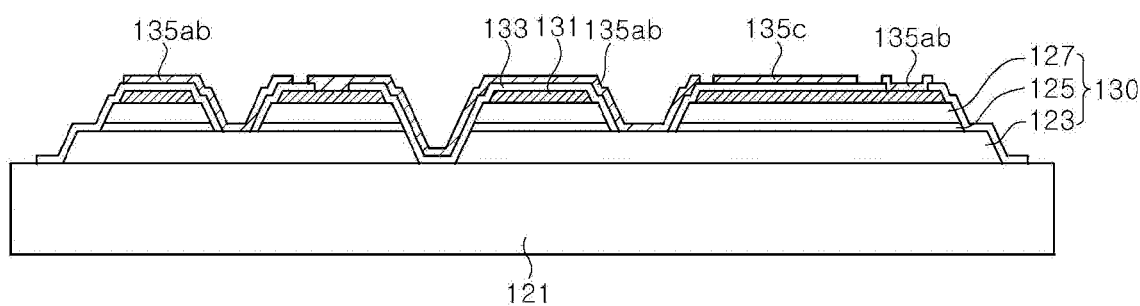

Referring to FIGS. 20A and 20B, a first pad metal layer 135a, a second pad metal layer 135b, a third pad metal layer 135c, and connectors 135ab are formed on the lower insulation layer 133.

The connectors 135ab electrically connect the first light emitting cell C1 to the seventh light emitting cell C7 to one another to form a series array of the light emitting cells C1 to C7. The first light emitting cell C1 is placed at the first terminal of the series array and the seventh light emitting cell C7 is placed at the last terminal of the series array.

In particular, each of the connectors 135ab electrically connects the first conductivity type semiconductor layer 123 of one light emitting cell to the second conductivity type semiconductor layer 127 of another light emitting cell adjacent thereto. The connectors 135ab may be electrically connected to the first conductivity type semiconductor layer 123 exposed in the via-holes 130a through the first openings 133a of the lower insulation layer 133, and may be electrically connected to the ohmic reflection layer 131 exposed through the second openings 133b of the lower insulation layer 133. Further, the connectors 135ab may directly connect the first conductivity type semiconductor layer 123 and the ohmic reflection layer 131.

The connectors 135ab may pass the cell isolation region ISO to connect adjacent light emitting cells to each other. As shown in FIG. 20A, each of the connectors 135ab may pass an upper region of only one edge among the edges of the first conductivity type semiconductor layer 123 of one light emitting cell, so as to reduce influence of the morphology on the substrate 121. In particular, when the first conductivity type semiconductor layer 123 of each of the light emitting cells has four edges, for example, the connector 135ab passes only one of these edges of the first conductivity type semiconductor layer 123. In this manner, the connectors 135ab may not unnecessarily pass the cell isolation region ISO in electrical connection, thereby preventing damage to the connectors 135ab due to the influence of the morphology. However, the inventive concepts are not limited thereto, and the shape of the connector 135ab may be variously modified.

The first pad metal layer 135a is disposed on the last light emitting cell C7 placed at the last terminal of the series array of light emitting cells, and the second pad metal layer 135b is disposed on the first light emitting cell C1 placed at the first terminal thereof. The first pad metal layer 135a may be disposed within an upper region of the second conductivity type semiconductor layer 127 of the last light emitting cell C7, and the second pad metal layer 135b may be disposed within an upper region of the first light emitting cell C1.

The first pad metal layer 135a is electrically connected to the first conductivity type semiconductor layer 123 through the first opening 133a of the lower insulation layer 133 on the last light emitting cell C7. The first pad metal layer 135a may directly contact the first conductivity type semiconductor layer 123. Accordingly, the first pad metal layer 135a may include an ohmic layer that forms ohmic contact with the first conductivity type semiconductor layer 123.

The second pad metal layer 135b is electrically connected to the ohmic reflection layer 131 through the second opening 133b of the lower insulation layer 133 on the first light emitting cell C1. The second pad metal layer 135b may directly contact the ohmic reflection layer 131. Further, as shown in FIG. 20A, the second pad metal layer 135b may be surrounded by the connector 135ab. Accordingly, a boundary region may be formed between the second pad metal layer 135b and the connector 135ab, and the lower insulation layer 133 may be exposed to the boundary region.

The third pad metal layers 135c are disposed on the light emitting cells C2 to C6. In the illustrated exemplary embodiment, the third pad metal layers 135c are disposed on the light emitting cells C2 to C6 on which the first and second pad metal layers 135a and 135b are not disposed. However, in another exemplary embodiment, the third pad metal layer 135c may also be disposed on the light emitting cells C7 and C1, on which the first and second pad metal layers 135a and 135b are disposed. The third pad metal layers 135c may be disposed within the upper region of the ohmic reflection layers 131 as shown in FIG. 20A. However, the third pad metal layers 135c are spaced apart from the ohmic reflection layer 131 by the lower insulation layer 133.

The first pad metal layer 135a, the second pad metal layer 135b, the third pad metal layer 135c, and the connectors 135ab may be formed of substantially the same material and be formed substantially simultaneously by the same process. For example, the first pad metal layer 135a, the second pad metal layer 135b, the third pad metal layer 135c, and the connectors 135ab may include Ti, Cr, or Ni as a bonding layer, and may further include Al as a metallic reflection layer. Furthermore, the first pad metal layer 135a, the second pad metal layer 135b, the third pad metal layer 135c, and the connectors 135ab may further include an anti-diffusion layer for preventing diffusion of a metallic element, such as Sn, and an anti-oxidation layer for preventing oxidation of the anti-diffusion layer. The anti-diffusion layer may include, for example, Cr, Ti, Ni, Mo, TiW or W, and the anti-oxidation layer may include Au.

In the illustrated exemplary embodiment, the first pad metal layer 135a, the second pad metal layer 135b, the third pad metal layer 135c, and the connectors 135ab may be formed at the same time by the same process, thereby simplifying the manufacturing process. However, the inventive concepts are not limited thereto, and in some exemplary embodiments, the third pad metal layer 135c may be formed on the lower insulation layer 133 by a separate process. In this case, the third pad metal layer 135c may not include a metal reflective layer.

Figure 21A:
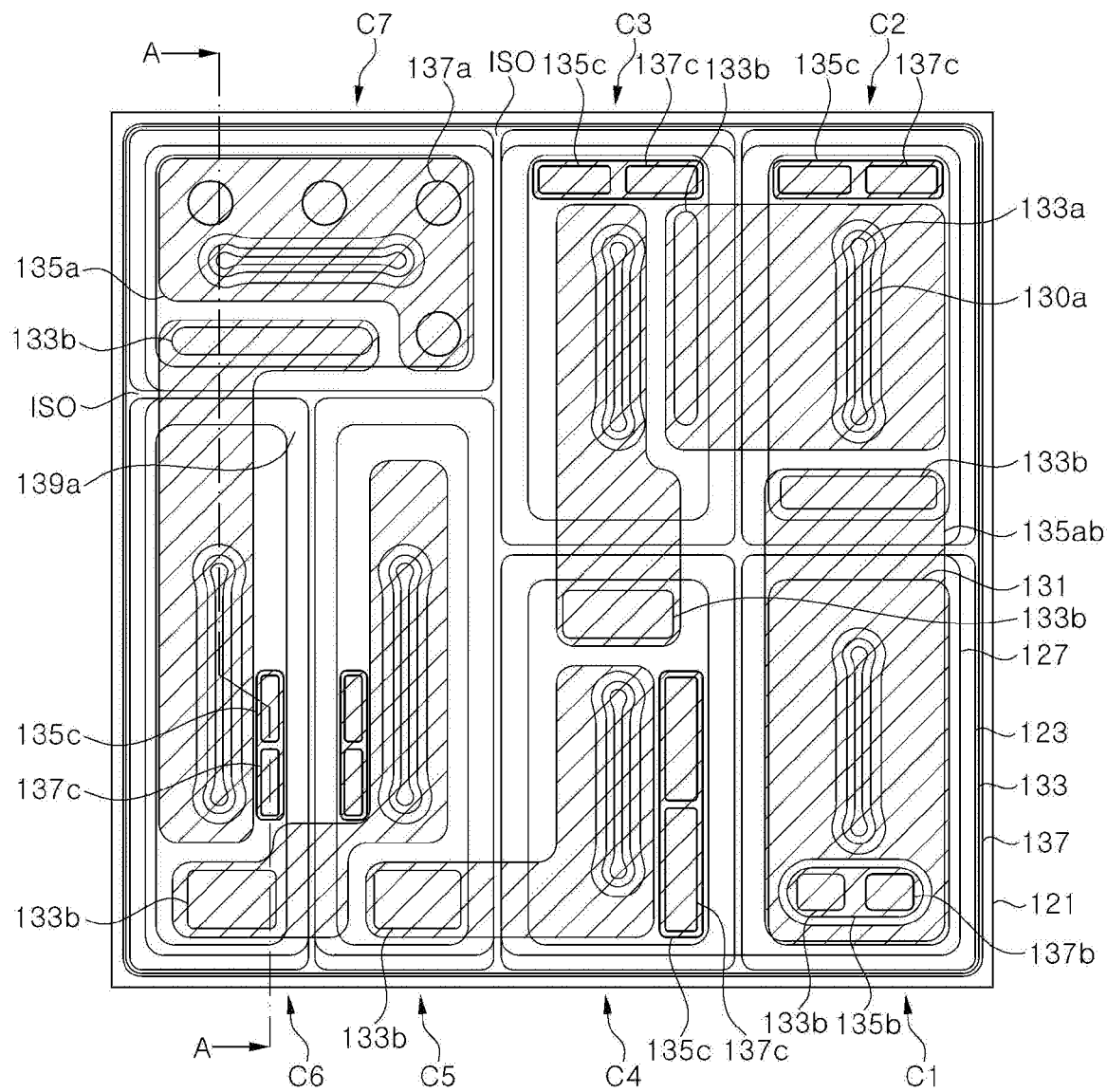
Figure 21B:
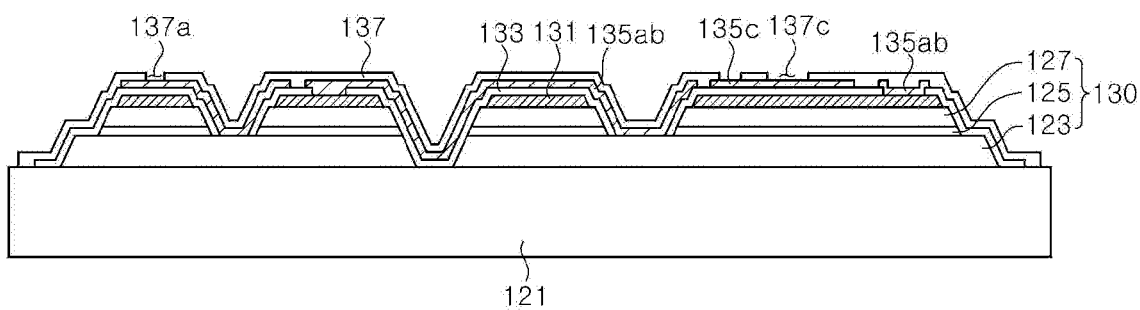

Referring to FIGS. 21A and 21B, an upper insulation layer 137 is formed to cover the first pad metal layer 135a, the second pad metal layer 135b, the third pad metal layer 135c, and the connectors 135ab. The upper insulation layer 137 includes openings 137a exposing the first pad metal layer 135a, openings 137b exposing the second pad metal layer 135b, and openings 137c exposing the third pad metal layer 135c. The openings 137a, 137b, and 137c may be disposed within upper regions of the first pad metal layer 135a, the second pad metal layer 135b, and the third pad metal layer 135c, respectively.

Although FIG. 21A shows a plurality of openings 137a, in some exemplary embodiments, a single opening 137a may be formed. In addition, although FIG. 21A shows a single opening 137b, in some exemplary embodiments, a plurality of openings 137b may be formed. Further, although FIG. 21A shows that each third pad metal layer 135c is being exposed by two openings 137c, however, in some exemplary embodiments, each third pad metal layer 135c may be exposed by one opening 137c or three or more openings 137c. Moreover, the number of openings 137c exposing each third pad metal layer 135c may be different from one another. For example, if the third pad metal layer 135c is relatively large, a greater number of openings 137c may be disposed thereon.

The opening 137b of the upper insulation layer 137 may be disposed to be spaced apart from the second opening 133b of the lower insulation layer 133 in the lateral direction. When the opening 137b of the upper insulation layer 137 is spaced apart from the second opening 133b of the lower insulation layer 133 and not overlap each other, the ohmic reflection layer 131 may be prevented from being contaminated by solders. Alternatively, the second opening 133b of the lower insulation layer 133 may overlap with the opening 137b of the upper insulation layer 137.

The upper insulation layer 137 may also cover the edge of the lower insulation layer 133 along the edge of the substrate 121, and may expose some region thereof near the edge of the substrate 121. The edge of the upper insulation layer 137 may be spaced apart from the connectors 135ab by a distance of at least 19 μm.

The upper insulation layer 137 may be formed of a silicon oxide layer or a silicon nitride layer, and may include a distributed Bragg reflector.

Figure 22A:
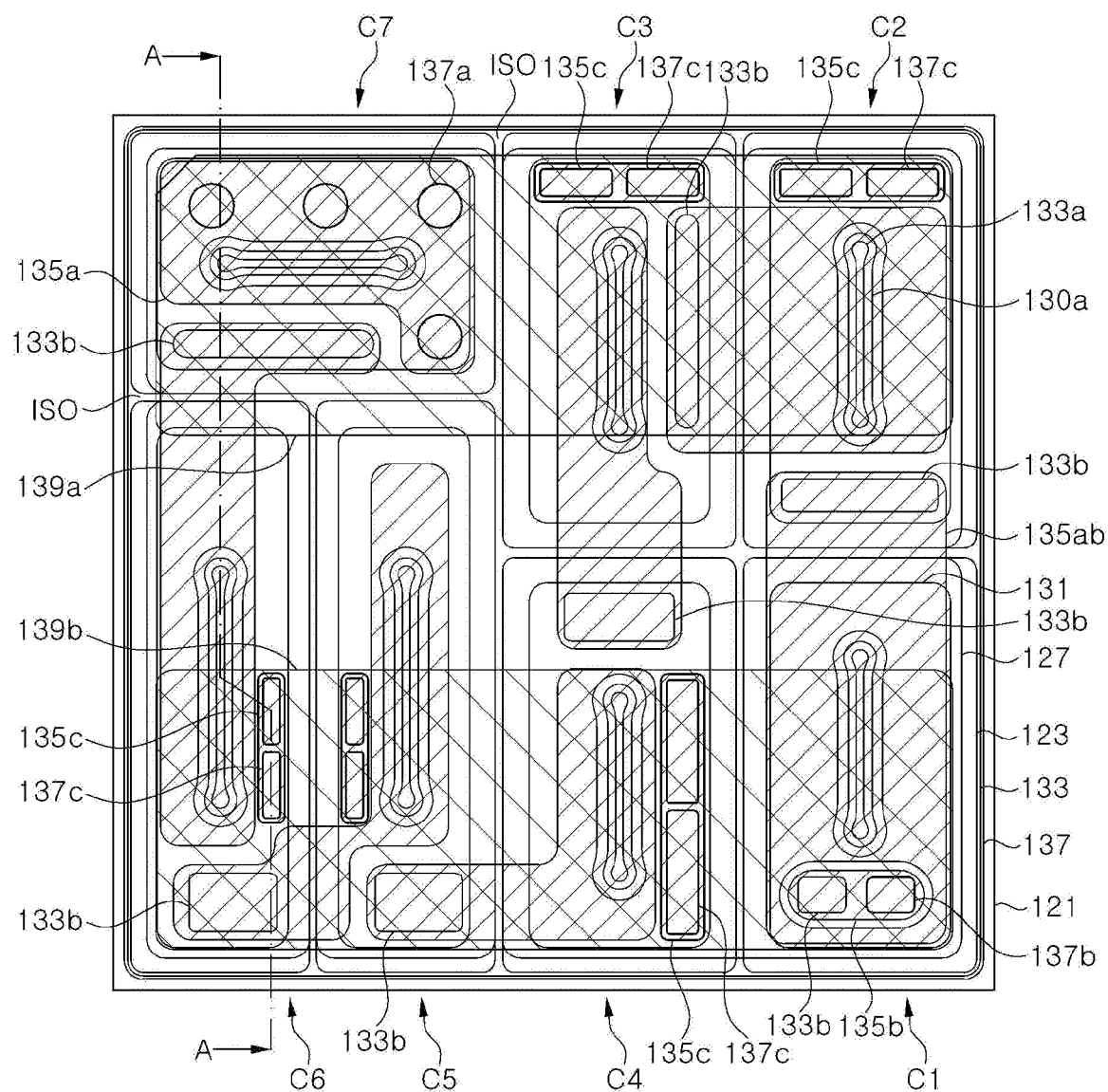
Figure 22B:
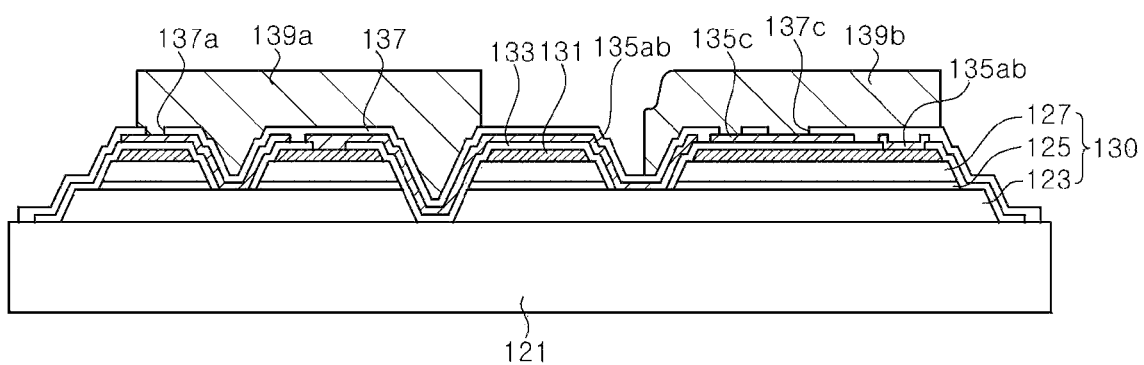

Referring to FIGS. 22A and 22B, a first bump pad 139a and a second bump pad 139b are formed on the upper insulation layer 137.

The first bump pad 139a is electrically connected to the first pad metal layer 135a through the opening 137a of the upper insulation layer 137, and the second bump pad 139b is electrically connected to the second pad metal layer 135b through the opening 137b of the upper insulation layer 137. Further, each of the first bump pad 139a and the second bump pad 139b is connected to the third pad metal layers 135c through the openings 137c of the upper insulation layer 137.

As shown in FIG. 22A, the first and second bump pads 139a and 139b are formed over the plurality of light emitting cells. The upper insulation layer 137 may prevent an electrical short circuit between the light emitting cells and the first and second bump pads 139a and 139b.

Since the third pad metal layer 135c is electrically insulated from the ohmic reflection layer 131 by the lower insulation layer 133, the electric short-circuit may not occur even when the first and second bump pads 139a and 139b are electrically connected to the third pad metal layer 135c.

After the first and second bump pads 139a and 139b are formed, a thickness of the substrate 121 may be reduced by partially removing a lower surface of the substrate 121 through grinding and/or lapping. Thereafter, the substrate 121 is divided into individual chip units, thereby providing light emitting diodes separated from each other. In this case, the substrate 121 may be divided by laser scribing.

According to an exemplary embodiment, in addition to a heat path formed through the first and second bump pads 139a and 139b via the first pad metal layer 135a and the second pad metal layer 135b, an additional heat path through the first and second bump pads 139a and 139b may be formed via the third pad metal layers 135c. In particular, by disposing the third pad metal layers 135c in the light emitting cells C2 to C6 to which the first pad metal layer 135a and the second pad metal layer 135b are not connected, the heat dissipation performance of these light emitting cells C2 to C6 may be improved.

FIGS. 23 to 26 are schematic plan views of a light emitting diode according to exemplary embodiments. Hereinafter, differences of a light emitting diode according to exemplary embodiments will be mainly described with respect to the light emitting diode shown in FIG. 14, and thus, repeated descriptions to the substantially same elements will be briefly described or omitted to avoid redundancy.

Figure 23:
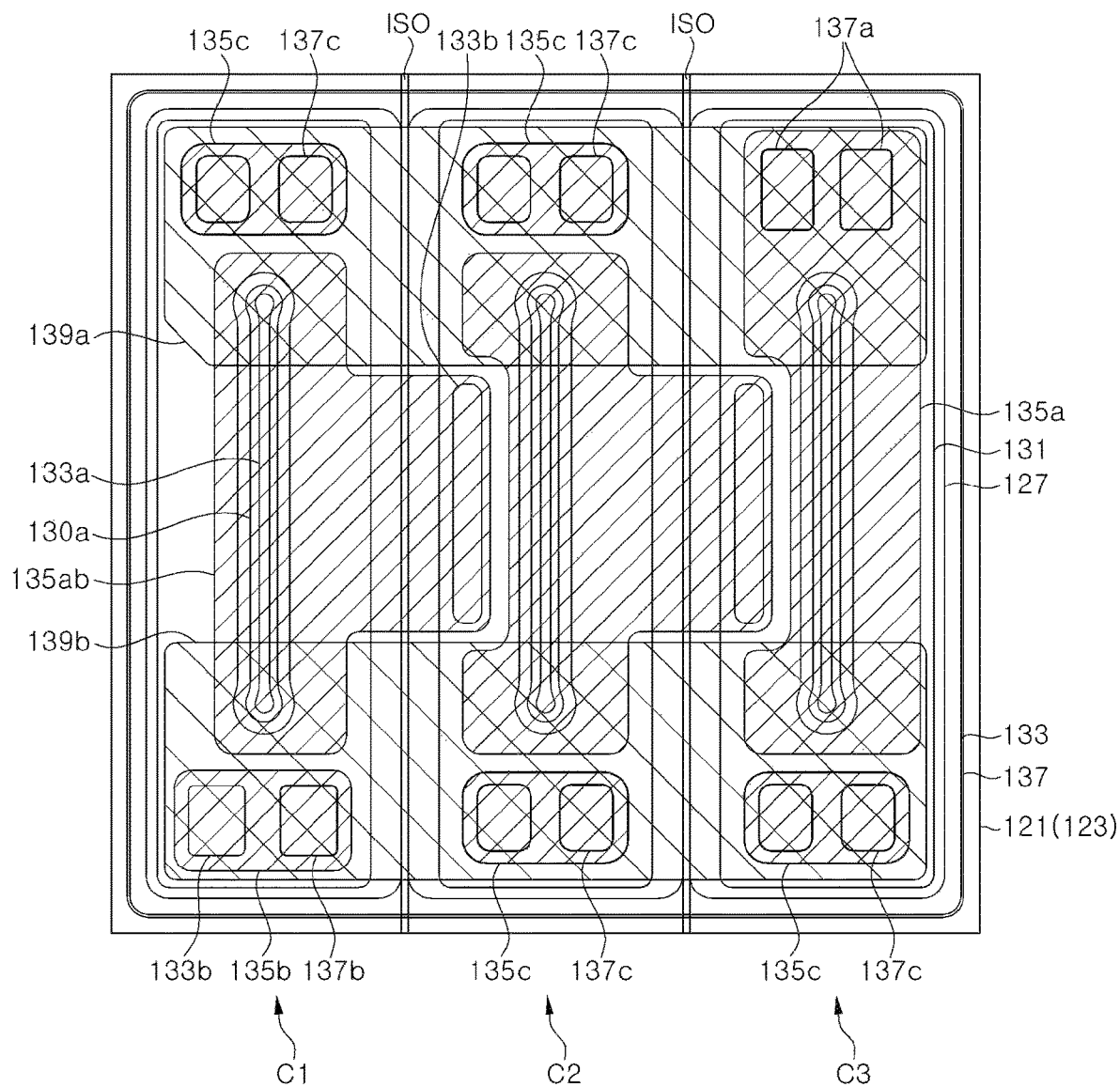
FIGS. 23, 24, 25, and 26 are schematic plan views of a light emitting diode according to exemplary embodiments.

Referring to FIG. 23, the light emitting diode according to the illustrated exemplary embodiment includes three light emitting cells C1, C2, and C3 disposed on the substrate 121, and the light emitting cells are connected in series by the connectors 135ab. The light emitting cells C1, C2, and C3 are separated from each other by the cell isolation region ISO. Although the upper surface of the substrate 121 is exposed to the periphery of the light emitting cells along the edge of the substrate 121 in the previously described light emitting diode, according to the illustrated exemplary embodiment, edges of the substrate 121 are covered with the first conductivity type semiconductor layer 123. However, the inventive concepts are not limited thereto, and in some exemplary embodiments, the upper surface of the substrate 121 may be exposed along the edge thereof.

The lower insulation layer 133 covers most of the light emitting cells C1 to C3 and covers the cell isolation region ISO. However, the lower insulation layer 133 has the openings 133a in the via-holes 130a of each of light emitting cells C1 to C3. In addition, the lower insulation layer 133 has the opening 133b exposing the ohmic reflection layer 131 on the first light emitting cell C1. Moreover, the first conductivity type semiconductor layer 123 near the edge of the substrate 121 may be exposed to the outside of the lower insulation layer 133.

The first pad metal layer 135a is disposed on the third light emitting cell C3, and electrically connected to the first conductivity type semiconductor layer 123 of the third light emitting cell C3 through the first opening 133a of the lower insulation layer 133.

The second pad metal layer 135b is disposed on the first light emitting cell C1, and is electrically connected to the ohmic reflection layer 131 through the opening 133b of the lower insulation layer 133.

The third pad metal layers 135c are disposed over each of the light emitting cells C1 to C3. In the illustrated exemplary embodiment, one third pad metal layer 135c is disposed around the connector 135ab over the first light emitting cell C1, two third pad metal layers 135c are disposed near both side edges of the second light emitting cell C2 over the second light emitting cell C2, and one third pad metal layer 135c is disposed over the third light emitting cell C3. The third pad metal layer 135c over the first light emitting cell C1 may be disposed on the opposite side of the second pad metal layer 135b.

The upper insulation layer 137 covers the first to third pad metal layers 135a, 135b, and 135c, and the connectors 135ab, and covers the edge of the lower insulation layer 133. The lower insulation layer 133 includes first openings 137a exposing the first pad metal layer 135a, a second opening 137b exposing the second pad metal layer 135b, and third openings 137c exposing the third pad metal layers 135c.

Each of the first bump pad 139a and the second bump pad 139b is disposed over each of the light emitting cells C1, C2, and C3. The first bump pad 139a is connected to the first pad metal layer 135a through the first openings 137a of the upper insulation layer 137, and connected to the third pad metal layers 135c through the third openings 137c. Moreover, the second bump pad 139b is connected to the second pad metal layer 135b through the second opening 137b of the upper insulation layer 137, and connected to the third pad metal layers 135c through the third openings 137c.

Figure 24:
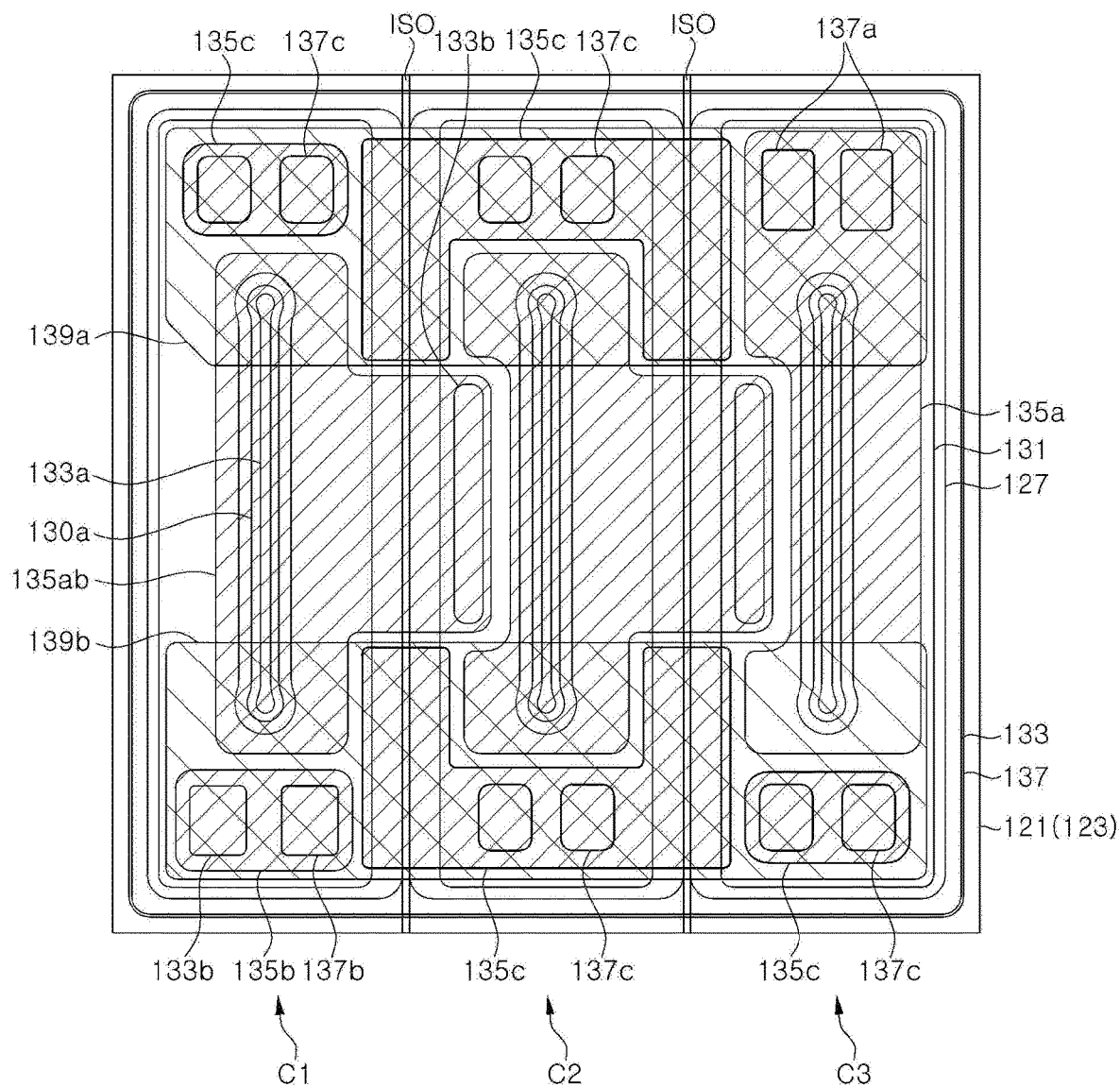

FIG. 24 is a schematic plan view of a light emitting diode according to another exemplary embodiment.

Referring to FIG. 24, the light emitting diode according to the illustrated exemplary embodiment is generally similar to the light emitting diode described with reference to FIG. 23, except for a shape of the third pad metal layer 135*c* on the second light emitting cell C2. In particular, the third pad metal layer 135*c* extends to the upper regions of adjacent light emitting cells across the cell isolation regions ISOs, e.g., upper regions of the first light emitting cell C1 and the third light emitting cell C3. In the illustrated exemplary embodiment, the third pad metal layer 135*c* on the first light emitting cell C1 and the third pad metal layer 135*c* on the second light emitting cell C2 are spaced apart from each other, and the third pad metal layer 135*c* on the third light emitting cell C3 and the third pad metal layer 135*c* on the second light emitting cell C2 are spaced apart from each other. However, the third pad metal layers 135*c* may be connected to each other in some exemplary embodiments.

At least some portions of the third pad metal layers 135*c* may be disposed outside of the upper region of the ohmic reflection layer 131, and may be disposed within the cell isolation region ISO at both sides of the connector 135*ab*. Accordingly, light traveling to the cell isolation region ISO may be reflected, thereby improving the light extraction efficiency.

Figure 25:
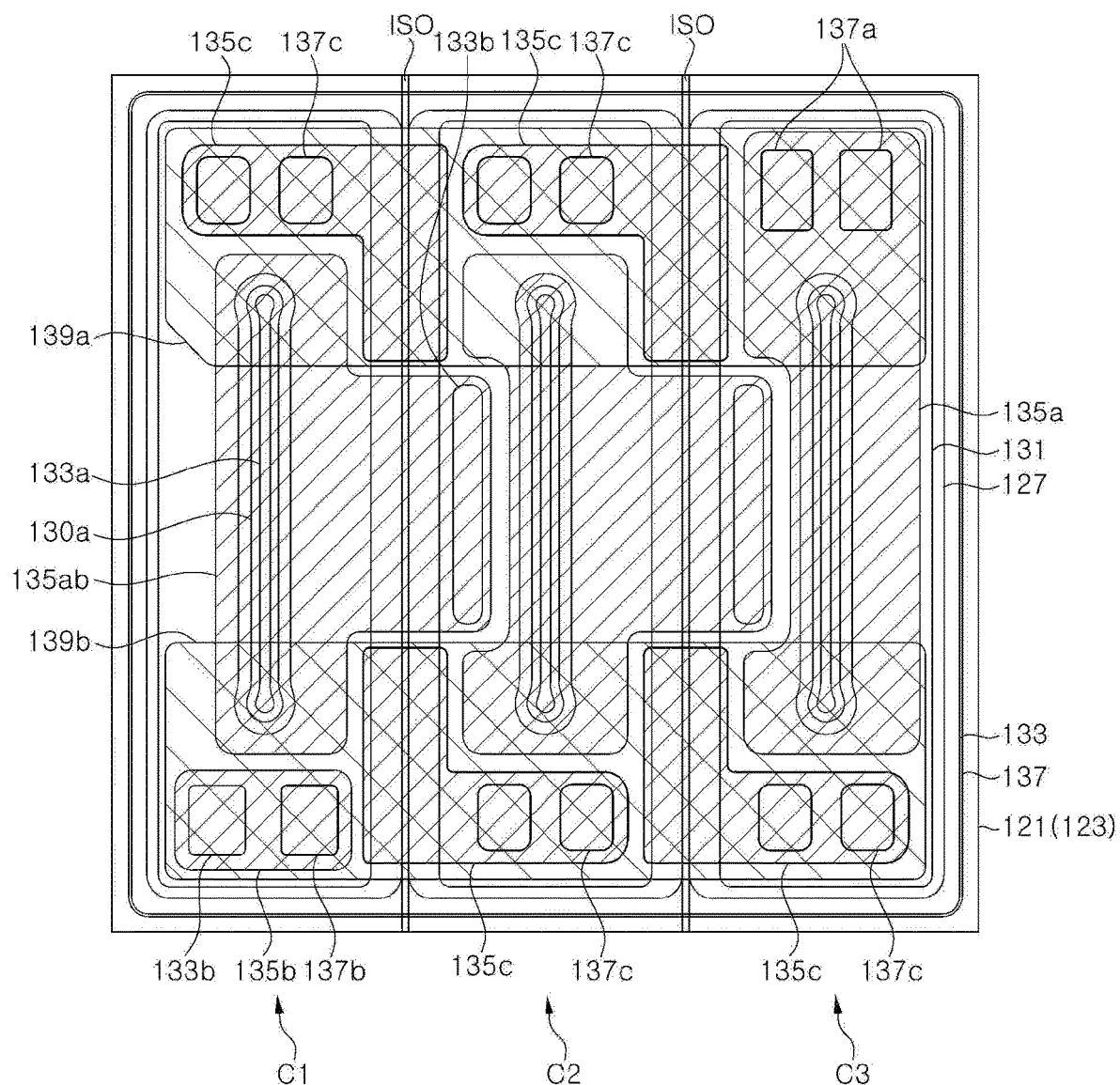

FIG. 25 is a schematic plan view of a light emitting diode according to another exemplary embodiment.

Referring to FIG. 25, the light emitting diode according to the illustrated exemplary embodiment is generally similar to the light emitting diode described with reference to FIG. 23, except for a shape of the third pad metal layers 135*c*. In particular, each of the third pad metal layers 135*c* is disposed over adjacent light emitting cells. The third pad metal layers 135*c* are disposed on both sides of the connector 135*ab* in the cell isolation region ISO to cover a large area of the cell isolation region ISO. In this manner, light traveling to the cell isolation region ISO may be reflected, thereby improving the light extraction efficiency.

Figure 26:
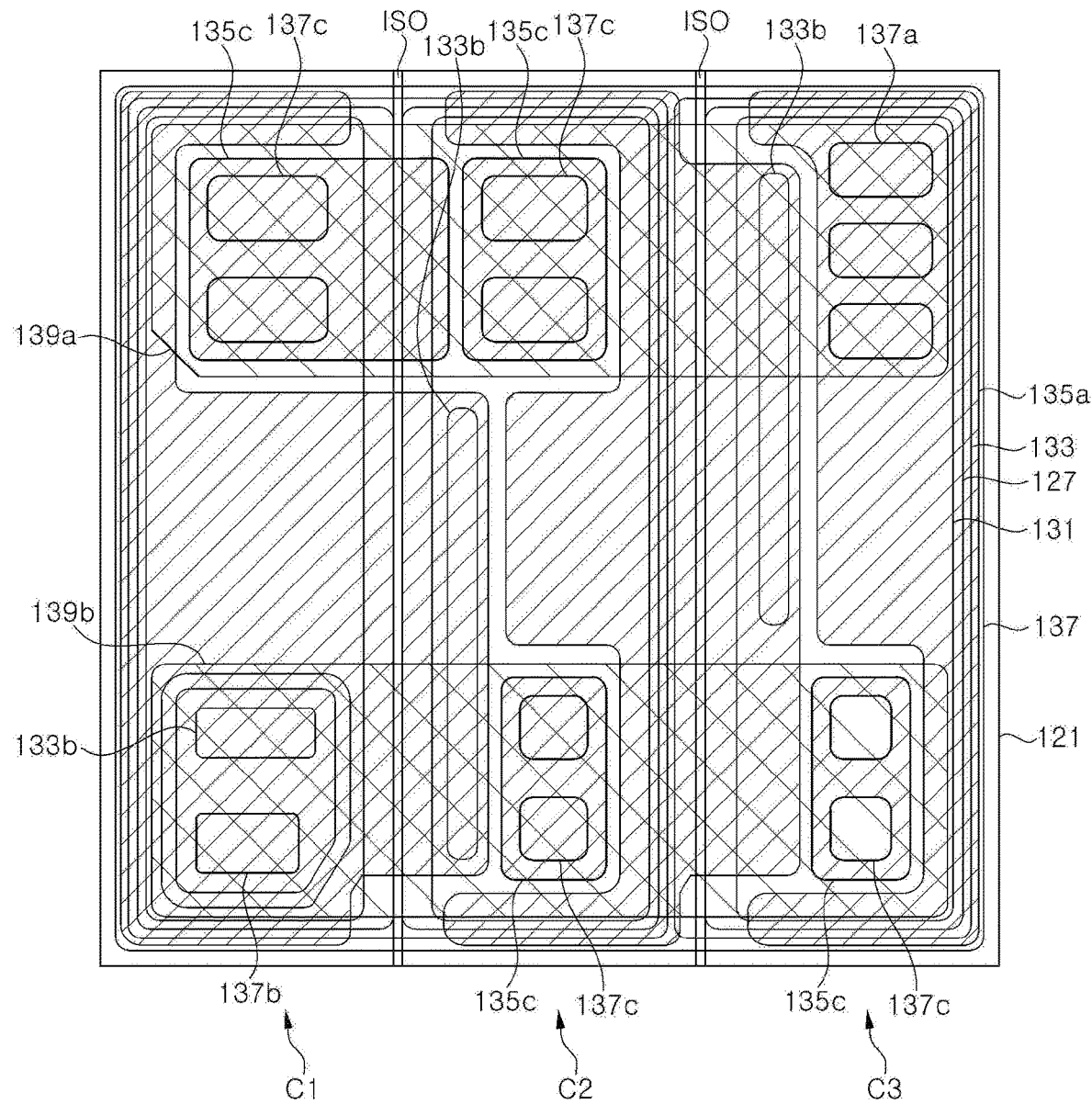

FIG. 26 is a schematic plan view of a light emitting diode according to another exemplary embodiment.

Referring to FIG. 26, the light emitting diode according to the illustrated exemplary embodiment is generally similar to the light emitting diode described with reference to FIG. 24, except that the first pad metal layer 135*a* and the connectors 135*ab* are electrically connected to the first conductivity type semiconductor layer 123 exposed to the outside of the mesa M, rather than being electrically connected to the first conductivity type semiconductor layer 123 through the via-holes 130*a* of the light emitting cells C1, C2, and C3.

The first pad metal layer 135*a* is connected to the first conductivity type semiconductor layer 123 exposed around the second conductivity type semiconductor layer 127 of the third light emitting cell C3, and the connectors 135*ab* are connected to the first conductivity type semiconductor layer 123 exposed around the second conductivity type semiconductor layers 127 of the first and second light emitting cells C1 and C2.

The third pad metal layer 135*c* is disposed on each of the light emitting cells C1, C2, and C3, and at least one third pad metal layer 135*c* may be disposed over two light emitting cells across the cell isolation region ISO. In the illustrated exemplary embodiment, the adjacent third pad metal layers 135*c* are illustrated as being spaced apart from each other, however, in some exemplary embodiments, the adjacent third pad metal layers 135*c* may be connected to each other.

In this manner, an area of the third pad metal layer 135*c* may be increased to improve heat dissipation efficiency.

Figure 27:
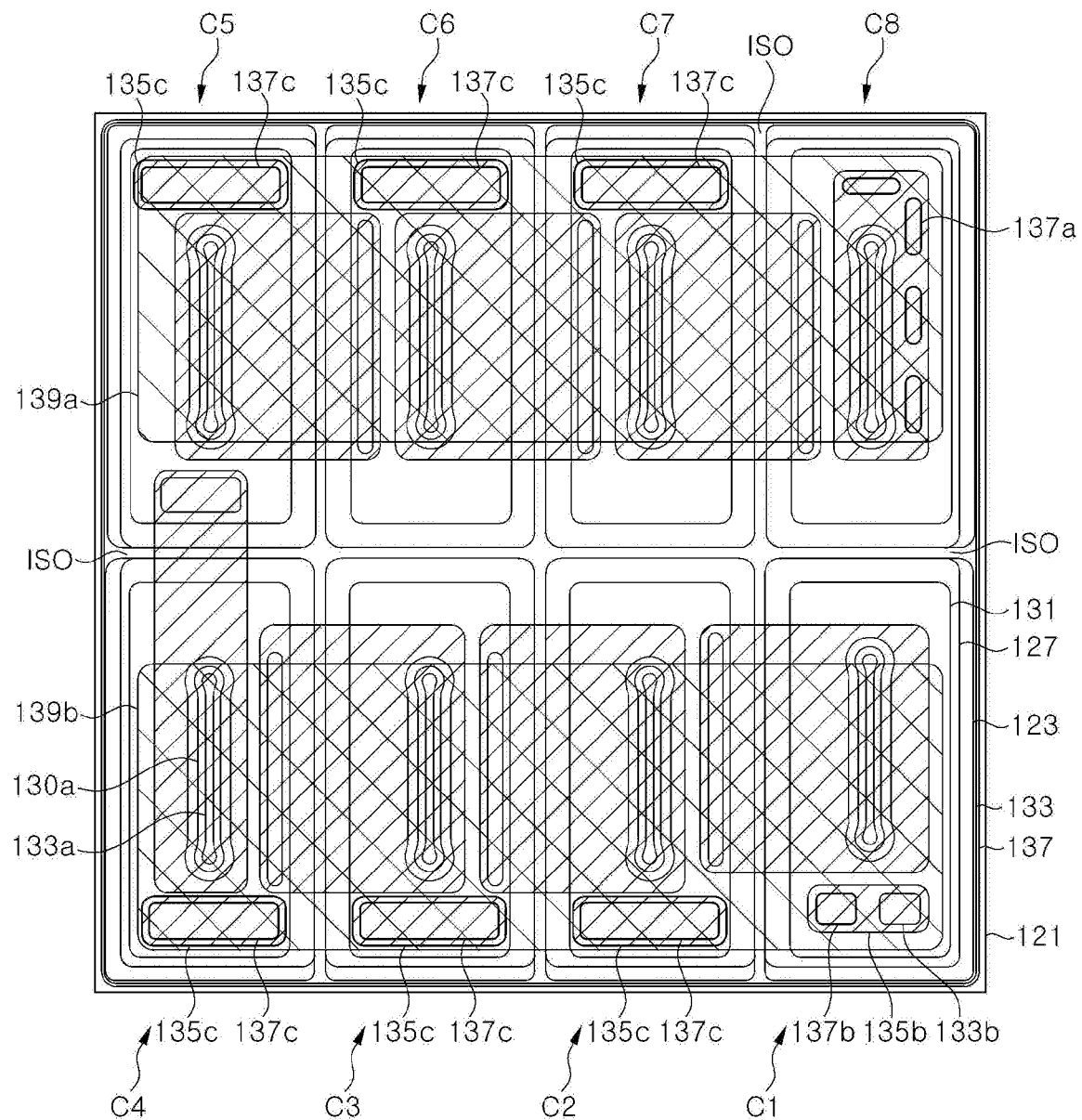
FIG. 27 is a schematic plan view of a light emitting diode according to another exemplary embodiment.

FIG. 27 is schematic plan view of a light emitting diode according to another exemplary embodiment.

Referring to FIG. 27, the light emitting diode according to the illustrated exemplary embodiment is generally similar to the light emitting diode described with reference to FIG. 14 or to FIG. 23, except that the light emitting diode includes eight light emitting cells C1 to C8, and the light emitting cells C1 to C8 are arranged in a matrix of 4×2. In particular, four light emitting cells C1 to C4 are arranged in a lower row, and four light emitting cells C5 to C8 are arranged again in an upper row. The light emitting cells C1 to C8 are connected to one another in series by the connectors 135*ab*.

The first bump pad 139*a* is disposed over the light emitting cells C5 to C8 in the upper row, and the second bump pad 139*b* is disposed over the light emitting cells C1 to C4 in the lower row. The first bump pad 139*a* is connected to the first pad metal layer 135*a* through the first opening 137*a* of the upper insulation layer 137 in the upper region of the eighth light emitting cell C8 at the last terminal of the series array of light emitting cells. The second bump pad 139*b* is connected to the second pad metal layer 135*b* through the second opening 137*b* of the upper insulation layer 137 in the upper region of the first light emitting cell C1 placed at the first terminal of the series array of light emitting cells.

The third pad metal layer 135*c* is disposed over each of the second to seventh light emitting cells C2 to C7, and the first and second bump pads 139*a* and 139*b* are connected to the third pad metal layers 135*c* through the third openings 137*c* of the upper insulation layer 137.

Accordingly, heat generated in the first light emitting cell C1 may be transferred to the second bump pad 139*b* through the second pad metal layer 135*b*, and heat generated in the eighth light emitting cell C8 may be transferred to the first bump pad 139*a* through the first pad metal layer 135*a* and be dissipated. In addition, heat generated in the second to seventh light emitting cells C2 to C7 may be transferred to the first or second bump pads 139*a* or 139*b* through the connectors 135*ab* via the upper insulation layer 137 and be dissipated, and heat may also be transferred to the first or second bump pads 139*a* or 139*b* through the third pad metal layer 135*c* via the ohmic reflection layer 131 and the lower insulation layer 133 and be dissipated.

As such, the heat dissipation performance of the light emitting diode is improved by the third pad metal layers 135*c*.

Figure 28:
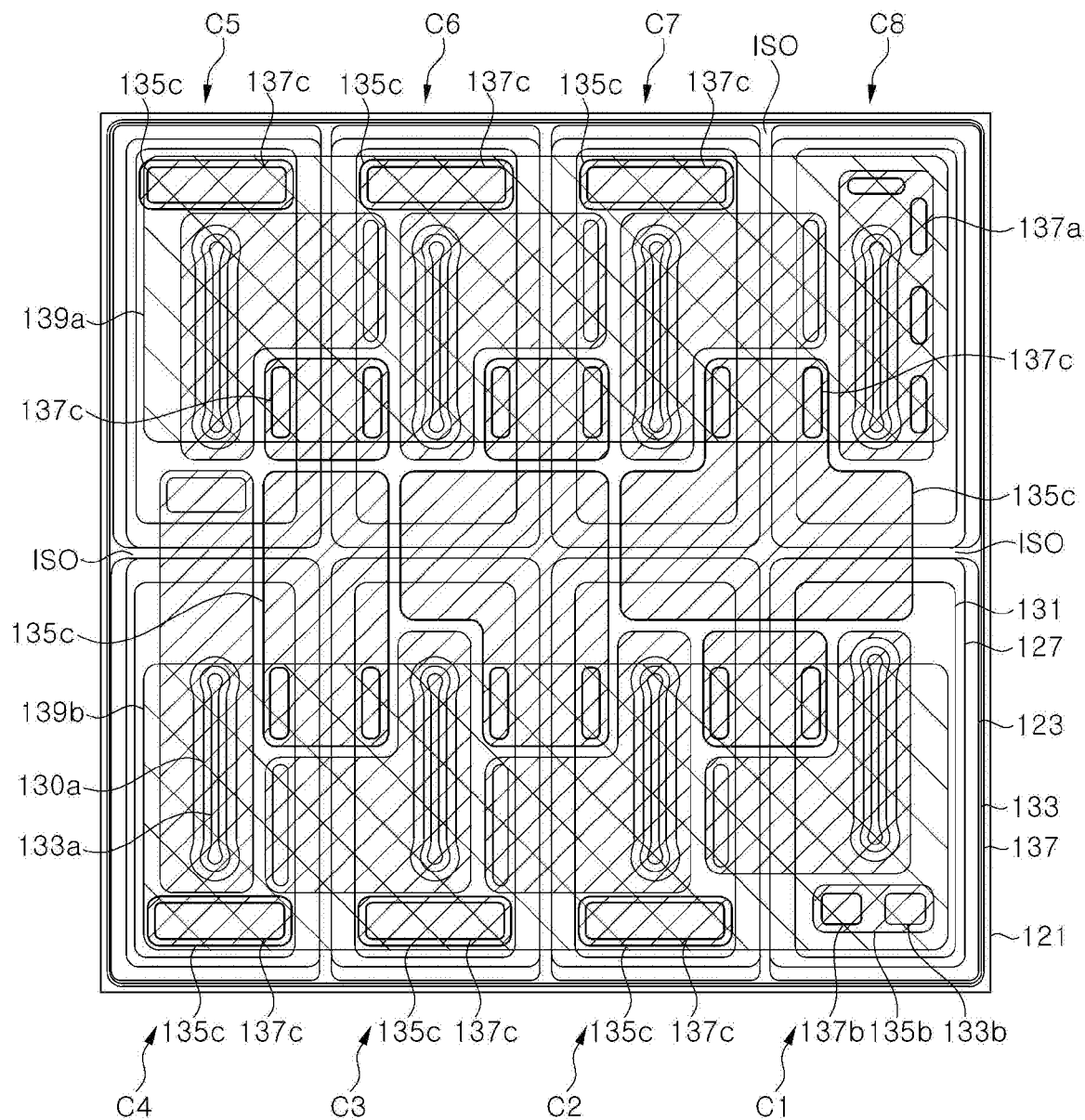
FIG. 28 is a schematic plan view of a light emitting diode according to another exemplary embodiment.

FIG. 28 is schematic plan view of a light emitting diode according to another exemplary embodiment.

Referring to FIG. 28, the light emitting diode according to the exemplary embodiment is generally similar to the light emitting diode described with reference to FIG. 27, except for arrangements and shapes of the first pad metal layer 135*a*, the connectors 135*ab*, and the third pad metal layer 135*c*.

More particularly, the third pad metal layers 135*c* are further disposed between the first to fourth light emitting cells C1 to C4 and the fifth to eighth light emitting cells C5 to C8, and thus, the shapes of the first pad metal layer 135*a* and the connectors 135*ab* are changed as the third pad metal layers 135*c* are added. The shape of the second pad metal layer 135*b* may also be changed.

As the third pad metal layers 135*c* are added, at least two heat dissipation passages may be formed on each light emitting cell. In addition, a portion of the third pad metal layers 135*c* is disposed within the upper region of the light emitting cell, and the remaining portion of third pad metal layers 135*c* are disposed over a plurality of light emitting cells across the cell isolation region ISO.

Moreover, some of the third pad metal layers 135*c* are not limited to the lower region of the first bump pad 139*a* or the second bump pad 139b, but may extend to the outside of the lower regions of the first and second bump pads 139a and 139b.

Accordingly, the heat dissipation efficiency may be improved, and light traveling to the cell isolation region ISO may be reflected, thereby improving the light extraction efficiency.

Figure 29:
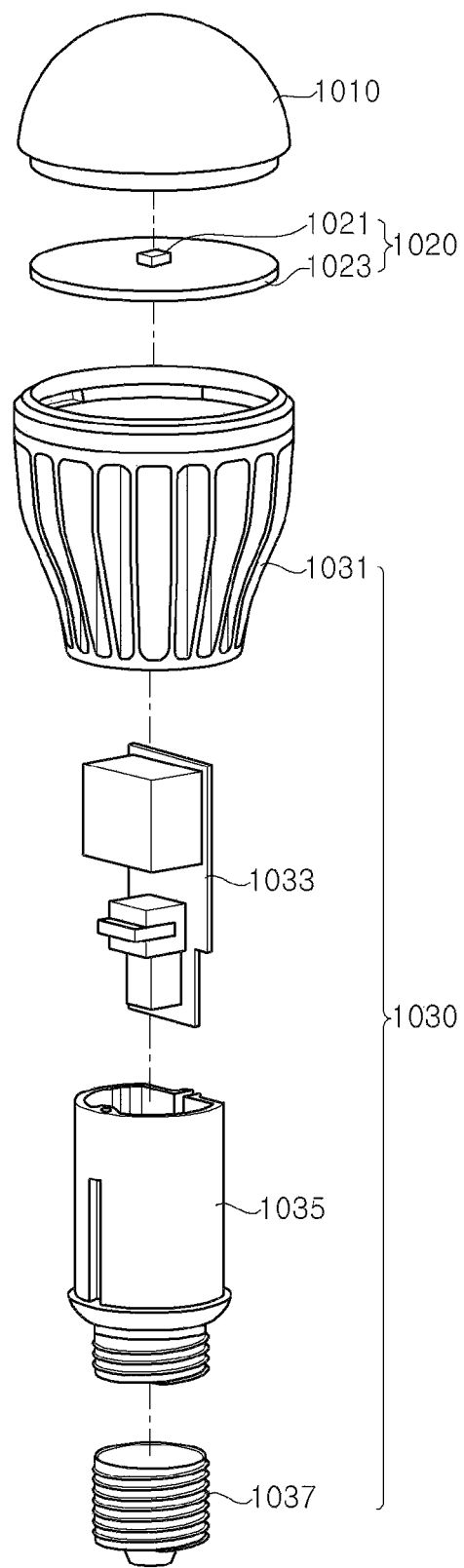
FIG. 29 is an exploded perspective view of a lighting apparatus according to an exemplary embodiment.

FIG. 29 is an exploded perspective view of a lighting apparatus to which a light emitting diode according to an exemplary embodiment is applied.

Referring to FIG. 29, the lighting apparatus according to an exemplary embodiment includes a diffusive cover 1010, a light emitting diode module 1020, and a body 1030. The body 1030 may receive the light emitting diode module 1020 and the diffusive cover 1010 may be disposed on the body 1030 to cover an upper side of the light emitting diode module 1020.

The body 1030 may have any shape capable of suppling electric power to the light emitting diode module 1020 while receiving and supporting the light emitting diode module 1020. For example, as shown in the drawing, the body 1030 may include a body case 1031, a power supply 1033, a power supply case 1035, and a power source connection 1037.

The power supply 1033 is received in the power supply case 1035 to be electrically connected to the light emitting diode module 1020, and may include at least one IC chip. The IC chip may regulate, change, or control electric power supplied to the light emitting diode module 1020. The power supply case 1035 may receive and support the power supply 1033, and the power supply case 1035 having the power supply 1033 secured therein may be disposed within the body case 1031. The power source connection 1037 is disposed at a lower end of the power supply case 1035 and is coupled thereto. Accordingly, the power source connection 1037 is electrically connected to the power supply 1033 within the power supply case 1035 and can serve as a passage through which power can be supplied from an external power source to the power supply 1033.

The light emitting diode module 1020 includes a substrate 1023 and a light emitting diode 1021 disposed on the substrate 1023. The light emitting diode module 1020 may be disposed at an upper portion of the body case 1031 and electrically connected to the power supply 1033.

As the substrate 1023, any substrate capable of supporting the light emitting diode 1021 may be used without limitation. For example, the substrate 1023 may include a printed circuit board having interconnects formed thereon. The substrate 1023 may have a shape corresponding to a securing portion formed at the upper portion of the body case 1031 so as to be stably secured to the body case 1031. The light emitting diode 1021 may include at least one of the light emitting diodes according to the exemplary embodiments described above.

The diffusive cover 1010 is disposed on the light emitting diode 1021 and may be secured to the body case 1031 to cover the light emitting diode 1021. The diffusive cover 1010 may be formed of a light transmitting material and light orientation of the lighting apparatus may be adjusted through regulation of the shape and optical transmissivity of the diffusive cover 1010. Therefore, the diffusive cover 1010 may be modified to have various shapes depending on usage and applications of the lighting apparatus.

Figure 30:
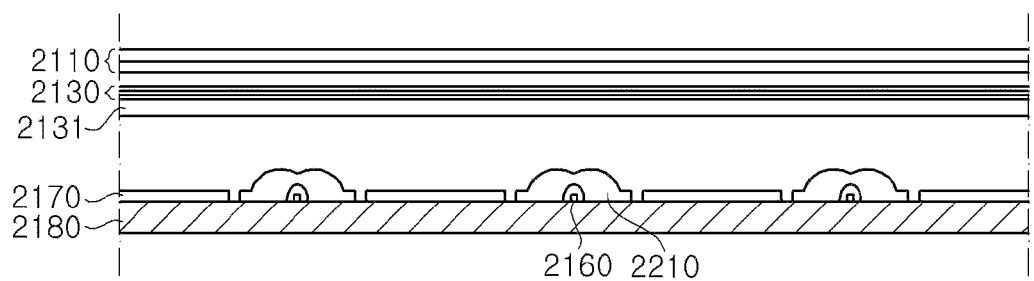
FIG. 30 is a cross-sectional view of a display apparatus according to an exemplary embodiment.

FIG. 30 is a cross-sectional view of a display apparatus to which a light emitting diode according to an exemplary embodiment is applied.

The display apparatus according to the illustrated exemplary embodiment includes a display panel 2110, a backlight unit supplying light to the display panel 2110, and a panel guide supporting a lower edge of the display panel 2110.

The display panel 2110 is not particularly limited, and may be, for example, a liquid crystal panel including a liquid crystal layer. Gate driving PCBs may be further disposed at the periphery of the display panel 2110 to supply driving signals to a gate line. Here, the gate driving PCBs may be formed on a thin film transistor substrate instead of being formed on separate PCBs.

The backlight unit includes a light source module which includes at least one substrate and a plurality of light emitting diodes 2160. The backlight unit may further include a bottom cover 2180, a reflective sheet 2170, a diffusive plate 2131, and optical sheets 2130.

The bottom cover 2180 may be open at an upper side thereof to receive the substrate, the light emitting diodes 2160, the reflective sheet 2170, the diffusive plate 2131, and the optical sheets 2130. In addition, the bottom cover 2180 may be coupled to the panel guide. The substrate may be disposed under the reflective sheet 2170 to be surrounded by the reflective sheet 2170. Alternatively, in a case that a reflective material is coated on a surface thereof, the substrate may be disposed on the reflective sheet 2170. Further, a plurality of substrates may be arranged to be flush with one another, without being limited thereto. However, it should be understood that the backlight unit includes a single substrate.

The light emitting diodes 2160 may include at least one of the light emitting diodes according to the exemplary embodiments described above. The light emitting diodes 2160 may be regularly arranged in a predetermined pattern on the substrate. In addition, a lens 2210 may be disposed on each of the light emitting diodes 2160 to improve uniformity of light emitted from the plurality of light emitting diodes 2160.

The diffusive plate 2131 and the optical sheets 2130 are disposed on the light emitting diode 2160. Light emitted from the light emitting diodes 2160 may be supplied in the form of sheet light to the display panel 2110 through the diffusive plate 2131 and the optical sheets 2130.

As described above, the light emitting diodes according to the exemplary embodiments may be applied to direct type displays as in the display apparatus according to the illustrated exemplary embodiment.

Figure 31:
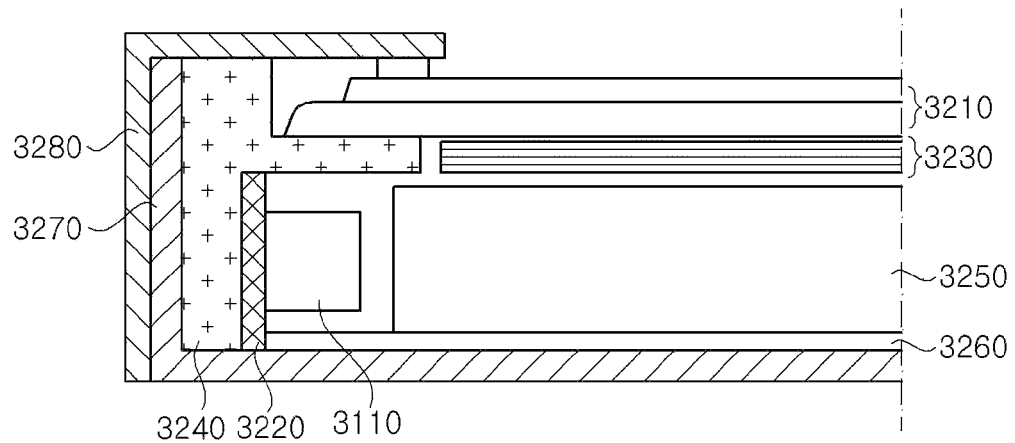
FIG. 31 is a cross-sectional view of a display apparatus according to another exemplary embodiment.

FIG. 31 is a cross-sectional view of a display apparatus to which a light emitting diode according to an exemplary embodiment is applied.

The display apparatus according to the illustrated exemplary embodiment includes a display panel 3210 on which an image is displayed, and a backlight unit disposed at a rear side of the display panel 3210 and emitting light thereto. Further, the display apparatus includes a frame 240 supporting the display panel 3210 and receiving the backlight unit, and covers 3240 and 3280 surrounding the display panel 3210.

The display panel 3210 is not particularly limited and may be, for example, a liquid crystal panel including a liquid crystal layer. A gate driving PCB may be further disposed in a periphery of the display panel 3210 to supply driving signals to a gate line. Here, the gate driving PCB may be formed on a thin film transistor substrate instead of being formed on a separate PCB. The display panel 3210 is secured by the covers 3240 and 3280 disposed at upper and lower sides thereof, and the cover 3280 disposed at the lower side of the display panel 3210 may be coupled to the backlight unit.

The backlight unit supplying light to the display panel 3210 includes a lower cover 3270 partially open at an upper side thereof, a light source module disposed at an inner side of the lower cover 3270, and a light guide plate 3250 disposed to be flush with the light source module and converting spot light into sheet light. In addition, the backlight unit according to the illustrated exemplary embodiment may further include optical sheets 3230 disposed on the light guide plate 3250 to diffuse and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting diodes 3110 arranged at constant intervals on one surface of the substrate 3220. As the substrate 3220, any substrate capable of supporting the light emitting diodes 3110 and being electrically connected thereto may be used without limitation. For example, the substrate 3220 may include a printed circuit board. The light emitting diodes 3110 may include at least one of the light emitting diodes according to the exemplary embodiments described above. Light emitted from the light source module enters the light guide plate 3250 and is supplied to the display panel 3210 through the optical sheets 3230. The light guide plate 3250 and the optical sheets 3230 convert spot light emitted from the light emitting diodes 3110 into sheet light.

As described above, the light emitting diodes according to the exemplary embodiments may be applied to edge type displays as in the display apparatus according to the illustrated exemplary embodiment.

Figure 32:
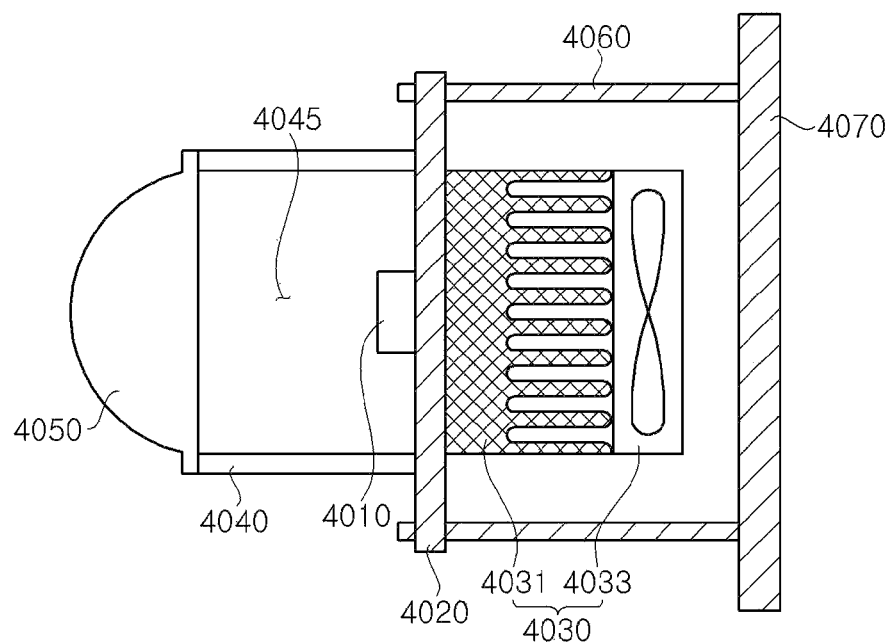
FIG. 32 is a cross-sectional view of a headlight according to an exemplary embodiment.

FIG. 32 is a cross-sectional view of a headlight to which a light emitting diode according to an exemplary embodiment is applied.

Referring to FIG. 32, the headlight according to the illustrated exemplary embodiment includes a lamp body 4070, a substrate 4020, a light emitting diode 4010, and a cover lens 4050. The headlight may further include a heat dissipation unit 4030, a support rack 4060, and a connection member 4040.

The substrate 4020 is secured by the support rack 4060 and is disposed apart from the lamp body 4070. As the substrate 4020, any substrate capable of supporting the light emitting diode 4010 may be used without limitation. For example, the substrate 4020 may include a substrate having a conductive pattern, such as a printed circuit board. The light emitting diode 4010 may be disposed on the substrate 4020 and may be supported and secured by the substrate 4020. In addition, the light emitting diode 4010 may be electrically connected to an external power source through the conductive pattern of the substrate 4020. Further, the light emitting diode 4010 may include at least one of the light emitting diodes according to the exemplary embodiments described above.

The cover lens 4050 is disposed on a path of light emitted from the light emitting diode 4010. For example, as shown in the drawing, the cover lens 4050 may be separated from the light emitting diode 4010 by the connection member 4040 and may be disposed in a direction of supplying light emitted from the light emitting diode 4010. By the cover lens 4050, an orientation angle and/or a color of light emitted by the headlight may be adjusted. Meanwhile, the connection member 4040 is disposed to secure the cover lens 4050 to the substrate 4020 while surrounding the light emitting diode 4010, thereby acting as a light guide providing a luminous path 4045. The connection member 4040 may be formed of a light reflective material or coated therewith. Meanwhile, the heat dissipation unit 4030 may include heat dissipation fins 4031 and/or a heat dissipation fan 4033 to dissipate heat generated upon operation of the light emitting diode 4010.

As described above, the light emitting diodes according to the exemplary embodiments may be applied to headlights, particularly, vehicular headlights, as the headlight according to the illustrated exemplary embodiment.

In an exemplary embodiment, the mesa may be disposed on a portion of a region of the first conductivity type semiconductor layer. As such, the first conductivity type semiconductor layer is partially exposed around the mesa, and exposed in a substantially ring shape along a periphery of the mesa, without being limited thereto. The first conductivity type semiconductor layer may be exposed at one side of the mesa, and a side surface of the first conductivity type semiconductor layer and a side surface of the mesa may be continuous at the other side of the mesa.

As the mesa is formed on the first conductivity type semiconductor layer, a step is formed between the first conductivity type semiconductor layer and the mesa. That is, the light emitting diode may have an uneven morphology. As such, defects from moisture penetration may occur in a region around the mesa, such as contact failure in the first pad metal layer forming the ohmic contact with the first conductivity type semiconductor layer. However, according to an exemplary embodiment, the moisture penetration into the first pad metal layer may be suppressed by the metal reflection layer spaced apart from the first pad metal layer. Further, since the metal reflection layer covers the side surface of the mesa, light traveling from the active layer to the side surface of the mesa may be reflected, and thus, light loss may be prevented.

In some exemplary embodiments, the mesa may include a via-hole exposing the first conductivity type semiconductor layer. The lower insulation layer may have an opening to expose the first conductivity type semiconductor layer in the via-hole, and the first pad metal layer is electrically connected to the first conductivity type semiconductor layer through the opening of the lower insulation layer. Since the first pad metal layer is electrically connected to the first conductivity type semiconductor layer in the via-hole, it is possible to increase a penetration path of moisture, and thus it is more effective to prevent the contact defect.

However, the inventive concepts are not limited thereto. For example, the lower insulation layer may be disposed to expose the first conductivity type semiconductor layer outside of the mesa, and the first pad metal layer may be electrically connected to the first conductivity type semiconductor layer exposed outside of the mesa.

The light emitting diode may further include a second pad metal layer disposed on the lower insulation layer and electrically connected to the ohmic reflection layer, and the metal reflection layer may also be laterally spaced apart from the second pad metal layer. The metal reflection layer may be formed of substantially the same material as the first pad metal layer and the second pad metal layer and may be placed at the same level.

As used herein, the "same level" means the same process (or step) rather than the same elevation. The first and second pad metal layers and the metal reflection layer (or a third pad metal layer) are formed on the same morphology of a substrate after the morphology of the substrate is determined. Accordingly, the connector and the first and second pad metal layers and the metal reflection layer (or the third pad metal layer) may be placed at the same level, so long as the connector and the first and second pad metal layers and the metal reflection layer (or the third pad metal layer) can be formed by the same process despite having different elevations. Accordingly, a certain portion may be formed at a lower location or a higher location than other portions. After the lower insulation layer is formed, the first and second pad metal layers and the metal reflection layer (or the third pad metal layer) may be formed at the same time by the same process, and thus may be placed at the same level.

In some exemplary embodiments, the light emitting diode may be directly flip-bonded to a submount or a circuit board through a bonding material using regions of the first pad metal layer and the second pad metal layer exposed in the openings of the upper insulation layer.

In some exemplary embodiments, the light emitting diode may further include a first bump pad and a second bump pad connected to upper surfaces of the first pad metal layer and the second pad metal layer exposed through the openings of the upper insulation layer, respectively. The light emitting diode may be flip-bonded to the submount, the circuit board, or the like through the first and second bump pads.

Furthermore, the upper insulation layer may further include an opening to expose the metal reflection layer, and the first bump pad or the second bump pad may be connected to the metal reflection layer through the opening of the upper insulation layer. For example, the light emitting diode may include a plurality of metal reflection layers, and each of the metal reflection layers may be connected to the first bump pad or the second bump pad.

Since the metal reflection layer (or the third pad metal layer) is connected to the first bump pad or the second bump pad, heat may be dissipated through the metal reflection layer, and thus heat dissipation efficiency may be improved. In particular, the metal reflection layer may function as a heat dissipation pad.

In some exemplary embodiments, the openings exposing the first pad metal layer, the second pad metal layer, and the metal reflection layer may be spaced apart in the lateral direction to not overlap each other. Accordingly, a region between the metal reflection layer and the first pad metal layer and the second pad metal layer is covered with the upper insulation layer, and thus, moisture is prevented from flowing into the first pad metal layer or the second pad metal layer by the upper insulation layer, even if moisture penetrates through the metal reflection layer.

In other exemplary embodiments, the metal reflection layer may be exposed through the opening to expose the first pad metal layer or the second pad metal layer. Meanwhile, the first pad metal layer may be spaced apart from the second pad metal layer and may surround the second pad metal layer, without being limited thereto.

The metal reflection layer may partially cover an upper surface of the mesa and the first conductivity type semiconductor layer around the mesa. More particularly, the metal reflection layer may extend from the upper surface of the mesa to an upper region of the first conductivity type semiconductor layer around the mesa. As such, at least a portion of the metal reflection layer may be disposed outside of an upper region of the ohmic reflection layer.

The metal reflection layer may be a continuous layer, but in some exemplary embodiments, the metal reflection layer may be divided and disposed in a plurality of regions on the substrate.

In an exemplary embodiment, the metal reflection layer may be divided and disposed near edges of the mesa, and the first pad metal layer may be electrically connected to the first conductivity type semiconductor layer near the edges of the mesa.

In an exemplary embodiment, the light emitting diode may include a third pad metal layer in addition to the first pad metal layer and the second pad metal layer, and the third pad metal layer may function as a reflection layer or the heat dissipation pad. Accordingly, the light extraction efficiency and heat dissipation performance of the light emitting diode may be improved.

The light emitting diode may further include a first bump pad connected to the first pad metal layer and a second bump pad connected to the second pad metal layer, and the third pad metal layer may be connected to the first bump pad or the second bump pad.

Moreover, the third pad metal layer may at least partially overlap with the ohmic reflection layer.

In an exemplary embodiment, at least one third pad metal layer may be spaced apart from the connector(s), and the first and second pad metal layers are connected to the first bump pad or the second bump pad, and thus it is possible to improve the heat dissipation performance of the light emitting diode while preventing an electrical short circuit. The third pad metal layer may function as the heat dissipation pad, and thus may also be referred to as the heat dissipation pad.

The first and second bump pads may be disposed over at least two light emitting cells. Accordingly, the first and second bump pads may be connected to the first pad metal layer or the second pad metal layer on a single light emitting cell, and may be connected to the third pad metal layer on another light emitting cell. In addition, the first and second bump pads may be formed in a relatively large size to facilitate mounting of the light emitting diode.

Meanwhile, the at least one third pad metal layer may be disposed within the upper region of the ohmic reflection layers. Accordingly, heat is easily transferred from the light emitting cells to the third pad metal layer through the ohmic reflection layer, and thus the heat dissipation performance may further be improved. However, the third pad metal layer is spaced apart from the ohmic reflection layer by the lower insulation layer. Thus, the third pad metal layer may not contribute to an electrical connection of the light emitting cells, and thus, may not cause an electrical short circuit.

In some exemplary embodiments, the third pad metal layer may be provided in plural, and the plurality of third pad metal layers may be divided and disposed over two or more light emitting cells. However, in some exemplary embodiments, a single third pad metal layer may be disposed on only one light emitting cell. Moreover, one or more third pad metal layers may be disposed over each light emitting cell.

The third pad metal layers are exposed through at least one opening of the upper insulation layer. Further, at least one of the third pad metal layers may be exposed through at least two openings of the upper insulation layer. A size of the openings may be reduced by exposing the single third pad metal layer through two openings or more openings.

The first pad metal layer may be disposed within an upper region of the last light emitting cell, and the second pad metal layer may be disposed within an upper region of a first light emitting cell.

Furthermore, the connector(s) and the first to third pad metal layers may be formed of the same material and placed at the same level. As described above, the "same level" means the same process rather than the same elevation. The connector and the first to third pad metal layers are formed on the same morphology of the substrate after the morphology of the substrate is determined. Accordingly, the connector and the first to third pad metal layers can be regarded as being placed at the same level so long as the connectors and the first to third pad metal layers can be formed by the same process despite having different elevations. Accordingly, a certain portion may be formed at a lower location or a higher location than other portions. After the lower insulation layer is formed, the connector and the first to third pad metal layers may be formed at the same time by the same process and thus can be placed at the same level.

In particular, the second pad metal layer and the third pad metal layer may be disposed within the upper region of the ohmic reflection layer, in which the second pad metal layer and the third pad metal layer may be disposed at the same elevation.

The opening of the lower insulation layer exposing the ohmic contact layer may be spaced apart from the opening of the upper insulation layer exposing the second pad metal layer in the lateral direction so as not to overlap each other. Accordingly, it is possible to block solders from diffusing into the ohmic reflection layer upon mounting of the first and second bump pads on a submount or a printed circuit board via the solders.

In some exemplary embodiments, at least one light emitting cell may include a via-hole formed through the second conductivity type semiconductor layer and the active layer to expose the first conductivity type semiconductor layer, and the connector may be electrically connected to the first conductivity type semiconductor layer of the light emitting cell through the via-hole.

The upper insulation layer may cover a region between an edge of the substrate and the light emitting cells and a distance from an edge of the upper insulation layer to the connector may be 15 μm or more. With the structure where the connector is sufficiently spaced apart from the edge of the upper insulation layer, the light emitting diode may protect the connector from moisture penetration through the edge of the upper insulation layer.

The connector(s) may directly contact the first conductivity type semiconductor layer and the ohmic reflection layer exposed through the opening of the lower insulation layer. The lower insulation layer may have morphologies different in elevation depending on locations by the light emitting cells, and the connector(s) may be arranged to have different elevations along a morphology of the lower insulation layer.

In an exemplary embodiment, the third pad metal layer may be connected to the first bump pad or the second bump pad, and thus, the heat dissipation performance of the light emitting diode may be improved.

Meanwhile, the light emitting diode may further include a lower insulation layer disposed between the connector(s), the first to third pad metal layers and the light emitting cells, and each of the connector(s), the first and second pad metal layers may be electrically connected to the light emitting cells through openings of the lower insulation layer, and the third pad metal layer may be spaced apart from the light emitting cells by the lower insulation layer.

Accordingly, the third pad metal layer may not cause the electrical short circuit between the light emitting cells, and may function only as the heat dissipation pad.

The light emitting diode may further include an upper insulation layer covering the connector(s), and the first to third pad metal layers, and the upper insulation layer may have openings to expose the first to third pad metal layers.

In addition, each of the third pad metal layers may be disposed within an upper region of the light emitting cells.

Further, the light emitting diode may further include an ohmic reflection layer disposed between the lower insulation layer and the light emitting cells, and forming an ohmic contact with the second conductivity type semiconductor layer of each light emitting cell, wherein each of the third pad metal layers may be disposed within upper regions of the ohmic reflection layers. Accordingly, heat generated in the light emitting cells may be dissipated to the metal pads using the ohmic reflection layer and the third pad metal layer, and thus the heat dissipation performance may further be improved.

In an exemplary embodiment, the pad metal layer may improve the heat dissipation performance of the light emitting diode. Further, each of the first bump pad and the second bump pad may be disposed over at least two light emitting cells among the plurality of light emitting cells.

In addition, the pad metal layer may be disposed over the light emitting cells other than the light emitting cells to which the first bump pad and the second bump pad are electrically connected. Thus, it is possible to assist heat dissipation in the light emitting cells where heat dissipation is not easy through the first bump pad and the second bump pad. However, the present disclosure is not limited thereto, but the pad metal layer may be also disposed over the light emitting cell to which the first bump pad or the second bump pad is electrically connected.

In an exemplary embodiment, a pad metal layer may be disposed over at least two light emitting cells among the plurality of light emitting cells.

According to exemplary embodiments, a light emitting diode may have high reliability by preventing or suppressing the contact failure that may arise from penetration of moisture by disposing a metal reflection layer spaced apart from a first pad metal layer. In addition, light may be reflected by the metal reflection layer, thereby preventing or suppressing light loss in the light emitting diode and improving light extraction efficiency. Moreover, by disposing a third pad metal layer laterally spaced apart from the first and second pad metal layers, the third pad metal layer may improve the heat dissipation performance.

In addition, according to exemplary embodiments, a plurality of light emitting cells may be connected in series by using a connector(s), and the connector(s) may extend to adjacent light emitting cells through one edge of the light emitting cell. In this manner, a weak portion of the connector may be minimized, thereby improving the reliability of the light emitting diode.

Further, by sealing the light emitting cells with a lower semiconductor layer and an upper semiconductor layer and disposing a first and second bump pads, a flip chip structure light emitting diode may be provided in the form of a chip scale package having the plurality of light emitting cells.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

The invention claimed is:
1. A light emitting diode, comprising:
a first conductivity type semiconductor layer;
a mesa disposed on the first conductivity type semiconductor layer, the mesa including a second conductivity type semiconductor layer and an active layer interposed between the first conductivity type semiconductor layer and the second conductivity type semiconductor layer;
an ohmic reflection layer disposed on the mesa to form an ohmic contact with the second conductivity type semiconductor layer;
a lower insulation layer covering the mesa and the ohmic reflection layer, and partially exposing the first conductivity type semiconductor layer and the ohmic reflection layer;
a first pad metal layer disposed on the lower insulation layer and electrically connected to the first conductivity type semiconductor layer;
a metal reflection layer disposed on the lower insulation layer and laterally spaced apart from the first pad metal layer; and
an upper insulation layer covering the first pad metal layer and the metal reflection layer, the upper insulation layer having a first opening exposing the first pad metal layer,
wherein at least a portion of the metal reflection layer covers a side surface of the mesa.

2. The light emitting diode of claim 1,
wherein the mesa includes a via-hole exposing the first conductivity type semiconductor layer,
wherein the lower insulation layer has an opening exposing the first conductivity type semiconductor layer in the via-hole, and
wherein the first pad metal layer is electrically connected to the first conductivity type semiconductor layer through the opening of the lower insulation layer.

3. The light emitting diode of claim 1,
wherein a first portion of the first conductivity type semiconductor layer is not covered by the lower insulation layer in an area outside of the mesa, and
wherein the first pad metal layer is electrically connected to the first conductivity type semiconductor layer through the first portion of the first conductive type semiconductor layer disposed outside of the mesa.

4. The light emitting diode of claim 1, further comprising:
a second pad metal layer disposed on the lower insulation layer and electrically connected to the ohmic reflection layer,
wherein the metal reflection layer is laterally spaced apart from the second pad metal layer.

5. The light emitting diode of claim 4, wherein the metal reflection layer comprises substantially the same material as the first pad metal layer and the second pad metal layer, and is disposed at the same level as the first pad metal layer and the second pad metal layer.

6. The light emitting diode of claim 4, wherein the upper insulation layer further comprises a second opening exposing the second pad metal layer.

7. The light emitting diode of claim 6, further comprising a first bump pad and a second bump pad connected to upper surfaces of the first pad metal layer and the second pad metal layer exposed through the first and second openings of the upper insulation layer, respectively.

8. The light emitting diode of claim 7,
wherein the upper insulation layer includes a third opening exposing the metal reflection layer, and
wherein the first bump pad or the second bump pad is connected to the metal reflection layer through the third opening of the upper insulation layer.

9. The light emitting diode of claim 8, wherein the first, second, and third openings exposing the first pad metal layer, the second pad metal layer, and the metal reflection layer, respectively, are spaced apart in the lateral direction and do not overlap each other.

10. The light emitting diode of claim 6, wherein the metal reflection layer is exposed through at least one of the first and second openings exposing the first pad metal layer or the second pad metal layer.

11. The light emitting diode of claim 4, wherein the first pad metal layer surrounds the second pad metal layer.

12. The light emitting diode of claim 1,
wherein the first pad metal layer is disposed within an upper region of the mesa, and
wherein the metal reflection layer surrounds the first pad metal layer in a substantially ring shape in a plan view.

13. The light emitting diode of claim 1, wherein the metal reflection layer partially covers an upper surface of the mesa and the first conductivity type semiconductor layer around the mesa.

14. The light emitting diode of claim 13, further comprising a substrate,
wherein the metal reflection layer is disposed in a plurality of regions on the substrate.

15. The light emitting diode of claim 14,
wherein the metal reflection layer is disposed near edges of the mesa, and
wherein the first pad metal layer is electrically connected to the first conductivity type semiconductor layer near the edges of the mesa.

16. The light emitting diode of claim 15,
wherein the mesa has grooves near the edges thereof, and
wherein the first pad metal layer is electrically connected to the first conductivity type semiconductor layer in the grooves.

17. The light emitting diode of claim 1, further comprising a substrate,
wherein the first conductivity type semiconductor layer is disposed on the substrate, and
wherein light generated in the active layer is configured to be emitted to the outside through the substrate.

18. A light emitting diode, comprising:
a first conductivity type semiconductor layer;
a mesa disposed on the first conductivity type semiconductor layer, the mesa including a second conductivity type semiconductor layer and an active layer interposed between the first conductivity type semiconductor layer and the second conductivity type semiconductor layer;
an ohmic reflection layer disposed on the mesa to form an ohmic contact with the second conductivity type semiconductor layer;
a lower insulation layer covering the mesa and the ohmic reflection layer, and partially exposing the first conductivity type semiconductor layer and the ohmic reflection layer;
a first pad metal layer disposed on the lower insulation layer and electrically connected to the first conductivity type semiconductor layer;
a second pad metal layer disposed on the lower insulation layer and electrically connected to the ohmic reflection layer;
a third pad metal layer disposed on the lower insulation layer and laterally spaced apart from the first pad metal layer and the second pad metal layer; and
an upper insulation layer covering the first, second, and third pad metal layers, and having openings exposing the first pad metal layer and the second pad metal layer.

19. The light emitting diode of claim 18, further comprising a first bump pad connected to the first pad metal layer and a second bump pad connected to the second pad metal layer, wherein the third pad metal layer is connected to the first bump pad or the second bump pad.

20. The light emitting diode of claim 18, wherein the third pad metal layer at least partially overlaps with the ohmic reflection layer.

21. A light emitting diode, comprising:
a plurality of light emitting cells each including a first conductivity type semiconductor layer, an active layer, and a second conductivity type semiconductor layer;
an ohmic reflection layer disposed on the second conductivity type semiconductor layer of each of the light emitting cells to form an ohmic contact therewith;
a lower insulation layer covering the light emitting cells and the ohmic reflection layers, the lower insulation layer having openings exposing the first conductivity type semiconductor layer and the ohmic reflection layer of each of the light emitting cells;
a connector disposed on the lower insulation layer and electrically connecting adjacent light emitting cells to each other to form a series array of the light emitting cells;
a first pad metal layer electrically connected to the first conductivity type semiconductor layer of one of the light emitting cells disposed at a first terminal of the series array through one of the openings of the lower insulation layer;
a second pad metal layer electrically connected to the ohmic reflection layer of another one of the light emitting cells disposed at a second terminal of the series array through another one of the openings of the lower insulation layer;
at least one third pad metal layer disposed on the lower insulation layer, and spaced apart from the connector and the first and second pad metal layers;
an upper insulation layer covering the connector and the first to third pad metal layers, the upper insulation layer having openings exposing upper surfaces of the first, second, and third pad metal layers, respectively; and
a first bump pad and a second bump pad connected to upper surfaces of the first pad metal layer and the second pad metal layer exposed through the openings of the upper insulation layer, respectively,
wherein at least one of the first and second bump pads is connected to the third pad metal layer through at least one of the openings of the upper insulation layer.

22. The light emitting diode of claim 21, wherein the first and second bump pads are disposed over at least two light emitting cells.

23. The light emitting diode of claim 22, wherein the at least one third pad metal layer is disposed within the upper region of the ohmic reflection layers.

24. The light emitting diode of claim 23, wherein the third pad metal layer is spaced apart from the ohmic reflection layer by the lower insulation layer.

25. The light emitting diode of claim 22, wherein the third pad metal layer is provided in plural, and the plurality of third pad metal layers is disposed over two or more light emitting cells.

26. The light emitting diode of claim 25, wherein at least one of the third pad metal layers is exposed through at least two openings of the upper insulation layer.

27. The light emitting diode of claim 21,
wherein the first pad metal layer is disposed within an upper region of the one of the light emitting cells, and
wherein the second pad metal layer is disposed within an upper region of the another one of the light emitting cells.

28. The light emitting diode of claim 21, wherein the connector and the first, second, and third pad metal layers comprise substantially the same material and are disposed at the same level.

29. The light emitting diode of claim 21, wherein the another one of the openings of the lower insulation layer exposing the ohmic contact layer is spaced apart from one of the openings of the upper insulation layer exposing the second pad metal layer in the lateral direction so as not to overlap each other.

30. The light emitting diode of claim 21,
wherein at least one of the light emitting cells includes a via-hole formed through the second conductivity type semiconductor layer and the active layer exposing the first conductivity type semiconductor layer, and
wherein the connector is electrically connected to the first conductivity type semiconductor layer of the light emitting cell through the via-hole.

31. The light emitting diode of claim 21, further comprising a substrate,
wherein the upper insulation layer covers a region between an edge of the substrate and the light emitting cells, and a distance from an edge of the upper insulation layer to the connector is at least 15 µm.

32. The light emitting diode of claim 21, wherein the connector directly contacts the first conductivity type semiconductor layer and the ohmic reflection layer exposed through the opening of the lower insulation layer.

33. A light emitting diode, comprising:
a plurality of light emitting cells each including a first conductivity type semiconductor layer, an active layer, and a second conductivity type semiconductor layer;
a connector electrically connecting adjacent light emitting cells to each other to form a series array of the light emitting cells;
a first pad metal layer electrically connected to the first conductivity type semiconductor layer of one of the light emitting cells disposed at a first terminal of the series array;
a second pad metal layer electrically connected to the second conductivity type semiconductor layer of another one of the light emitting cells disposed at a second terminal of the series array;
at least one third pad metal layer spaced apart from the connector and the first and second pad metal layers; and
a first bump pad and a second bump pad disposed over at least two of the light emitting cells, and connected to upper surfaces of the first pad metal layer and the second pad metal layer, respectively,
wherein the at least one third pad metal layer is connected to the first bump pad or the second bump pad.

34. The light emitting diode of claim 33, further comprising a lower insulation layer disposed between the connector, the first to third pad metal layers, and the light emitting cells,
wherein each of the connector, and the first and second pad metal layers is electrically connected to the light emitting cells through openings of the lower insulation layer, and
wherein the third pad metal layer is spaced apart from the light emitting cells by the lower insulation layer.

35. The light emitting diode of claim 34, further comprising an upper insulation layer covering the connector, and the first to third pad metal layers,
wherein the upper insulation layer has openings exposing the first to third pad metal layers.

36. The light emitting diode of claim 35, wherein the at least one third pad metal layer is disposed within an upper region of the light emitting cells.

37. The light emitting diode of claim 36, further comprising an ohmic reflection layer disposed between the lower insulation layer and the light emitting cells, and forming an ohmic contact with the second conductivity type semiconductor layer of each light emitting cell,
wherein the at least one third pad metal layer is disposed within upper regions of the ohmic reflection layers.

38. A light emitting diode, comprising:
a plurality of light emitting cells each including a first conductivity type semiconductor layer, an active layer, and a second conductivity type semiconductor layer;
a lower insulation layer covering the light emitting cells;
a connector disposed on the lower insulation layer and electrically connected to the light emitting cells through openings of the lower insulation layer to electrically connect adjacent light emitting cells in series;
at least one pad metal layer spaced apart from the connector, disposed on the lower insulation layer, and spaced apart from the light emitting cells by the lower insulation layer;
a pad metal layer disposed on the lower insulation layer and spaced apart from the light emitting cells by the lower insulation layer;
an upper insulation layer covering the pad metal layer, and having an opening exposing the pad metal layer; and
a first bump pad and a second bump pad connected to the light emitting cells,
wherein the first bump pad or the second bump pad is connected to the pad metal layer through the opening of the upper insulation layer.

39. The light emitting diode of claim 18, wherein each of the first bump pad and the second bump pad is disposed over at least two light emitting cells among the plurality of light emitting cells.

40. The light emitting diode of claim 39, wherein the pad metal layer is disposed over the light emitting cells other than the ones connected to the first bump pad and the second bump pad.

41. A light emitting diode, comprising:
a plurality of light emitting cells disposed on a substrate;
a lower insulation layer covering the light emitting cells;
a pad metal layer disposed on the lower insulation layer and spaced apart from the light emitting cells by the lower insulation layer;
an upper insulation layer covering the pad metal layer, and having an opening exposing the pad metal layer; and
a first bump pad and a second bump pad connected to the light emitting cells,
wherein the first bump pad or the second bump pad is connected to the pad metal layer through the opening of the upper insulation layer.

42. The light emitting diode of claim 41, wherein the pad metal layer is disposed over at least two light emitting cells among the plurality of light emitting cells.

43. The light emitting diode of claim 41, wherein the pad metal layer is exposed through at least two openings of the upper insulation layer.

44. The light emitting diode of claim 41, wherein the pad metal layer is disposed within a lower region of the first bump pad or the second bump pad.

45. The light emitting diode of claim 41, wherein a portion of the pad metal layer is disposed outside of the lower region of the first bump pad and the second bump pad.

* * * * *